(12) United States Patent
Imoto et al.

(10) Patent No.: US 7,605,424 B2
(45) Date of Patent: Oct. 20, 2009

(54) SEMICONDUCTOR DEVICE AND METHOD OF MANUFACTURING SEMICONDUCTOR DEVICE

(75) Inventors: Tsutomu Imoto, Kanagawa (JP); Toshio Kobayashi, Kanagawa (JP); Takayoshi Kato, Kanagawa (JP)

(73) Assignee: Sony Corporation, Tokyo (JP)

( * ) Notice: Subject to any disclaimer, the term of this patent is extended or adjusted under 35 U.S.C. 154(b) by 230 days.

(21) Appl. No.: 11/846,802

(22) Filed: Aug. 29, 2007

(65) Prior Publication Data

US 2008/0054352 A1    Mar. 6, 2008

(30) Foreign Application Priority Data

Sep. 4, 2006    (JP) .............................. 2006-238626

(51) Int. Cl.
*H01L 29/94* (2006.01)
(52) U.S. Cl. .............................. 257/330; 257/E29.345; 257/E21.409; 438/589
(58) Field of Classification Search ................ 438/589; 257/330, E29.345, E21.409
See application file for complete search history.

(56) References Cited

U.S. PATENT DOCUMENTS

| | | | | |
|---|---|---|---|---|
| 6,617,212 | B2 * | 9/2003 | Cho et al. | 438/270 |
| 6,664,592 | B2 * | 12/2003 | Inumiya et al. | 257/330 |
| 6,974,730 | B2 * | 12/2005 | Diaz et al. | 438/163 |
| 2003/0006457 | A1 * | 1/2003 | Nishinohara | 257/330 |

FOREIGN PATENT DOCUMENTS

| | | |
|---|---|---|
| JP | 49-126281 | 3/1974 |
| JP | 50-8483 | 1/1975 |
| JP | 58-166758 | 10/1983 |
| JP | 03-052263 | 3/1991 |
| JP | 04-171762 | 6/1992 |
| JP | 04-245480 | 9/1992 |
| JP | 08-213606 | 8/1996 |
| JP | 2000-082813 | 3/2000 |
| JP | 2001-144290 | 5/2001 |
| JP | 2001-284468 | 10/2001 |
| JP | 2001-326351 | 11/2001 |

OTHER PUBLICATIONS

Japanese Office Action issued on Nov. 25, 2008, corresponding to JP Patent Appl. No. 2006-238626.

* cited by examiner

*Primary Examiner*—Trung Dang
(74) *Attorney, Agent, or Firm*—Sonnenschein Nath & Rosenthal LLP

(57) ABSTRACT

A semiconductor device including: a semiconductor region having a first semiconductor face and a second semiconductor face connected to the first semiconductor face and having an inclination with respect to the first semiconductor face; a gate insulating film formed on the first and on the second semiconductor faces; a gate electrode formed on the gate insulating film including a part on a boundary between the first semiconductor face and the second semiconductor face; a source impurity region formed in the semiconductor region so as to overlap the gate electrode within the first semiconductor face with the gate insulating film interposed between the source impurity region and the gate electrode; and a drain impurity region formed in the semiconductor region directly under the second semiconductor face at least.

12 Claims, 39 Drawing Sheets

ANNEALING PROCESS

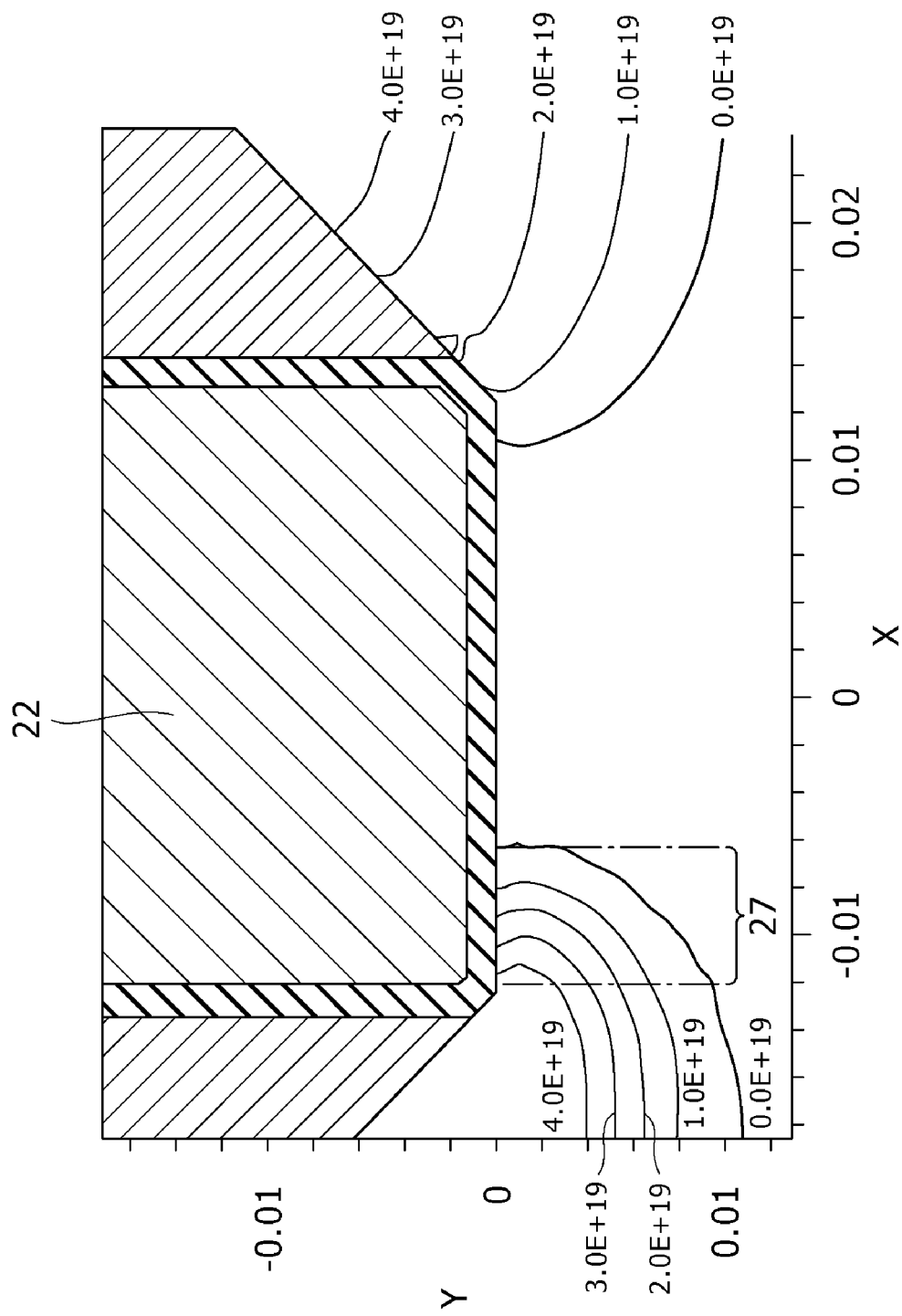

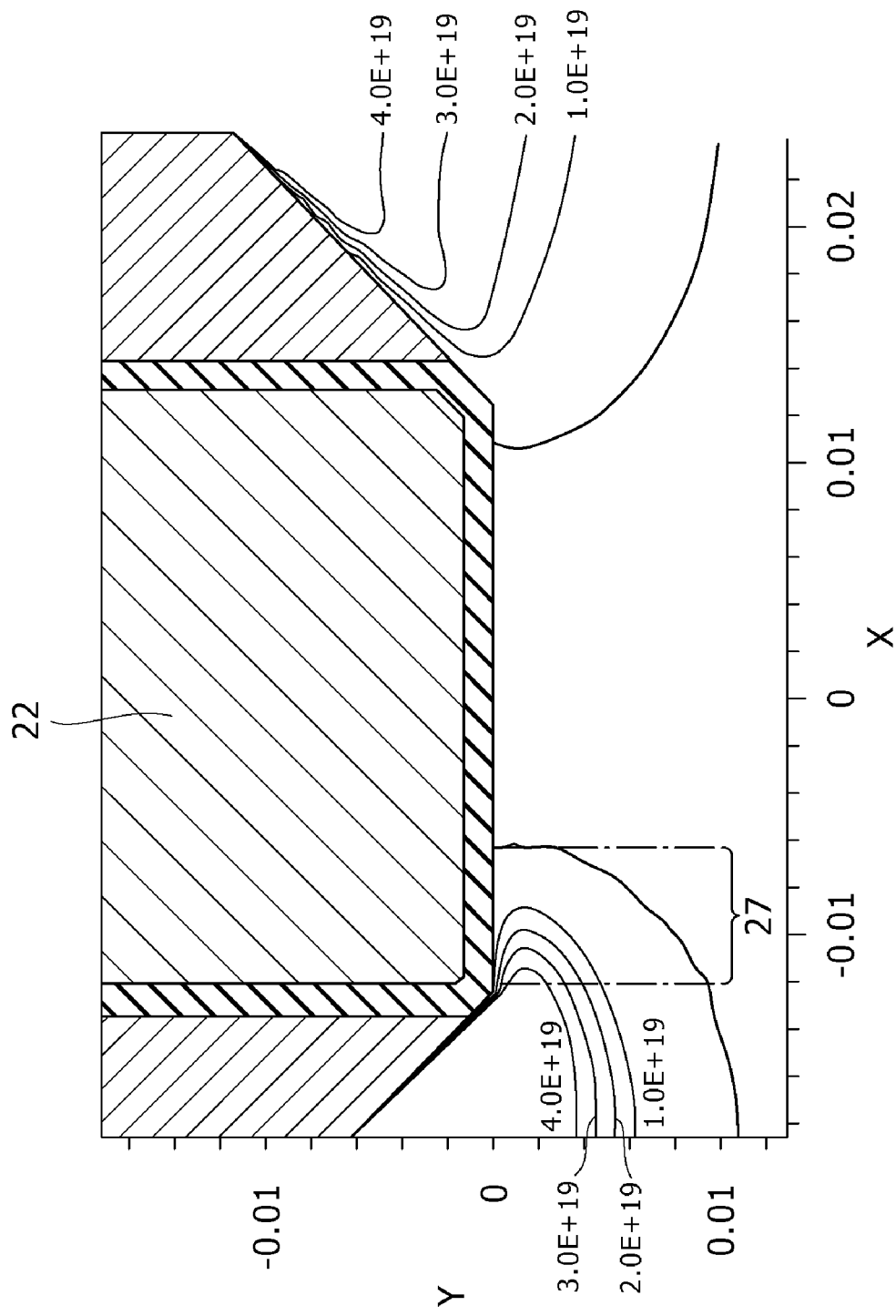

SEMICONDUCTOR DEVICE AND METHOD OF MANUFACTURING SEMICONDUCTOR DEVICE

CROSS REFERENCES TO RELATED APPLICATIONS

The present invention contains subject matter related to Japanese Patent Application JP 2006-238626 filed in the Japan Patent Office on Sep. 4, 2006, the entire contents of which being incorporated herein by reference.

BACKGROUND OF THE INVENTION

1. Field of the Invention

The present invention relates to an insulated gate field effect transistor, a semiconductor device formed by a static random-access memory using this transistor, and a method of manufacturing the semiconductor device.

2. Description of the Related Art Higher speed, higher levels of integration, and lower power consumption of integrated circuits have heretofore been pursued mainly by scaling down a planar type MOSFET (Metal Oxide Semiconductor Field Effect Transistor). The sectional structure of an existing planar type MOSFET will be described with reference to a schematic constitution sectional view of FIG. 25.

As shown in FIG. 25, the planar type MOSFET 101 has a gate electrode 113 on a semiconductor substrate 111 with a gate insulating film 112 interposed between the gate electrode 113 and the semiconductor substrate 111. A source region 115 is formed on one side of the gate electrode 113 on the semiconductor substrate 111 via a source extension region 114. A drain region 117 is formed on another side of the gate electrode 113 on the semiconductor substrate 111 via a drain extension region 116. The source extension region 114 and the drain extension region 116 are both formed in a state of overlapping a lower part of the gate electrode 113.

When the gate length LG of the planar type MOSFET 101 is shortened by a scaledown, a so-called short channel effect appears. To suppress the short channel effect needs a scaledown conforming to a scaling law. That is, a scaledown needs to be performed with a combination of an increase in gate capacitance (reduction in thickness of the gate insulating film), an increase in channel concentration, and a reduction in depth of junctions of a source and a drain diffusion layer.

In achieving a scaledown while improving performance, a setting combining the three parameters described above is important. For example, according to a condition equation of J. R. Brews for occurrence of the short channel effect, channel length Lmin as a boundary determining whether the short channel effect occurs or not can be defined by one parameter γ. It is shown that the parameter is a function of three variables of increase in gate capacitance (reduction in thickness of the gate oxide film), channel concentration, and the depth of the source and drain diffusion layers. It is known that there is an infinite number of combinations of the three variables determining one value of the parameter γ, that is, increase in gate capacitance (reduction in thickness of the gate oxide film), channel concentration, and the depth of the source and drain diffusion layers.

Thus, when the junction depth can be made to be zero by devising a structure, requirements for the two other structural factors, that is, increase in gate capacitance (reduction in thickness of the gate oxide film) and increase in channel concentration can be greatly relaxed. The junction depth of a source and a drain diffusion layer significant in operation of a MOS transistor is a depth measured from an interface between a gate insulating film and a semiconductor substrate of the MOS transistor.

The above-described increase in gate capacitance has been achieved by reducing the thickness of the gate insulating film in the related art, but has reached a limit from a viewpoint of withstand voltage because physical film thickness is already less than two nm. Thus, studies have been under way to use an insulating film with a high dielectric constant, for example hafnium oxide, hafnium nitride or the like as means for increasing the capacitance without relying on further reduction of the thickness of the gate insulating film. As for increase in channel concentration, the impurity concentration of a channel region has reached $10^{18}$ $cm^{-3}$. When the impurity concentration approaches $10^{18}$ $cm^{-3}$, there are fears of a decrease in junction withstand voltage due to Zener breakdown (tunnel breakdown), a decrease in mobility due to a high electric field generated at a channel, and the like.

On the other hand, as for reduction in depth of the junctions of the source and drain diffusion layers, the junction depth of the shallow source and drain diffusion layers (extension) in contact with the channel has now reached 100 nm or less. When a current path is narrowed by making the junctions shallower, the series resistance of the source and drain diffusion layers is increased, and thus on current (current driving power) is decreased. However, further pursuing such reduction in depth of the junctions in the existing planar type MOS transistor has many difficult problems of doping with an impurity, lowering of temperature in subsequent heat treatment, and the like.

Accordingly, a structure having a gate 212 in a bottom part of a groove formed by etching a semiconductor substrate 211, which structure is referred to as a recess gate type (or grooved gate type), as shown in FIG. 26 has been proposed as means for achieving both the suppression of the short channel effect and the reduction of the resistance of the source and drain (see Japanese Patent Laid-Open No. Sho 49-126281 and Japanese Patent Laid-Open No. 2000-82813 as Patent Documents 1 and 2, for example).

In addition, a structure referred to as an elevated source/drain extension type (or a raised source/drain extension type) as shown in FIG. 27 has been proposed (see Patent Document 2, also see Japanese Patent Laid-Open No. 2001-144290 and Japanese Patent Laid-Open No. 2001-284468 as Patent Documents 3 and 4, for example). In this structure, a gate 312 is formed on the surface of a semiconductor substrate 311, while a source and a drain diffusion layer 313 and 314 and extension regions 315 and 316 are formed by a semiconductor layer grown by epitaxial growth on the semiconductor substrate 311.

One typification in these structures is to set the diffusion depth (Xj) of the source and drain diffusion layers to zero or a negative value. It has been confirmed by experiment that such design suppresses the short channel effect and greatly reduces the roll-off of threshold voltage. However, high on current is not obtained. This is because a corner part exists between a channel region and an overlap region.

At the corner part, local threshold voltage is raised because the effective thickness of oxide film is increased, and an electric field extends radially from the gate to the inside of the substrate, for example. Further, because electric lines of force extend radially, sheet carrier density at the corner part is lowered as compared with a flat channel region even with a same gate voltage. When the sheet carrier density is lowered, from continuity of drain current, carriers at the corner part need to run at a high speed. As a result, mobility is decreased, and the resistance of the part is increased. When the resistance is increased, a voltage drop at the corner part is increased, and thus a voltage drop at a source end and a drain end of the channel is increased.

The increase in voltage drop at the source end reduces effective gate voltage (gate-to-source voltage of an intrinsic FET). As a result, the carrier density of the channel is decreased, and the resistance is increased, so that the drain current is decreased. When the drift velocity of carriers reaches saturation, the corner part acts as a constant-current source, and thus the drain current is not increased any further. The increase in voltage drop at the drain end hinders an increase in potential at the drain end of a gate flat part, and thus drain voltage is mainly applied between the corner part on the drain side and a drain electrode. As a result, the drain side from the drain side corner part operates as a parasitic transistor. Thus, the drain current is determined by an amount of current injected into the drain side corner part, and the drain current cannot be increased effectively even when the drain voltage is increased.

On the other hand, various structures have been proposed in which a source and a drain impurity are diffused to a certain depth at gate ends while a source and a drain are raised (see Japanese Patent Laid-Open No. 2001-326351 as Patent Document 5, for example). In such an example, a corner part is buried in a source and a drain diffusion layer. Therefore, even at the corner part, sufficient sheet carrier density is secured with carriers originating from the impurity. Thus the above-described problem does not occur. However, as long as junction depth is 10 nm to 20 nm, the short channel effect when gate length is 10 nm to 20 nm cannot be sufficiently suppressed. As a result, increase in leakage current during an off time or, when the leakage current is suppressed, a decrease in on current due to a lack of overdrive voltage is inevitable. Therefore a high-performance MOSFET cannot be obtained.

Further, it has been found from calculations by the inventors that when compatibility between the suppression of the short channel effect and current driving power is to be achieved with such a structure, a permissible variation range of diffusion depth of the source and drain diffusion layers and gate length is a few nm or less, thus requiring very high controllability. Because it is not easy to obtain such high controllability, to obtain a high yield requires advanced lithography techniques and advanced impurity introduction and activation techniques, thus inviting an increase in process manufacturing cost.

In order to suppress leakage current during an off time sufficiently, threshold voltage needs to be set to a value higher than 0 V by a certain degree even when the transistor is scaled down. On the other hand, when a gate oxide film is made thinner by scaling, power supply voltage needs to be lowered to suppress a gate leak. As a result, due to the scaledown, the overdrive voltage of the gate needs to be lowered. This lowers the current driving power. Accordingly, various techniques for improving mobility to compensate for this have been devised. For example, a mobility improving technique using a change in band structure due to stress and a technique using different crystal faces where carrier mobility is highest for an NMOS and a PMOS are known.

In the technique using stress, the band structure of a channel region is changed by compressive or tensile stress occurring in the channel region at an operating temperature, and the mobility of channel carriers is increased by decreasing effective mass or scattering probability. For the stress, a large number of methods are known, including a method of coating a transistor with a thin film having a different coefficient of thermal expansion from that of a substrate or a method of forming a source and a drain region using a material having a different coefficient of thermal expansion from that of a substrate.

As for the technique using different crystal faces, a method utilizing a substrate laminating technique to use a (100) surface for an NMOS and a (110) surface for a PMOS is known.

However, when these mobility improving techniques are to be applied to a "V-shaped MOSFET" as a derivative of the grooved gate structure, for example, the following problems are expected to arise. In both cases of the method using a thin film and the method of using a source and a drain region, the channel can be distorted most efficiently when the surface of the channel is close to the surface of the substrate and is parallel to the surface of the substrate. However, the channel surface of a V-shaped channel extends in a deep portion of the substrate, and is not parallel with the principal surface of the substrate. Therefore it is not easy to generate stress in the direction of the channel efficiently. Further, for the V-shaped channel, a deep V-shaped trench needs to be formed in the surface of the substrate. Hence, a SOI substrate cannot be used, and thus freedom of a combination of surface orientations is restricted. It is thus difficult to achieve both the suppression of the short channel effect and the improvement of mobility.

SUMMARY OF THE INVENTION

A problem to be solved is a difficulty in achieving both the suppression of the short channel effect and the improvement of mobility.

It is desirable to achieve both the suppression of the short channel effect and the improvement of mobility.

According to an embodiment of the present invention, there is provided a semiconductor device including: a semiconductor region having a first semiconductor face and a second semiconductor face connected to the first semiconductor face and having an inclination with respect to the first semiconductor face; a gate insulating film formed on the first semiconductor face and on the second semiconductor face; a gate electrode formed on the gate insulating film including a part on a boundary between the first semiconductor face and the second semiconductor face; a source impurity region formed in the semiconductor region so as to overlap the gate electrode within the first semiconductor face with the gate insulating film interposed between the source impurity region and the gate electrode; and a drain impurity region formed in the semiconductor region directly under the second semiconductor face at least; wherein a junction interface between the drain impurity region and the semiconductor region is formed in a state of being closer to the boundary between the first semiconductor face and the second semiconductor face than a junction interface between the source impurity region and the semiconductor region.

In the semiconductor device according to the above-described embodiment, the gate electrode is formed on the gate insulating film including the part on the boundary between the first semiconductor face and the second semiconductor face connected to each other at an angle, and the source impurity region is formed in the semiconductor region in such a manner as to overlap the gate electrode within the first semiconductor face with the gate insulating film interposed between the source impurity region and the gate electrode. Therefore a decrease in sheet carrier density in a gate corner part on a source side is avoided. In addition, the drain impurity region is formed in the semiconductor region directly under the second semiconductor face. Therefore a surface potential in the vicinity of a bend part of a channel (the first semiconductor face and the second semiconductor face) becomes higher than that of other parts, and a local threshold voltage is raised. Thereby a drain electric field is shielded in the vicinity of the bend part. Thus a decrease in threshold voltage due to a short channel effect is suppressed, and a permissible range of variations in gate length is increased. Further, the junction interface between the drain impurity region and the semiconductor region is formed in a state of being closer to the boundary between the first semiconductor face and the second semiconductor face than the junction interface between the source impurity region and the semiconductor region. Therefore a decrease in local sheet carrier density in the vicinity of the bend part on a drain side is avoided, and a voltage drop in the vicinity of the bend part is suppressed.

According to an embodiment of the present invention, there is provided a method of manufacturing a semiconductor device, the method including: a step of forming a dummy gate on a semiconductor substrate with a dummy gate insulating film interposed between the dummy gate and the semiconductor substrate; a step of forming a source impurity region and a drain impurity region in the semiconductor substrate on both sides of the dummy gate; a step of forming an extension region on the semiconductor substrate on both sides of the dummy gate; a step of forming an overlap region of the source impurity region on a source side directly below the dummy gate; a step of removing the dummy gate and removing the dummy gate insulating film exposed in a removal region from which the dummy gate is removed; a step of forming a recess shape in the semiconductor substrate exposed in the removal region; and a step of sequentially forming a gate insulating film and a gate electrode on the semiconductor substrate in which the recess shape is formed.

In the manufacturing method according to the above-described embodiment, the extension region is formed on the semiconductor substrate on both sides of the dummy gate. Thus a first semiconductor face (a face of the semiconductor substrate) and a second semiconductor face (a face of the extension region on a drain side) connected to each other at an angle are formed by the semiconductor substrate and the extension region on the drain side. The overlap region of the source impurity region is formed in the semiconductor substrate in such a manner as to overlap the gate electrode within the first semiconductor face with the gate insulating film interposed between the overlap region of the source impurity region and the gate electrode. Therefore a decrease in sheet carrier density in a gate corner part on a source side is avoided. In addition, the drain impurity region is formed in the semiconductor substrate under the second semiconductor face including the extension region on the drain side. Therefore a surface potential in the vicinity of a bend part of a channel (the first semiconductor face and the second semiconductor face) can be made higher than that of other parts. Thereby a drain electric field is shielded in the vicinity of the bend part. Thus a decrease in threshold voltage due to a short channel effect is suppressed, and a permissible range of variations in gate length is increased. Further, the overlap region of the source impurity region is formed, and thereby the junction interface between the drain impurity region and the semiconductor region is formed in a state of being closer to the boundary between the first semiconductor face and the second semiconductor face than the junction interface between the source impurity region and the semiconductor region. Therefore a decrease in local sheet carrier density in the vicinity of the bend part on the drain side is avoided, and a voltage drop in the vicinity of the bend part is suppressed. A semiconductor device having such characteristics is manufactured.

According to an embodiment of the present invention, there is provided a semiconductor device formed by a static random-access memory using an insulated gate field effect transistor as a selection transistor of a cell, the insulated gate field effect transistor including a semiconductor region having a first semiconductor face and a second semiconductor face connected to the first semiconductor face and having an inclination with respect to the first semiconductor face, a gate insulating film formed on the first semiconductor face and on the second semiconductor face, a gate electrode formed on the gate insulating film including a part on a boundary between the first semiconductor face and the second semiconductor face, a source impurity region formed in the semiconductor region so as to overlap the gate electrode within the first semiconductor face with the gate insulating film interposed between the source impurity region and the gate electrode, and a drain impurity region formed in the semiconductor region directly under the second semiconductor face at least, wherein a junction interface between the drain impurity region and the semiconductor region is formed in a state of being closer to the boundary between the first semiconductor face and the second semiconductor face than a junction interface between the source impurity region and the semiconductor region, a side of the source impurity region is connected to a bit line, and a side of the drain impurity region is connected to a gate electrode of a cell transistor.

In the semiconductor device according to the above-described embodiment, the insulated gate field effect transistor according to an embodiment of the present invention is used as the selection transistor of the cell. Therefore a high current driving power and a low leakage current are obtained in an inverter inside the cell. In addition, a threshold voltage on a drain side of the selection transistor is higher than on a source side due to action in the vicinity of a bend part between the first semiconductor face and the second semiconductor face. Therefore, when the inverter charges the bit line as a large capacitive load, a bit line side becomes a low threshold value side, and a high current driving power is obtained. When the gate of the inverter is conversely charged from the bit line, the drain side of the selection transistor is at a low potential, a high threshold value is obtained, and the current driving power is lowered. However, because a load to be charged is only a pair of gates, a disadvantage in terms of speed is insignificant.

According to an embodiment of the present invention, a decrease in sheet carrier density in the gate corner part on the source side is avoided. It is thus possible to prevent a rise in potential at the source end of the channel, and reduce a decrease in on current. In addition, the drain electric field is shielded in the vicinity of the bend part. Thus advantages are obtained in that a decrease in threshold voltage due to the short channel effect is suppressed and the permissible range of variations in gate length is increased. Further, a decrease in local sheet carrier density in the vicinity of the bend part on the drain side is avoided, and thus a voltage drop in the vicinity of the bend part can be suppressed. Thereby most of drain voltage is applied between the source and the vicinity of the bend part between the first semiconductor face and the second semiconductor face. Therefore a high current driving power is obtained.

According to an embodiment of the present invention, a decrease in sheet carrier density in the gate corner part on the source side is avoided. It is thus possible to prevent a rise in potential at the source end of the channel, and reduce a decrease in on current. In addition, the drain electric field is shielded in the vicinity of the bend part. Thus advantages are obtained in that a decrease in threshold voltage due to the short channel effect is suppressed and the permissible range of variations in gate length is increased. Further, a decrease in local sheet carrier density in the vicinity of the bend part on the drain side is avoided, and thus a voltage drop in the vicinity of the bend part can be suppressed. Thereby most of drain voltage is applied between the source and the vicinity of the bend part between the first semiconductor face and the second semiconductor face. Therefore a high current driving power is obtained. A semiconductor device having such characteristics can be manufactured.

According to an embodiment of the present invention, a high current driving power and a low leakage current are obtained in the inverter inside the cell. Therefore, a time for charging the bit line and a gate in a following stage can be shortened, and also static current consumption can be reduced. In addition, the selection transistor can obtain a high current driving power, and thus charge the bit line quickly. Thus the performance of the static random-access memory is enhanced.

BRIEF DESCRIPTION OF THE DRAWINGS

FIG. 8 is a diagram of an impurity concentration distribution of a semiconductor device according to an embodiment of the present invention;

FIG. 9 is a diagram of an electron concentration distribution of the semiconductor device according to the embodiment of the present invention;

DETAILED DESCRIPTION OF THE PREFERRED EMBODIMENTS

An embodiment (first embodiment) of a semiconductor device according to an embodiment of the present invention will be described with reference to a schematic constitution sectional view of FIG. 1.

Figure 1:
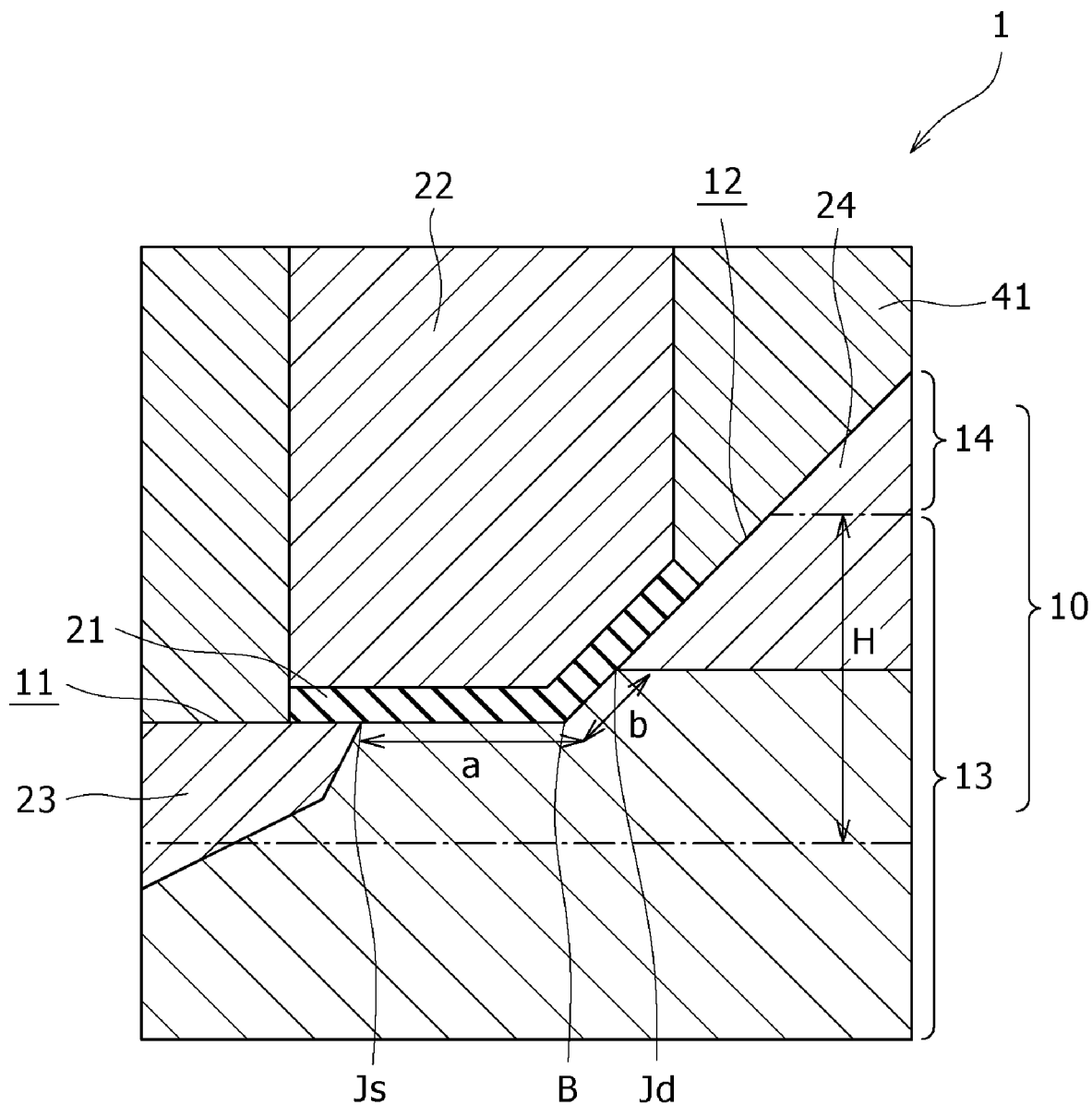
FIG. 1 is a schematic constitution sectional view of an embodiment (first embodiment) of a semiconductor device according to the present invention.

As shown in FIG. 1, a semiconductor region 10 has a first semiconductor face 11 and a second semiconductor face 12 connected to the first semiconductor face 11 and having an inclination with respect to the first semiconductor face 11. For example, the semiconductor region 10 includes a semiconductor substrate 13 having the first semiconductor face 11 and a semiconductor layer 14 having the second semiconductor face 12 on the semiconductor substrate 13. The second semiconductor face 12 is joined to the first semiconductor face and is formed also on a part of the semiconductor substrate 13. The semiconductor layer 14 is formed by epitaxial growth on the semiconductor substrate 13, for example. It suffices for an interface between the semiconductor layer 14 and the semiconductor substrate 13 to be within a range H indicated by alternate long and short dash lines in FIG. 1. That is, the interface between the semiconductor layer 14 and the semiconductor substrate 13 may be in any of a region where a source impurity region 23 to be described later is formed, an under face of a region where a drain impurity region 24 is formed, and the region where the drain impurity region 24 is formed.

A gate insulating film 21 is formed on the first semiconductor face 11 and on the second semiconductor face 12. A gate electrode 22 is formed on the gate insulating film 21 including a part on a boundary B between the first semiconductor face 11 and the second semiconductor face 12. This gate insulating film 21 is formed in a uniform film thickness.

A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least (for example in the semiconductor layer 14 and a part of the semiconductor substrate 13). This drain impurity region 24 overlaps the gate electrode 22 within the second semiconductor face 12 with the gate insulating film 21 interposed between the drain impurity region 24 and the gate electrode 22. The drain impurity region 24 is formed also in the semiconductor layer 14 at a position higher than the surface of the semiconductor substrate 13. That is, the drain impurity region 24 is formed in a state of springing from the surface of the semiconductor substrate 13. A junction interface Jd between the drain impurity region 24 and the semiconductor region 10 is formed in a state of being closer to the boundary B between the first semiconductor face 11 and the second semiconductor face 12 than a junction interface Js between the source impurity region 23 and the semiconductor region 10. That is, the channel length a of a channel formed under the first semiconductor face 11 and the channel length b of a channel formed under the second semiconductor face 12 has a relation a>b.

An insulating film 41 is formed on the source impurity region 23 and the drain impurity region 24. This insulating film 41 is desirably formed by a low dielectric constant film, for example.

In the semiconductor device 1, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12. Therefore a surface potential at a bend part of the channel (the boundary B between the first semiconductor face 11 and the second semiconductor face 12) becomes higher than that of other parts. A local threshold voltage is raised, and thereby a drain electric field is shielded at the bend part. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at the bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

An embodiment (second embodiment) of the present invention will next be described with reference to a schematic constitution sectional view of FIG. 2.

Figure 2:
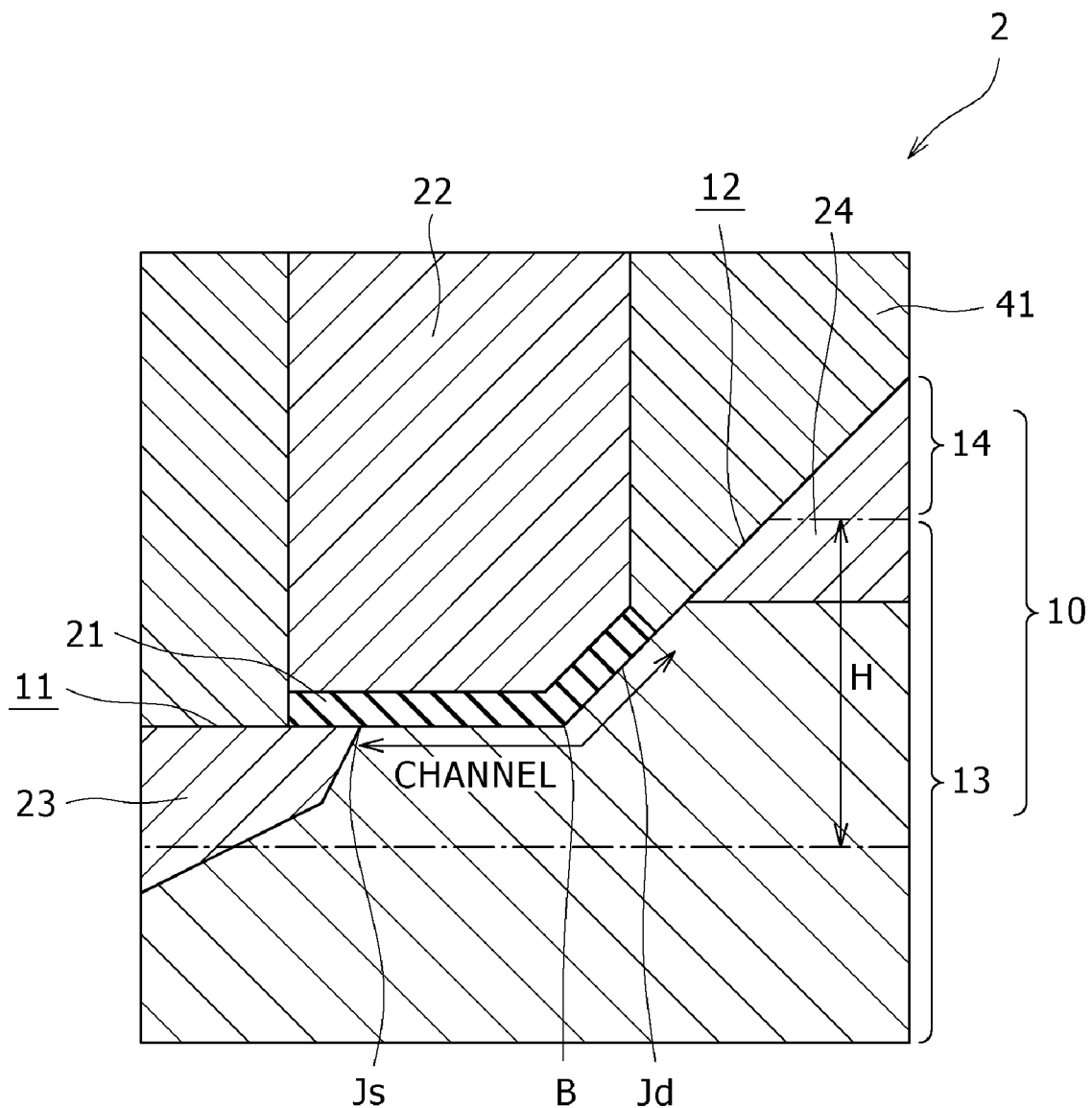
FIG. 2 is a schematic constitution sectional view of an embodiment (second embodiment) of a semiconductor device according to an embodiment of the present invention.

As shown in FIG. 2, a semiconductor region 10 has a first semiconductor face 11 and a second semiconductor face 12 connected to the first semiconductor face 11 and having an inclination with respect to the first semiconductor face 11. For example, the semiconductor region 10 includes a semiconductor substrate 13 having the first semiconductor face 11 and a semiconductor layer 14 having the second semiconductor face 12 on the semiconductor substrate 13. The second semiconductor face 12 is joined to the first semiconductor face and is formed also on a part of the semiconductor substrate 13. The semiconductor layer 14 is formed by epitaxial growth on the semiconductor substrate 13, for example. It suffices for an interface between the semiconductor layer 14 and the semiconductor substrate 13 to be within a range H indicated by alternate long and short dash lines in FIG. 2. That is, the interface between the semiconductor layer 14 and the semiconductor substrate 13 may be in any of a region where a source impurity region 23 to be described later is formed, an under face of a region where a drain impurity region 24 is formed, and the region where the drain impurity region 24 is formed.

A gate insulating film 21 is formed on the first semiconductor face 11 and on the second semiconductor face 12. A gate electrode 22 is formed on the gate insulating film 21 including a part on a boundary B between the first semiconductor face 11 and the second semiconductor face 12. This gate insulating film 21 is formed in a uniform film thickness.

A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least (for example in the semiconductor layer 14 and a part of the semiconductor substrate 13). This drain impurity region 24 does not overlap the gate electrode 22 within the second semiconductor face 12 with the gate insulating film 21 interposed between the drain impurity region 24 and the gate electrode 22. The second embodiment is different from the first embodiment in this respect. The drain impurity region 24 is formed also in the semiconductor layer 14 at a position higher than the surface of the semiconductor substrate 13. That is, the drain impurity region 24 is formed in a state of springing from the surface of the semiconductor substrate 13. A junction interface Jd between the drain impurity region 24 and the semiconductor region 10 is formed in a state of being closer to the boundary B between the first semiconductor face 11 and the second semiconductor face 12 than a junction interface Js between the source impurity region 23 and the semiconductor region 10. That is, the channel length a of a channel formed under the first semiconductor face 11 and the channel length b of a channel formed under the second semiconductor face 12 has a relation a>b.

An insulating film 41 is formed on the source impurity region 23 and the drain impurity region 24. This insulating film 41 is desirably formed by a low dielectric constant film, for example.

The semiconductor device 2 has the same action and effect as the semiconductor device 1. That is, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12. Therefore a surface potential at a bend part of the channel (the boundary B between the first semiconductor face 11 and the second semiconductor face 12) becomes higher than that of other parts. A local threshold voltage is raised, and thereby a drain electric field is shielded at the bend part. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at the bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

An embodiment (third embodiment) of the present invention will next be described with reference to a schematic constitution sectional view of FIG. 3.

Figure 3:
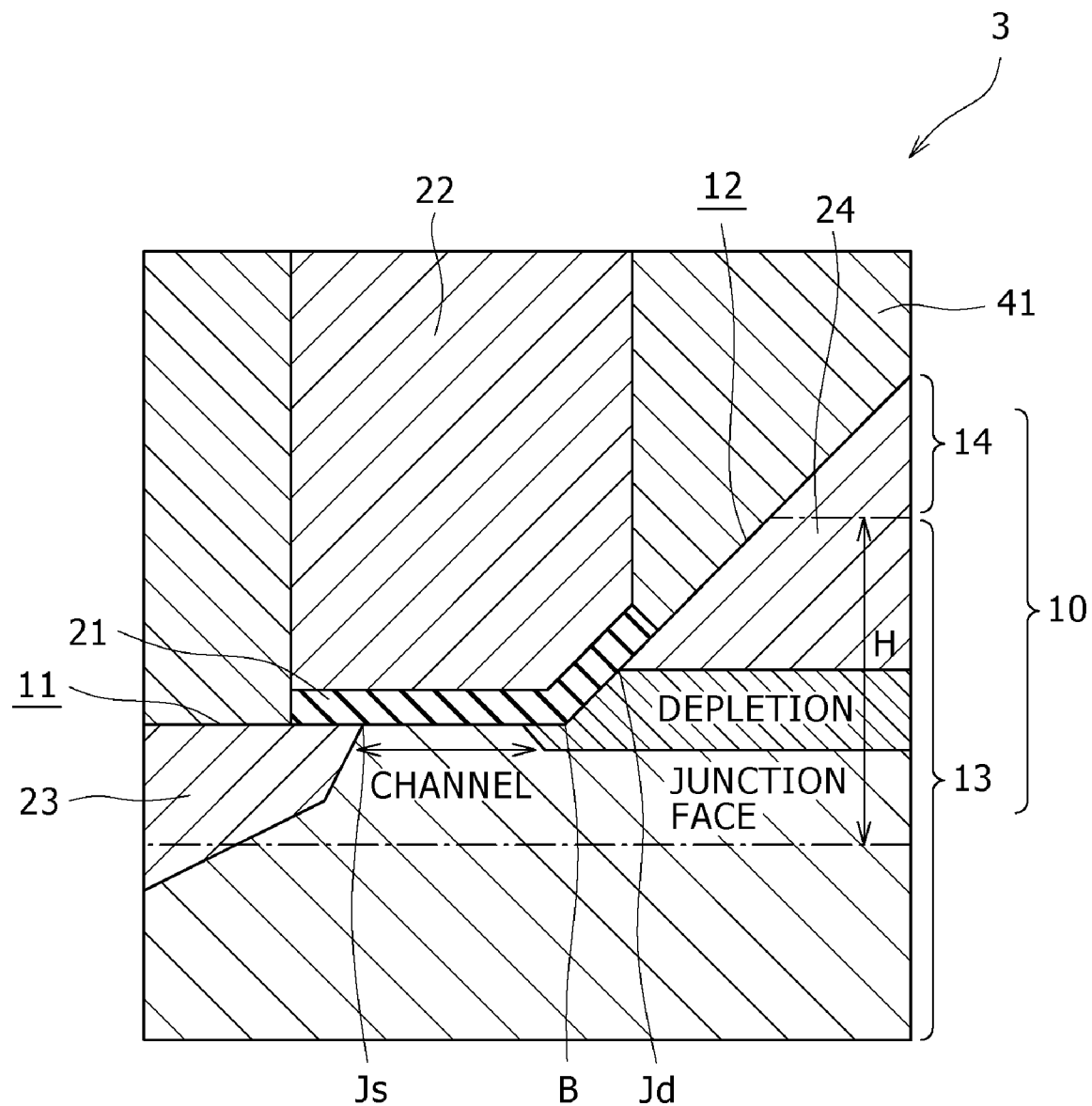
FIG. 3 is a schematic constitution sectional view of an embodiment (third embodiment) of a semiconductor device according to an embodiment of the present invention.

As shown in FIG. 3, a semiconductor region 10 has a first semiconductor face 11 and a second semiconductor face 12 connected to the first semiconductor face 11 and having an inclination with respect to the first semiconductor face 11. For example, the semiconductor region 10 includes a semiconductor substrate 13 having the first semiconductor face 11 and a semiconductor layer 14 having the second semiconductor face 12 on the semiconductor substrate 13. The second semiconductor face 12 is joined to the first semiconductor face and is formed also on a part of the semiconductor substrate 13. The semiconductor layer 14 is formed by epitaxial growth on the semiconductor substrate 13, for example. It suffices for an interface between the semiconductor layer 14 and the semiconductor substrate 13 to be within a range H indicated by alternate long and short dash lines in FIG. 3. That is, the interface between the semiconductor layer 14 and the semiconductor substrate 13 may be in any of a region where a source impurity region 23 to be described later is formed, an under face of a region where a drain impurity region 24 is formed, and the region where the drain impurity region 24 is formed.

A gate insulating film 21 is formed on the first semiconductor face 11 and the second semiconductor face 12. A gate electrode 22 is formed on the gate insulating film 21 including a part on a boundary B between the first semiconductor face 11 and the second semiconductor face 12. This gate insulating film 21 is formed in a uniform film thickness. A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least (for example in the semiconductor layer 14 and a part of the semiconductor substrate 13). This drain impurity region 24 overlaps the gate electrode 22 within the second semiconductor face 12 with the gate insulating film 21 interposed between the drain impurity region 24 and the gate electrode 22. In addition, the drain impurity region 24 is formed deeper than a channel layer, and a part of the boundary B between the first semiconductor face 11 and the second semiconductor face 12 is in a depletion layer 25. A junction interface Jd between the drain impurity region 24 and the semiconductor region 10 is effectively formed in a state of being closer to the boundary B between the first semiconductor face 11 and the second semiconductor face 12 than a junction interface Js between the source impurity region 23 and the semiconductor region 10.

The drain impurity region 24 is formed also in the semiconductor layer 14 at a position higher than the surface of the semiconductor substrate 13. That is, the drain impurity region 24 is formed in a state of springing from the surface of the semiconductor substrate 13.

An insulating film 41 is formed on the source impurity region 23 and the drain impurity region 24. This insulating film 41 is desirably formed by a low dielectric constant film, for example.

The semiconductor device 3 has the same action and effect as the semiconductor device 1. That is, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12, and the boundary B between the first semiconductor face 11 and the second semiconductor face 12 is within the depletion layer 26. Therefore a drain electric field is shielded by the depletion layer 26. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at a bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

An embodiment (fourth embodiment) of the present invention will next be described with reference to a schematic constitution sectional view of FIG. 4.

Figure 4:
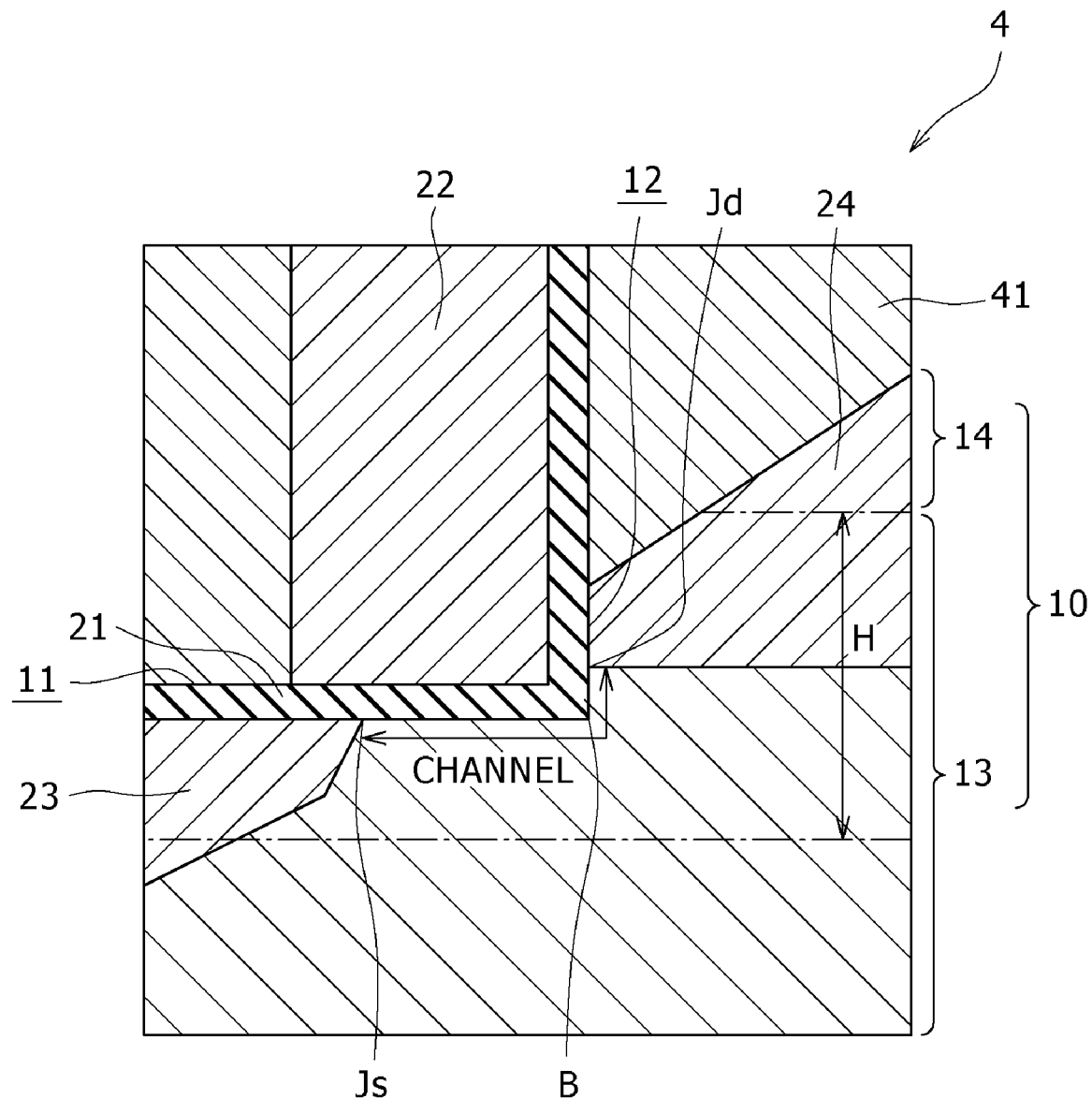
FIG. 4 is a schematic constitution sectional view of an embodiment (fourth embodiment) of a semiconductor device according to an embodiment of the present invention.

As shown in FIG. 4, a semiconductor region 10 has a first semiconductor face 11 and a second semiconductor face 12 in contact with the first semiconductor face 11 at a right angle, for example. For example, the semiconductor region 10 includes a semiconductor substrate 13 having the first semiconductor face 11 and a semiconductor layer 14 formed on the semiconductor substrate 13. The semiconductor layer 14 may include the second semiconductor face 12, or may not include the second semiconductor face 12, as shown in FIG. 4. In the case of this drawing, the second semiconductor face 12 joined to the first semiconductor face 11 is formed on the semiconductor substrate 13. The semiconductor layer 14 is formed by epitaxial growth on the semiconductor substrate 13, for example. It suffices for an interface between the semiconductor layer 14 and the semiconductor substrate 13 to be within a range H indicated by alternate long and short dash lines in FIG. 4. That is, the interface between the semiconductor layer 14 and the semiconductor substrate 13 may be in any of a region where a source impurity region 23 to be described later is formed, an under face of a region where a drain impurity region 24 is formed, and the region where the drain impurity region 24 is formed.

A gate insulating film 21 is formed on the first semiconductor face 11 and the second semiconductor face 12. A gate electrode 22 is formed on the gate insulating film 21 including a part on a boundary B between the first semiconductor face 11 and the second semiconductor face 12. This gate insulating film 21 is formed in a uniform film thickness. A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least. This drain impurity region 24 overlaps the gate electrode 22 within the second semiconductor face 12 with the gate insulating film 21 interposed between the drain impurity region 24 and the gate electrode 22. A junction interface Jd between the drain impurity region 24 and the semiconductor region 10 is formed in a state of being closer to the boundary B between the first semiconductor face 11 and the second semiconductor face 12 than a junction interface Js between the source impurity region 23 and the semiconductor region 10.

An insulating film 41 is formed on the source impurity region 23 and the drain impurity region 24. This insulating film 41 is desirably formed by a low dielectric constant film, for example.

The semiconductor device 4 has the same action and effect as the semiconductor device 1. That is, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12. Therefore a surface potential at a bend part of the channel (the boundary B between the first semiconductor face 11 and the second semiconductor face 12) becomes higher than that of other parts. A local threshold voltage is raised, and thereby a drain electric field is shielded at the bend part. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at the bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

An embodiment (second embodiment) of the present invention will next be described with reference to a schematic constitution sectional view of FIG. 2.

As shown in FIG. 2, a semiconductor region 10 has a first semiconductor face 11 and a second semiconductor face 12 connected to the first semiconductor face 11 and having an inclination with respect to the first semiconductor face 11. For example, the semiconductor region 10 includes a semiconductor substrate 13 having the first semiconductor face 11 and a semiconductor layer 14 having the second semiconductor face 12 on the semiconductor substrate 13. The second semiconductor face 12 is joined to the first semiconductor face and is formed also on a part of the semiconductor substrate 13. The semiconductor layer 14 is formed by epitaxial growth on the semiconductor substrate 13, for example. It suffices for an interface between the semiconductor layer 14 and the semiconductor substrate 13 to be within a range H indicated by alternate long and short dash lines in FIG. 2. That is, the interface between the semiconductor layer 14 and the semiconductor substrate 13 may be in any of a region where a source impurity region 23 to be described later is formed, an under face of a region where a drain impurity region 24 is formed, and the region where the drain impurity region 24 is formed.

A gate insulating film 21 is formed on the first semiconductor face 11 and on the second semiconductor face 12. A gate electrode 22 is formed on the gate insulating film 21 including a part on a boundary B between the first semiconductor face 11 and the second semiconductor face 12. This gate insulating film 21 is formed in a uniform film thickness.

A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least (for example in the semiconductor layer 14 and a part of the semiconductor substrate 13). This drain impurity region 24 does not overlap the gate electrode 22 within the second semiconductor face 12 with the gate insulating film 21 interposed between the drain impurity region 24 and the gate electrode 22. The second embodiment is different from the first embodiment in this respect. The drain impurity region 24 is formed also in the semiconductor layer 14 at a position higher than the surface of the semiconductor substrate 13. That is, the drain impurity region 24 is formed in a state of springing from the surface of the semiconductor substrate 13. A junction interface Jd between the drain impurity region 24 and the semiconductor region 10 is formed in a state of being closer to the boundary B between the first semiconductor face 11 and the second semiconductor face 12 than a junction interface Js between the source impurity region 23 and the semiconductor region 10. That is, the channel length a of a channel formed under the first semiconductor face 11 and the channel length b of a channel formed under the second semiconductor face 12 has a relation a>b.

An insulating film 41 is formed on the source impurity region 23 and the drain impurity region 24. This insulating film 41 is desirably formed by a low dielectric constant film, for example.

The semiconductor device 2 has the same action and effect as the semiconductor device 1. That is, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12. Therefore a surface potential at a bend part of the channel (the boundary B between the first semiconductor face 11 and the second semiconductor face 12) becomes higher than that of other parts. A local threshold voltage is raised, and thereby a drain electric field is shielded at the bend part. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at the bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

An embodiment (third embodiment) of the present invention will next be described with reference to a schematic constitution sectional view of FIG. 3.

As shown in FIG. 3, a semiconductor region 10 has a first semiconductor face 11 and a second semiconductor face 12 connected to the first semiconductor face 11 and having an inclination with respect to the first semiconductor face 11. For example, the semiconductor region 10 includes a semiconductor substrate 13 having the first semiconductor face 11 and a semiconductor layer 14 having the second semiconductor face 12 on the semiconductor substrate 13. The second semiconductor face 12 is joined to the first semiconductor face and is formed also on a part of the semiconductor substrate 13. The semiconductor layer 14 is formed by epitaxial growth on the semiconductor substrate 13, for example. It suffices for an interface between the semiconductor layer 14 and the semiconductor substrate 13 to be within a range H indicated by alternate long and short dash lines in FIG. 3. That is, the interface between the semiconductor layer 14 and the semiconductor substrate 13 may be in any of a region where a source impurity region 23 to be described later is formed, an under face of a region where a drain impurity region 24 is formed, and the region where the drain impurity region 24 is formed.

A gate insulating film 21 is formed on the first semiconductor face 11 and the second semiconductor face 12. A gate electrode 22 is formed on the gate insulating film 21 including a part on a boundary B between the first semiconductor face 11 and the second semiconductor face 12. This gate insulating film 21 is formed in a uniform film thickness. A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least (for example in the semiconductor layer 14 and a part of the semiconductor substrate 13). This drain impurity region 24 overlaps the gate electrode 22 within the second semiconductor face 12 with the gate insulating film 21 interposed between the drain impurity region 24 and the gate electrode 22. In addition, the drain impurity region 24 is formed deeper than a channel layer, and a part of the boundary B between the first semiconductor face 11 and the second semiconductor face 12 is in a depletion layer 25. A junction interface Jd between the drain impurity region 24 and the semiconductor region 10 is effectively formed in a state of being closer to the boundary B between the first semiconductor face 11 and the second semiconductor face 12 than a junction interface Js between the source impurity region 23 and the semiconductor region 10.

The drain impurity region 24 is formed also in the semiconductor layer 14 at a position higher than the surface of the semiconductor substrate 13. That is, the drain impurity region 24 is formed in a state of springing from the surface of the semiconductor substrate 13.

An insulating film 41 is formed on the source impurity region 23 and the drain impurity region 24. This insulating film 41 is desirably formed by a low dielectric constant film, for example.

The semiconductor device 3 has the same action and effect as the semiconductor device 1. That is, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12, and the boundary B between the first semiconductor face 11 and the second semiconductor face 12 is within the depletion layer 26. Therefore a drain electric field is shielded by the depletion layer 26. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at a bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

An embodiment (fourth embodiment) of the present invention will next be described with reference to a schematic constitution sectional view of FIG. 4.

As shown in FIG. 4, a semiconductor region 10 has a first semiconductor face 11 and a second semiconductor face 12 in contact with the first semiconductor face 11 at a right angle, for example. For example, the semiconductor region 10 includes a semiconductor substrate 13 having the first semiconductor face 11 and a semiconductor layer 14 formed on the semiconductor substrate 13. The semiconductor layer 14 may include the second semiconductor face 12, or may not include the second semiconductor face 12, as shown in FIG. 4. In the case of this drawing, the second semiconductor face 12 joined to the first semiconductor face 11 is formed on the semiconductor substrate 13. The semiconductor layer 14 is formed by epitaxial growth on the semiconductor substrate 13, for example. It suffices for an interface between the semiconductor layer 14 and the semiconductor substrate 13 to be within a range H indicated by alternate long and short dash lines in FIG. 4. That is, the interface between the semiconductor layer 14 and the semiconductor substrate 13 may be in any of a region where a source impurity region 23 to be described later is formed, an under face of a region where a drain impurity region 24 is formed, and the region where the drain impurity region 24 is formed.

A gate insulating film 21 is formed on the first semiconductor face 11 and the second semiconductor face 12. A gate electrode 22 is formed on the gate insulating film 21 including a part on a boundary B between the first semiconductor face 11 and the second semiconductor face 12. This gate insulating film 21 is formed in a uniform film thickness. A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least. This drain impurity region 24 overlaps the gate electrode 22 within the second semiconductor face 12 with the gate insulating film 21 interposed between the drain impurity region 24 and the gate electrode 22. A junction interface Jd between the drain impurity region 24 and the semiconductor region 10 is formed in a state of being closer to the boundary B between the first semiconductor face 11 and the second semiconductor face 12 than a junction interface Js between the source impurity region 23 and the semiconductor region 10.

An insulating film 41 is formed on the source impurity region 23 and the drain impurity region 24. This insulating film 41 is desirably formed by a low dielectric constant film, for example.

The semiconductor device 4 has the same action and effect as the semiconductor device 1. That is, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12. Therefore a surface potential at a bend part of the channel (the boundary B between the first semiconductor face 11 and the second semiconductor face 12) becomes higher than that of other parts. A local threshold voltage is raised, and thereby a drain electric field is shielded at the bend part. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at the bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

An embodiment (fifth embodiment) of the present invention will next be described with reference to a schematic constitution sectional view of FIG. 5.

Figure 5:
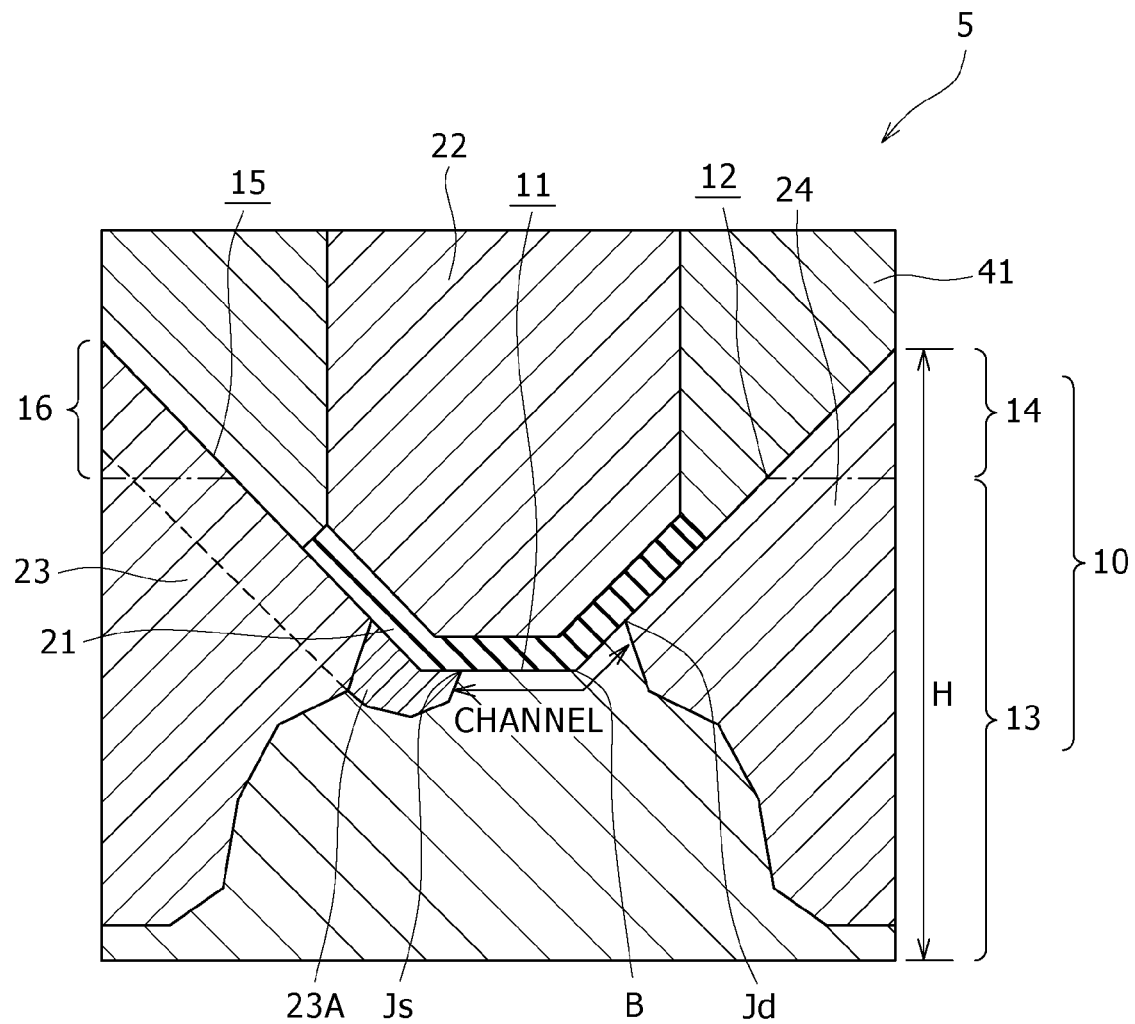
FIG. 5 is a schematic constitution sectional view of an embodiment (fifth embodiment) of a semiconductor device according to an embodiment of the present invention.

As shown in FIG. 5, a semiconductor region 10 has a first semiconductor face 11, a second semiconductor face 12 connected to the first semiconductor face 11 and having an inclination with respect to the first semiconductor face 11, and a third semiconductor face 15. For example, the semiconductor region 10 includes a semiconductor substrate 13 having the first semiconductor face 11, a semiconductor layer 14 having the second semiconductor face 12 on the semiconductor substrate 13, and a semiconductor layer 16 having the third semiconductor face 15 on the semiconductor substrate 13. The second semiconductor face 12 and the third semiconductor face 15 may each be joined to the first semiconductor face and formed also on a part of the semiconductor substrate 13. The semiconductor layer 14 is formed by epitaxial growth on the semiconductor substrate 13, for example. An interface between the semiconductor layer 14 and the semiconductor substrate 13 is within a range H indicated by alternate long and short dash lines in FIG. 5. That is, the interface between the semiconductor layer 14 and the semiconductor substrate 13 is in a region where a source impurity region 23 to be described later is formed or a region where a drain impurity region 24 is formed.

A gate insulating film 21 is formed on the third semiconductor face 15, on the first semiconductor face 11, and on the second semiconductor face 12. A gate electrode 22 is formed on the gate insulating film 21 including at least a part on a boundary B between the first semiconductor face 11 and the second semiconductor face 12, or on the gate insulating film 21 on the first semiconductor face 11 and the second semiconductor face 12 and the third semiconductor face 15 on both sides of the first semiconductor face 11 in the present embodiment. This gate insulating film 21 is formed in a uniform film thickness.

A source impurity region 23 is formed in the semiconductor region 10 in such a manner as to overlap the gate electrode 22 within the first semiconductor face 11 with the gate insulating film 21 interposed between the source impurity region 23 and the gate electrode 22. Further, a drain impurity region 24 is formed in the semiconductor region 10 directly under the second semiconductor face 12 at least (for example in the semiconductor layer 14 and a part of the semiconductor substrate 13). This drain impurity region 24 overlaps the gate electrode 22 within the second semiconductor face 12 with the gate insulating film 21 interposed between the drain impurity region 24 and the gate electrode 22. The drain impurity region 24 is formed also in the semiconductor layer 14 at a position higher than the surface of the semiconductor substrate 13. That is, the drain impurity region 24 is formed in a state of springing from the surface of the semiconductor substrate 13. A junction interface Jd between the drain impurity region 24 and the semiconductor region 10 is formed in a state of being closer to the boundary B between the first semiconductor face 11 and the second semiconductor face 12 than a junction interface Js between the source impurity region 23 and the semiconductor region 10. Thus, in the present semiconductor device 5, an impurity region is formed asymmetrically in a part of the source impurity region 23 formed in such a manner as to overlap the gate electrode 22 within the first semiconductor face 11 with the gate insulating film 21 interposed between the source impurity region 23 and the gate electrode 22, and other constituent elements are formed symmetrically. The asymmetric region 23A of the source impurity region 23 is formed by oblique ion implantation, for example.

An insulating film 41 is formed on the source impurity region 23 and the drain impurity region 24. This insulating film 41 is desirably formed by a low dielectric constant film, for example.

The semiconductor device 5 has the same action and effect as the semiconductor device 1. That is, the gate electrode 22 is formed on the gate insulating film 21 including the part on the boundary B between the first semiconductor face 11 and the second semiconductor face 12 connected to each other at an angle, and the source impurity region 23 is formed in the semiconductor region 10 in such a manner as to overlap the gate electrode 22 within the first semiconductor face 11 with the gate insulating film 21 interposed between the source impurity region 23 and the gate electrode 22. Therefore a decrease in sheet carrier density in a gate corner part on a source side is avoided. It is thus possible to prevent a rise in potential at the source end of the channel, and reduce a decrease in on current.

In addition, the drain impurity region 24 is formed in the semiconductor region 10 directly under the second semiconductor face 12. Therefore a surface potential at a bend part of the channel (the boundary B between the first semiconductor face 11 and the second semiconductor face 12) becomes higher than that of other parts. A local threshold voltage is raised, and thereby a drain electric field is shielded at the bend part. Thus advantages are provided in that a decrease in threshold voltage due to a short channel effect is suppressed and a permissible range of variations in gate length is increased.

Further, the junction interface Jd between the drain impurity region 24 and the semiconductor region 10 in the second semiconductor face 12 is formed in a state of being closer to the boundary B between the first semiconductor face 11 and the second semiconductor face 12 than the junction interface Js between the source impurity region 23 and the semiconductor region 10 in the first semiconductor face 11. Therefore a decrease in local sheet carrier density at the bend part on a drain side is avoided, and a voltage drop at the bend part is suppressed. Thus, the voltage drop at the bend part is suppressed, and thereby most of drain voltage is applied between the source and the bend part (the boundary B between the first semiconductor face 11 and the second semiconductor face 12). Therefore a high current driving capability is obtained.

Shapes of a part of connection between the first semiconductor face 11 and the second semiconductor face 12 will be described with reference to schematic constitution sectional views of FIG. 6. FIG. 6 shows states of connection between the first semiconductor face 11 and the second semiconductor face 12 of the semiconductor region 10 in which the source impurity region 23 and the drain impurity region 24 are formed, and show the states of connection between the first semiconductor face 11 and the second semiconductor face 12 with the gate insulating film 21 formed.

Figure 6A:
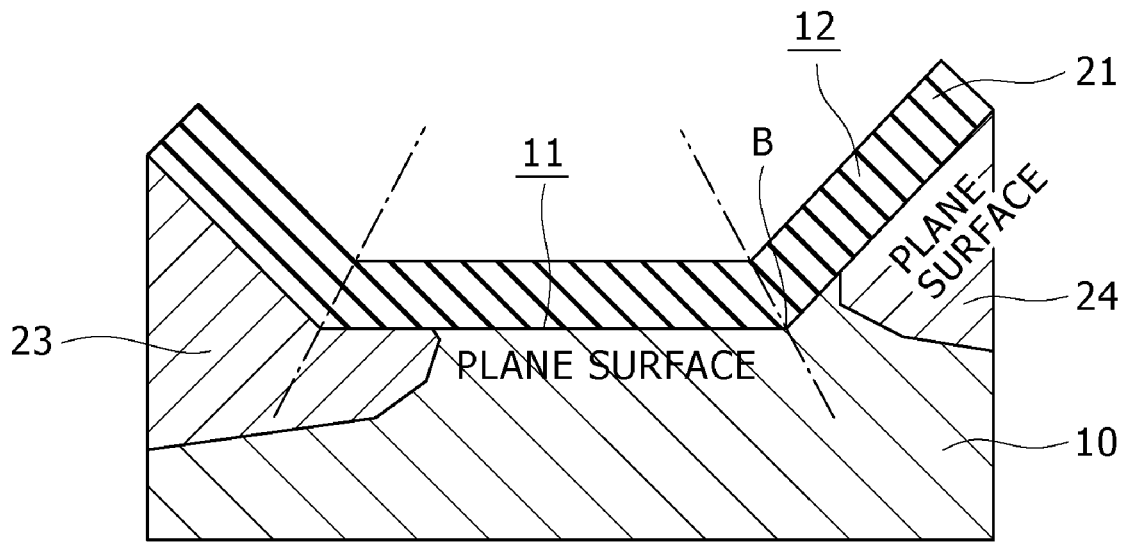
FIGS. 6A to 6D are schematic constitution sectional views of an example of configuration of an embodiment of a semiconductor device according to an embodiment of the present invention.

As to the first semiconductor face 11 and the second semiconductor face 12 of the semiconductor region 10 in which the source impurity region 23 and the drain impurity region 24 are formed as described in the foregoing first to five embodiments, as shown in FIG. 6A, the first semiconductor face 11 formed by a plane surface and the second semiconductor face 12 formed by a plane surface are formed so as to be in contact with each other at an angle (an angle more than 0° and equal to or less than 90°) at the boundary B between the first semiconductor face 11 and the second semiconductor face 12. Therefore the boundary B between the first semiconductor face 11 and the second semiconductor face 12 is linear. The state of connection between the first semiconductor face 11 and the second semiconductor face 12 can also be forms as described below.

Figure 6B:
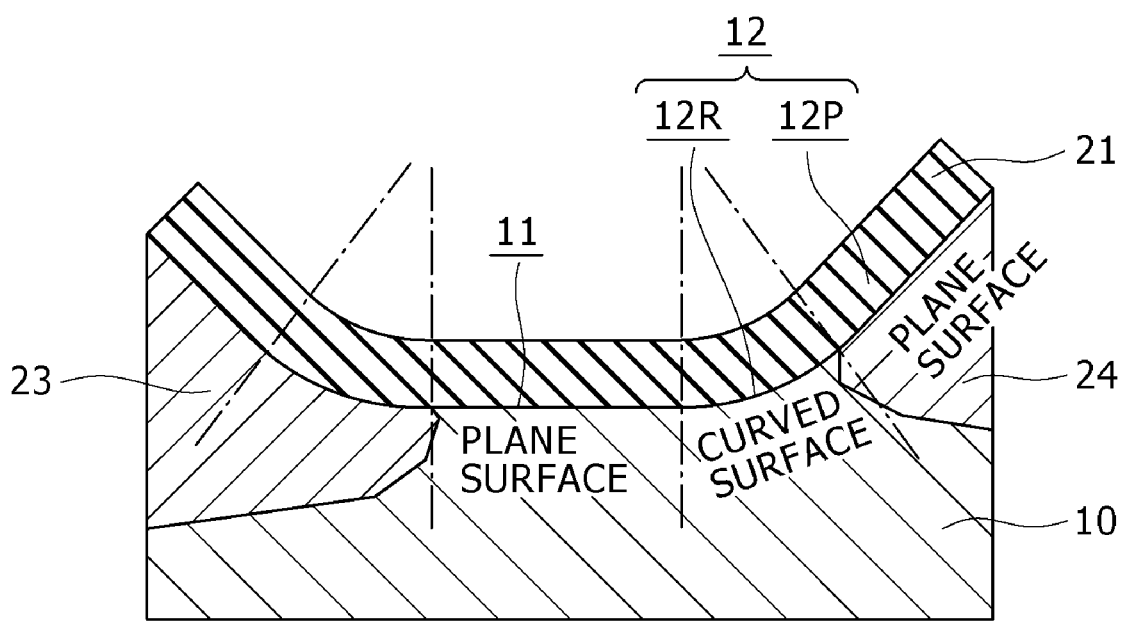

For example, as shown in FIG. 6B, the first semiconductor face 11 of the semiconductor region 10 is formed by a plane surface, and the second semiconductor face 12 is formed by a plane surface with a curved surface 12R interposed between the plane surfaces on a side of the first semiconductor face 11. That is, the second semiconductor face 12 is formed by the curved surface 12R and the plane surface 12P. For example, the first semiconductor face 11 and the curved surface 12R of the second semiconductor face 12 may continuously change from the first semiconductor face 11 of the plane surface to the second semiconductor face 12 of the curved surface, or may discontinuously change from the first semiconductor face 11 to the curved surface of the second semiconductor face. Similarly, the second semiconductor face 12 may continuously change from the curved surface 12R to the plane surface 12P, or may discontinuously change from the curved surface 12R to the plane surface 12P.

Figure 6C:
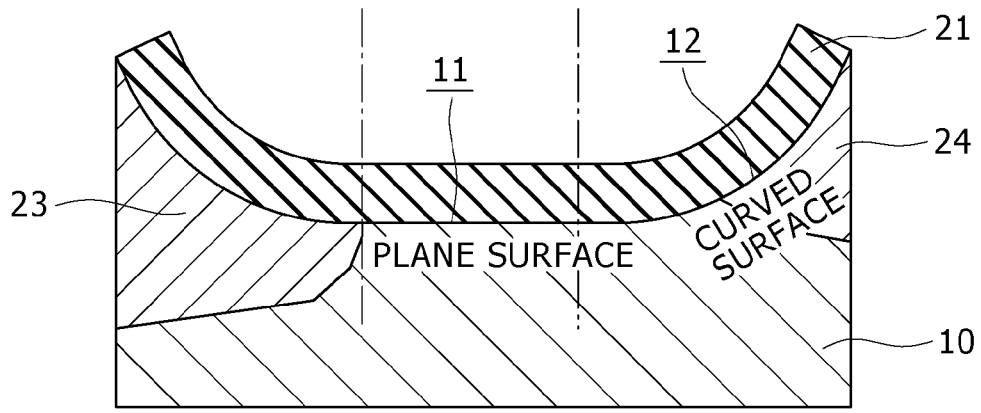

In addition, as shown in FIG. 6C, the first semiconductor face 11 of the semiconductor region 10 is formed by a plane surface, and the second semiconductor face 12 is formed by a curved surface. For example, the first semiconductor face 11 and the second semiconductor face 12 may continuously change from the first semiconductor face 11 of the plane surface to the second semiconductor face 12 of the curved surface, or may discontinuously change from the first semiconductor face 11 to the curved surface of the second semiconductor face.

Figure 6D:
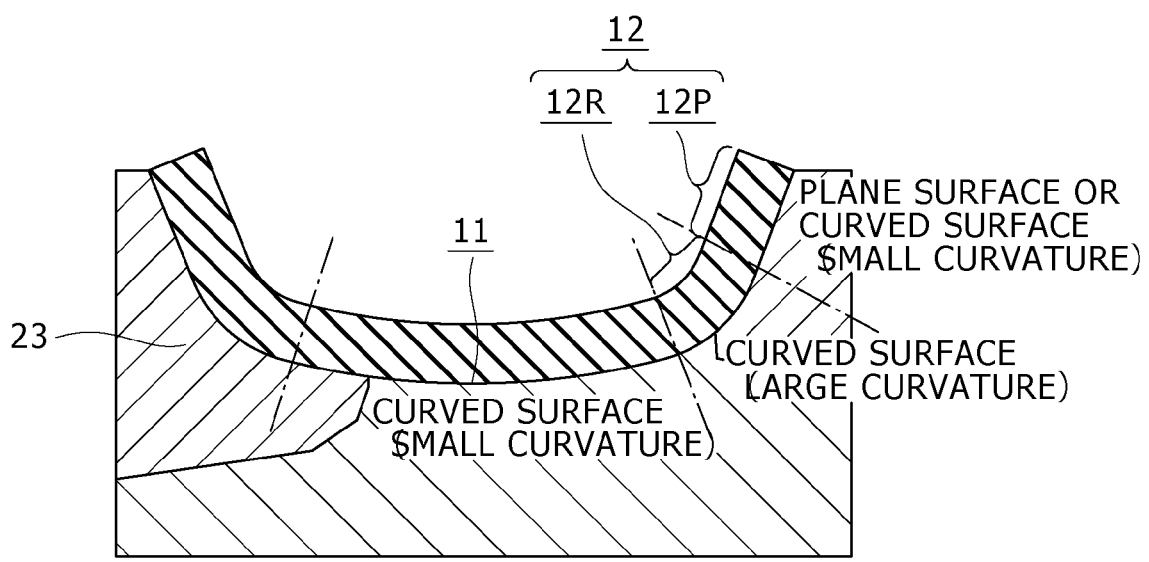

In addition, as shown in FIG. 6D, the first semiconductor face 11 of the semiconductor region 10 is formed by a curved surface, and the second semiconductor face 12 is formed by a plane surface or a curved surface with a curved surface 12R interposed between the curved surface and the plane surface or the curved surface on a side of the first semiconductor face 11. That is, the second semiconductor face 12 is formed by the curved surface 12R and the plane surface 12P. Alternatively, the second semiconductor face 12 is formed by curved surfaces (not shown). The curvature of the curved surface 12R of the second semiconductor face 12 is larger than the curvature of the curved surface of the first semiconductor face 11. When the second semiconductor face 12 is formed by curved surfaces, the curvature of the curved surface on the side of the first semiconductor face 11 is made large. For example, the first semiconductor face 11 and the second semiconductor face 12 may continuously change from the first semiconductor face 11 of the curved surface to the curved surface 12R of the second semiconductor face 12, or may discontinuously change from the first semiconductor face 11 to the curved surface of the second semiconductor face. Similarly, the second semiconductor face 12 may continuously change from the curved surface 12R to the plane surface 12P, or may discontinuously change from the curved surface 12R to the plane surface 12P.

In the description with reference to FIG. 6, "continuously change" refers to a smooth state in which the boundary between the first semiconductor face 11 and the second semiconductor face 12 does not appear linearly, and "discontinuously change" refers to a state in which the boundary between the first semiconductor face 11 and the second semiconductor face 12 appears linearly. Incidentally, "discontinuously change" does not mean a difference in level between the first semiconductor face 11 and the second semiconductor face 12.

An embodiment of a method of manufacturing a semiconductor device according to an embodiment of the present invention will next be described with reference to manufacturing process sectional views of FIG. 7. The description with reference to FIG. 7 will be made by taking an N-type channel MOSFET as an example. Incidentally, a method of manufacturing a P-type channel MOSFET is similar to the method of manufacturing the N-type channel MOSFET except that the conduction type of an impurity used in doping is different.

Figure 7A:
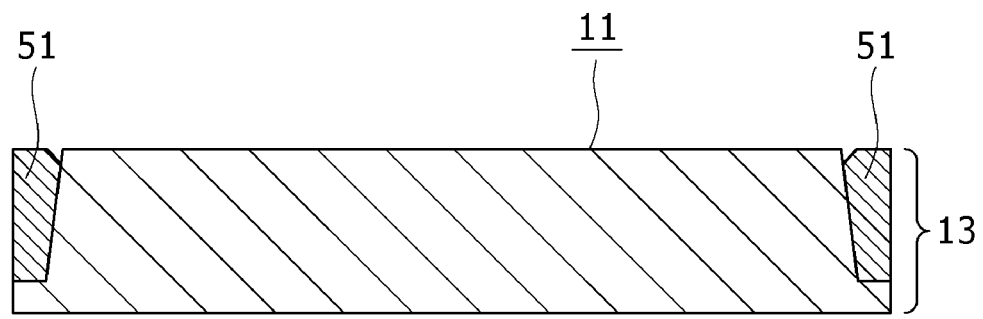
FIGS. 7A to 7X are manufacturing process sectional views representing an embodiment of a method of manufacturing a semiconductor device according to an embodiment of the present invention.

As shown in FIG. 7A, an inter-element isolation region 51 is formed in a semiconductor substrate 13 having a first semiconductor face 11 by trench isolation, for example.

Figure 7B:
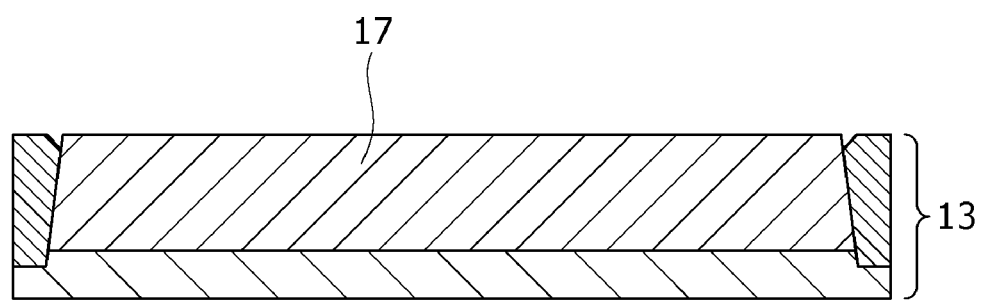

Next, as shown in FIG. 7B, an oxide film (not shown) is formed on the surface of the semiconductor substrate 13. This oxide film is for example formed with a thickness of 8 nm by thermal oxidation of the semiconductor substrate 13. Next, the surface of the semiconductor substrate 13 excluding an active region is covered with a resist film (not shown). Thereafter, ion implantation is performed, and activation annealing is performed after the resist film is removed, so that a channel layer 17 is formed. Boron (B), for example, is used as an ion species in the ion implantation. When a complementary type integrated circuit is formed, a well (not shown) may be formed by a similar procedure about a time of the channel implantation. An impurity of the well is for example phosphorus (P). The activation annealing is performed for 10 s at 1010° C. by an RTA (Rapid Thermal Annealing) method, for example.

Figure 7C:
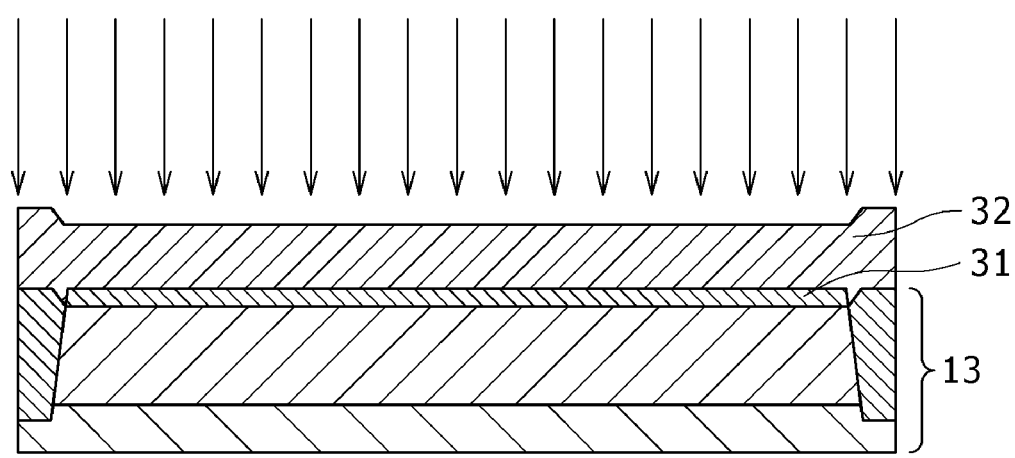

As shown in FIG. 7C, after the oxide film formed by the thermal oxidation is removed, a dummy gate insulating film 31 and a gate sacrificial layer 32 are sequentially formed on the surface of the semiconductor substrate 13. As the dummy gate insulating film 31, an oxide film is formed by thermal oxidation, for example. In this case, as an example, a silicon oxide film is formed with a thickness of 1 nm to 3 nm, for example. The dummy gate insulating film 31 may be modified into an oxynitride film by being subjected to nitrogen plasma after the oxidation. The gate sacrificial layer 32 is formed by depositing polysilicon to a thickness of 100 nm to 150 nm by a thermal CVD method, for example. Next, after an impurity is introduced into the gate sacrificial layer 32 by an ion implantation method, for example, activation annealing is performed to activate the impurity implanted in the gate sacrificial layer 32. The impurity introduced into the gate sacrificial layer 32 is for example phosphorus (P).

Figure 7D:
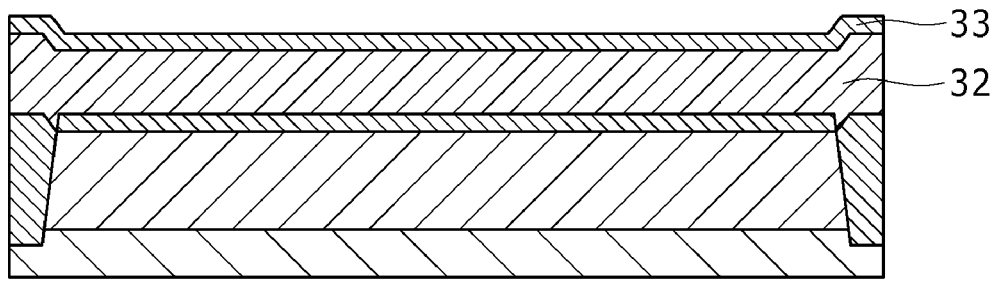

Next, as shown in FIG. 7D, a hard mask layer 33 is formed on the gate sacrificial layer 32. The hard mask layer 33 is for example composed of two layer films obtained by forming a silicon oxide ($SiO_2$) film with a thickness of 30 nm and thereafter forming a silicon nitride (SiN) film with a thickness of 30 nm. These films are formed by a thermal CVD method, for example.

Figure 7E:
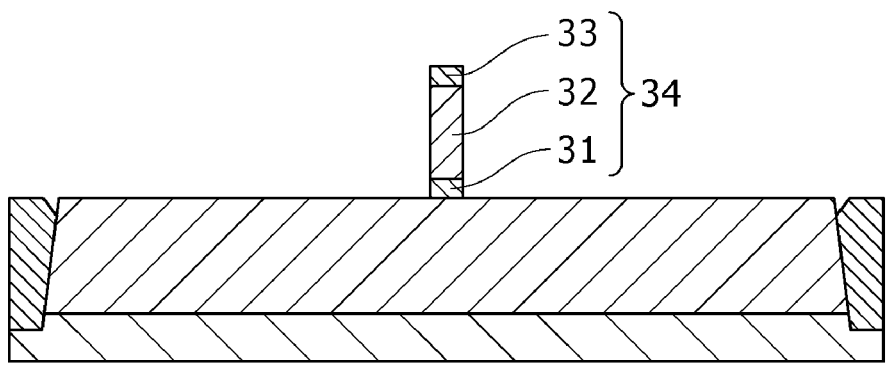

Next, as shown in FIG. 7E, after a resist film (not shown) is formed on the hard mask layer 33, a gate pattern (not shown) is formed in the resist film by optical lithography technology, electron beam lithography technology, or a combination thereof. Next, after the patterned resist film is made thinner isotropically by oxygen plasma to obtain a desired pattern size, reactive ion etching is performed to transfer the resist pattern to the hard mask layer 33. Next, with the hard mask layer 33 as a mask, the gate sacrificial layer 32 is subjected to reactive ion etching to obtain a dummy gate (gate stack) 34. At this time, it is desirable to set etching conditions such that the oxide film 31 remains in an etching region.

Figure 7F:
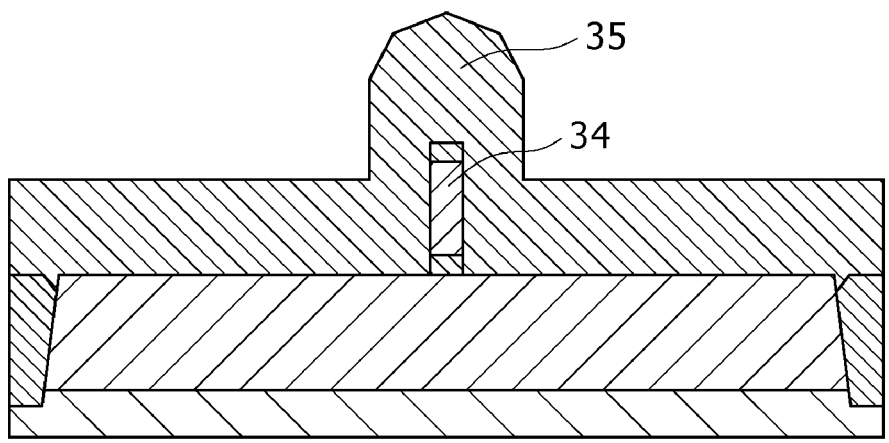

Next, as shown in FIG. 7F, an insulating film 35 for covering the dummy gate 34 is formed over an entire surface on the semiconductor substrate 13. The insulating film 35 is a silicon nitride (SiN) film formed by a thermal CVD method, for example.

Figure 7G:
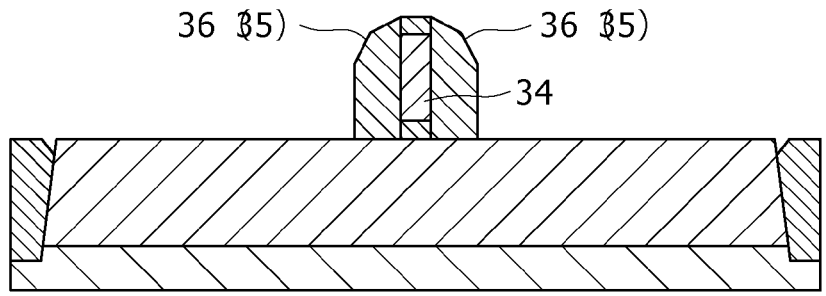

Next, as shown in FIG. 7G, the insulating film 35 is etched back by reactive ion etching to form side wall insulating films 36 on both sides of the dummy gate 34. The width of the side wall insulating films 36 is selected on the basis of a relation between gate length (the width of the dummy gate 34) and the junction depth of a source and a drain region formed in a next process. For example, when the gate length is 20 nm and the junction depth is 150 nm, the width of a bottom part of the side wall insulating films 36 is 70 nm.

Figure 7H:
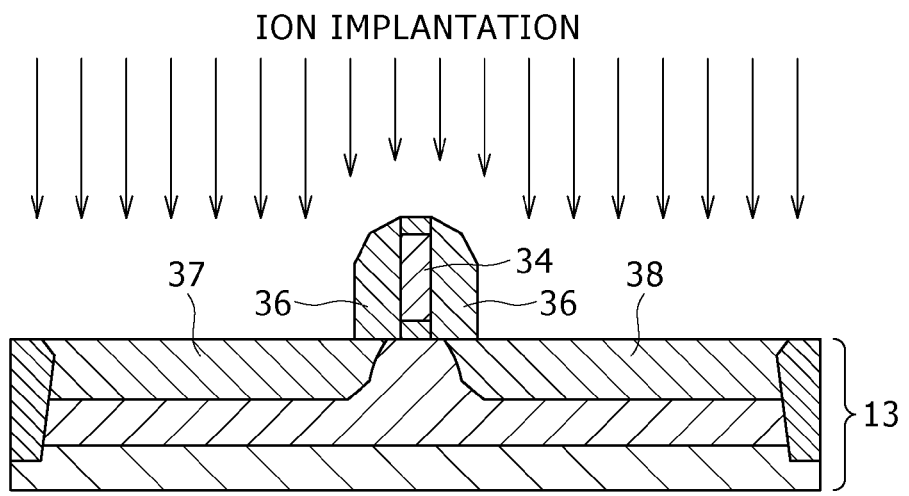

Next, as shown in FIG. 7H, after the active region of the semiconductor substrate 13 is covered with a resist film (not shown), ion implantation is performed with the dummy gate 34 and the side wall insulating films 36 serving as a mask to introduce an impurity into regions 37 and 38 where a source impurity region and a drain impurity region are to be formed. Phosphorus (P), for example, is used as the impurity. A dose in the ion implantation is set at $5×10^{15}/cm^2$, and implantation energy is set at 5 keV, for example.

Figure 7I:
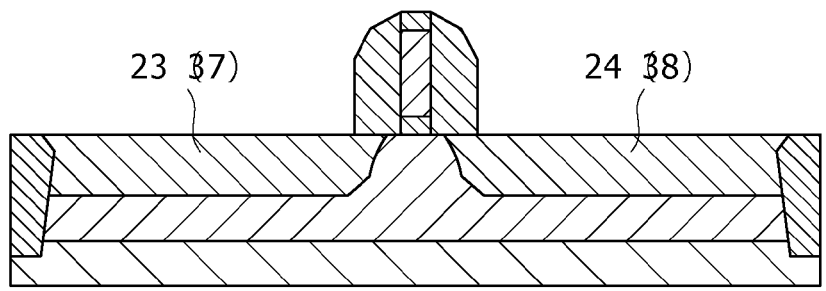

Next, as shown in FIG. 7I, after the resist film is removed, activation annealing is performed on the semiconductor substrate 13 to activate the impurity introduced in the above-described process into the regions 37 and 38 where the source impurity region and the drain impurity region are to be formed. Thereby the source impurity region 23 and the drain impurity region 24 are formed. As this activation annealing, spike annealing with a peak temperature of 1050° C., for example, is performed.

Figure 7J:
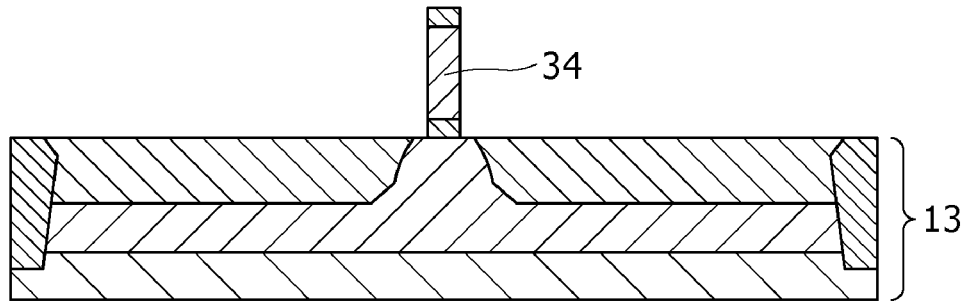

Next, as shown in FIG. 7J, the semiconductor substrate 13 is immersed in a heated phosphoric acid, and the side wall insulating films 36 as the side walls of the dummy gate 34 (see FIG. 7H) and the silicon nitride (SiN) film forming the hard mask layer are removed by etching.

Figure 7K:
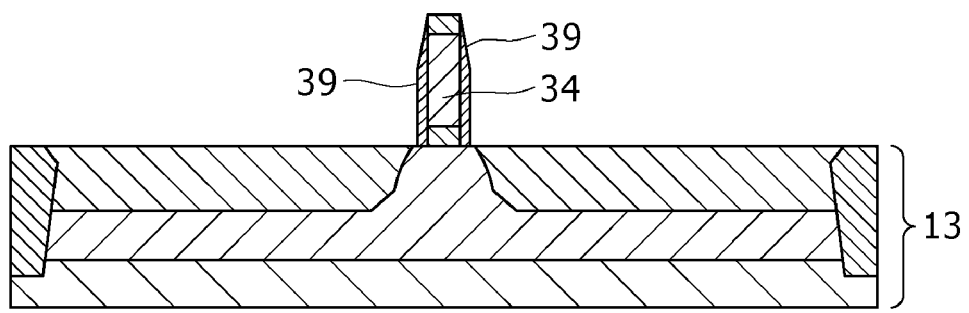

Next, as shown in FIG. 7K, deposition of an insulating film on the semiconductor substrate 13 and etching back is performed by a similar procedure to that described with reference to FIGS. 7F and 7G. Thereby a spacer insulating film 39 is formed on both sides of the dummy gate 34. This spacer insulating film 39 is formed by a silicon nitride (SiN) film, for example.

Figure 7L:
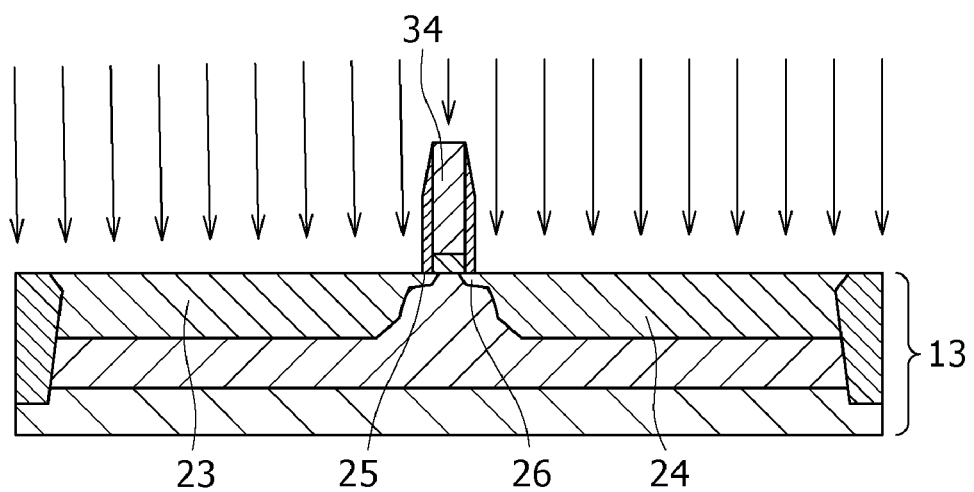

Next, as shown in FIG. 7L, an impurity is introduced into the semiconductor substrate 13 under lower side parts of the gate electrode 34 and the spacer insulating films 39 to form extension regions 25 and 26 continued from the source impurity region 23 and the drain impurity region 24. An ion implantation, for example, can be used for the introduction of the impurity. As an example of conditions for the ion implantation, in the case of the NMOSFET, arsenic (As), for example, is used as the impurity, energy is for example set at 1 keV or lower, and a dose is set at $1×10^{13}$ $cm^{-2}$ or less.

Figure 7M:
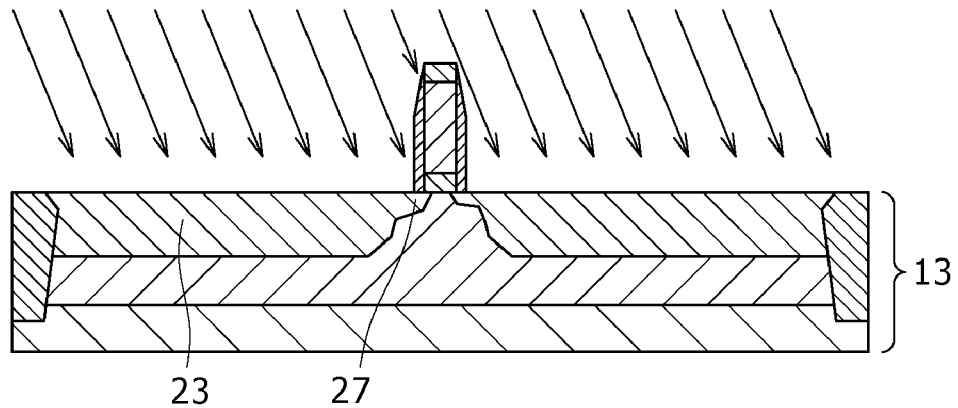

Thereafter, as shown in FIG. 7M, an impurity for forming an overlap region 27 on the side of the source impurity region 23 is introduced into the semiconductor substrate 13. The introduction of the impurity is performed by oblique ion implantation. At this time, the impurity is arsenic (As) in the case of the NMOSFET, and is boron difluoride ($BF_2$) in the case of the PMOSFET. In the case of arsenic (As), as an example, implantation energy is 1 keV or lower, a dose is selected according to the gate length in a range of $1×10^{13}$ $cm^{-2}$ and less, and an ion incidence angle (tilt angle) is for example 4°.

Figure 7N:
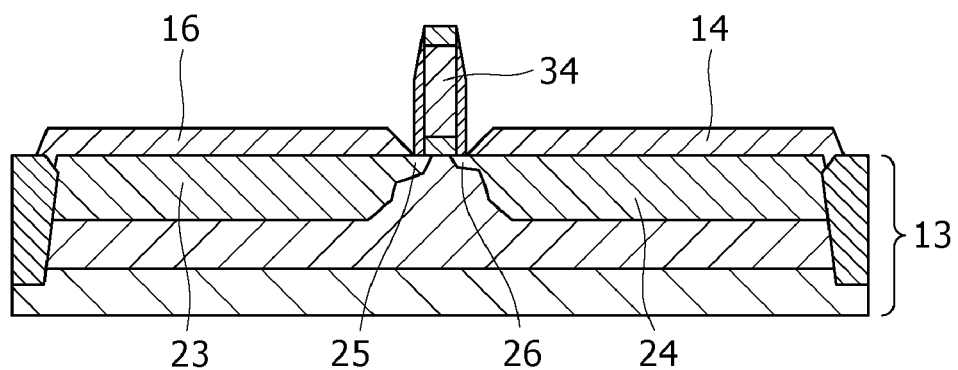

Next, as shown in FIG. 7N, after the surface of the semiconductor substrate 13 is cleaned, semiconductor layers 14 and 16 that become springing parts of the extension regions 25 and 26 and the source impurity region 23 and the drain impurity region 24 are formed on both sides of the dummy gate 34 on the semiconductor substrate 13. The semiconductor layers 14 and 16 are formed by epitaxial growth at a temperature of 800° C. or lower, for example. This epitaxial growth layer is a silicon (Si) single crystal or a mixed crystal of germanium (Ge), carbon (C), or both and silicon (Si). The epitaxial growth layer is selectively grown in a region where the semiconductor substrate 13 is exposed in the active region. The introduction of an impurity into the semiconductor layers 14 and 16 may be performed simultaneously with the epitaxial growth, or may be performed by a doping technique such as ion implantation or the like after the epitaxial growth, or may be performed at both times of the epitaxial growth and the ion implantation.

When the channel conduction type of the MOSFET is a p-type, it is desirable to increase a ratio of germanium (Ge) to silicon (Si) in the epitaxial growth layer forming the semiconductor layers 14 and 16 so that compressive stress is caused in a channel region by giving the epitaxial growth layer a larger lattice constant than the semiconductor substrate 13. Conversely, when the channel conduction type of the MOSFET is an n-type, it is desirable to increase a ratio of carbon (C) to silicon (Si) in the epitaxial growth layer forming the semiconductor layers 14 and 16 so that the epitaxial growth layer has a smaller lattice constant than the semiconductor substrate 13.

Figure 7O:
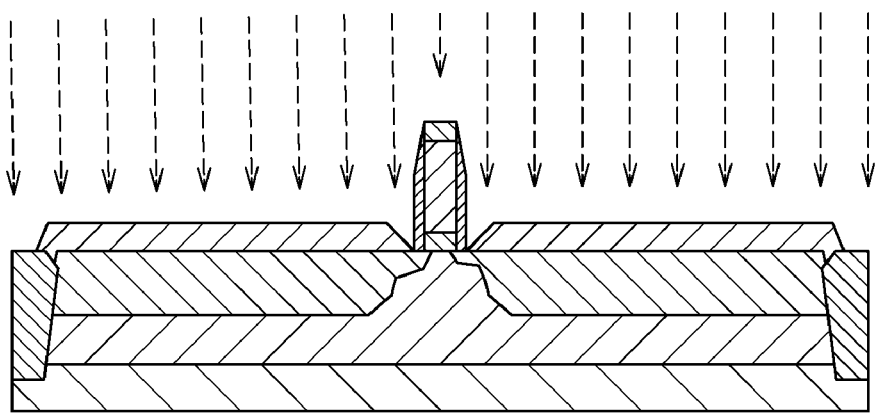

Next, as shown in FIG. 7O, annealing is performed to activate the impurities introduced in the processes represented in FIGS. 7L to 7N. This annealing is performed by using flash lamp annealing that does not easily cause impurity diffusion or a rapid heating annealing technique such as laser annealing or the like.

Figure 7P:
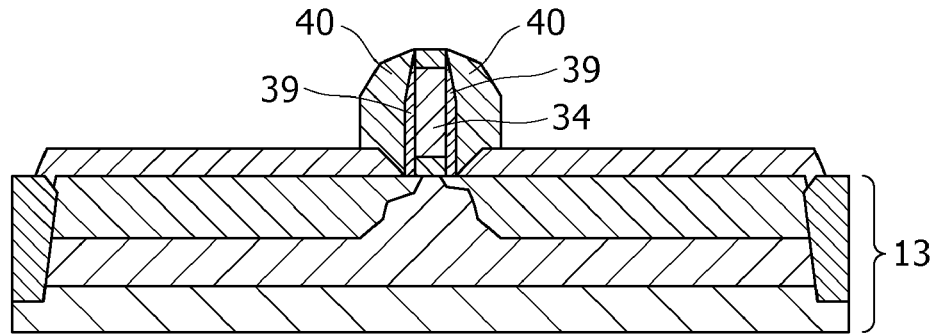
Figure 7Q:
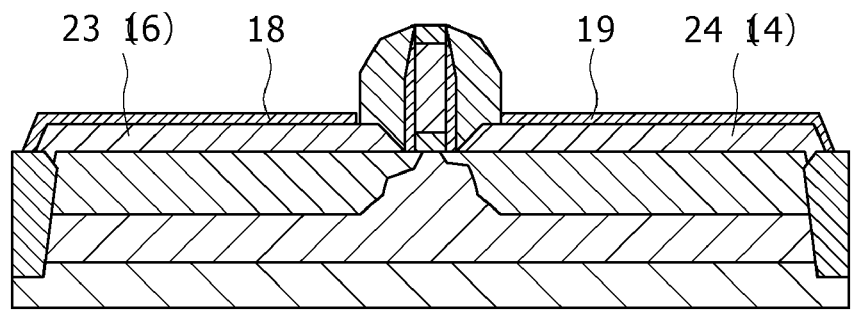
Figure 7R:
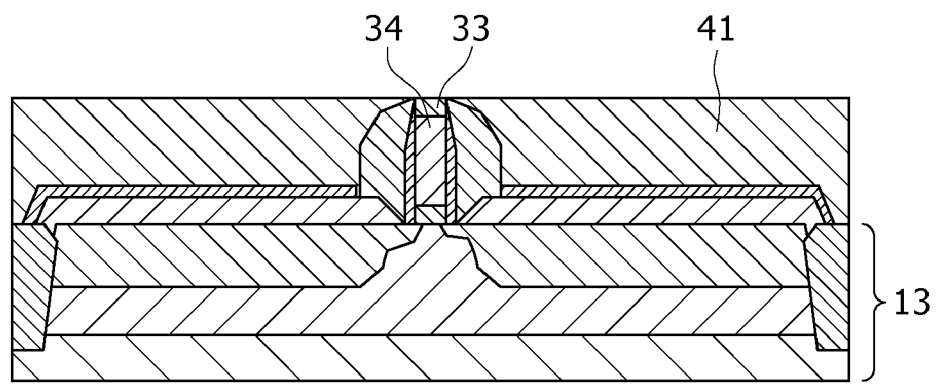
Figure 7S:
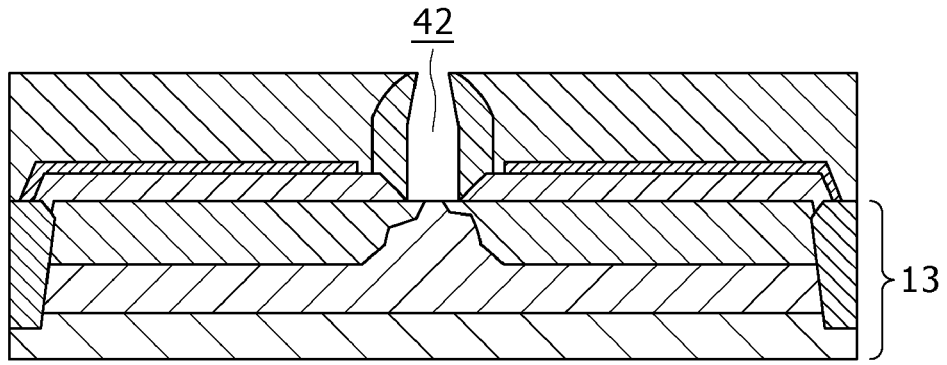
Figure 7T:
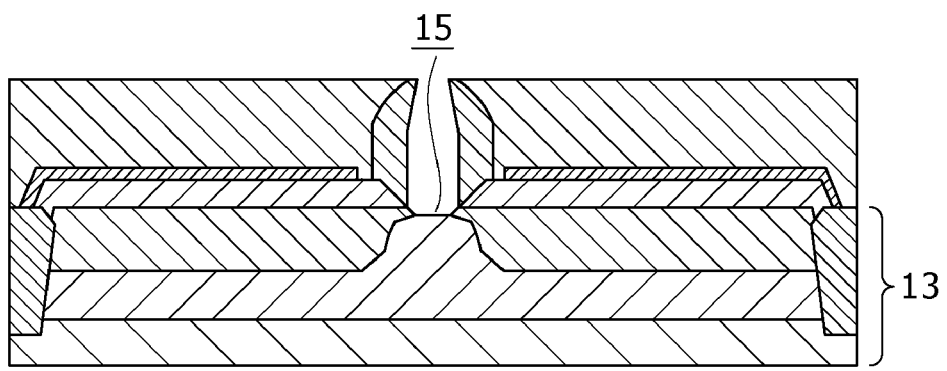
Figure 7U:
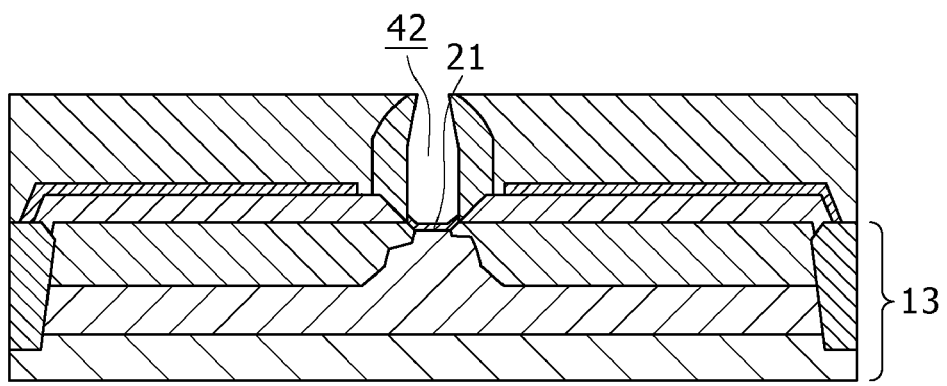
Figure 7V:
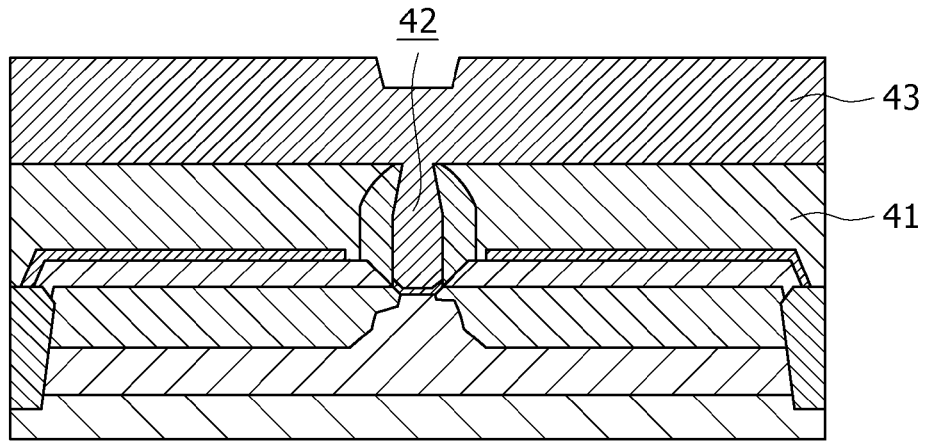

The profiles of the impurities introduced in the processes represented in FIGS. 7L to 7N and conditions for the annealing in the process represented in FIG. 7O are set such that a gate corner part on a drain side formed in a subsequent process in FIG. 7V is situated in a depletion layer between the semiconductor substrate 13 and the extension region 26 in a zero bias state and a gate corner part on a source side is situated on an extension region side rather than in a depletion layer between the semiconductor substrate 13 and the extension region 25. Thus, allowing for diffusion in a subsequent heat treatment process, a procedure may be carried out in which a first part is grown to a few nm without doping, and a subsequent part is grown while high-concentration doping is performed.

Alternatively, growth may be started first at a slightly higher concentration than the semiconductor substrate 13, and subsequently growth may be continued at a high concentration, so that a series resistance of the whole of the extension regions 25 and 26 is reduced, and simultaneously a PN junction face is formed at a position deeper than an original position of the surface of the semiconductor substrate 13 and the gate corner part on the drain side is situated in the depletion layer in the zero bias state.

In a range in which the above-described impurity introduction profiles are obtained, the processes represented in FIGS. 7K, 7L, 7M, 7N and 7O do not necessarily need to be performed in this order, but can be interchanged with each other or repeated. In addition, when conditions for the process represented in FIG. 7N can be selected such that an appropriate junction depth is obtained in the extension region 26 on the drain side with only the impurity introduced in the process represented in FIG. 7N, the process represented in FIG. 7L can be omitted. Further, in order to prevent abnormal diffusion of the impurities introduced in the process represented in FIG. 7L or the process represented in FIG. 7M or degradation in crystallinity of the epitaxial growth layer in the process represented in FIG. 7N, heat treatment for defect recovery may be performed for a short time in a range of 700° C. to 900° C. immediately after the process represented in FIG. 7L or the process represented in FIG. 7M.

Next, as shown in FIG. 7P, after an insulating film (not shown) is deposited on the semiconductor substrate 13, the insulating film is etched back by reactive ion etching to form side wall insulating layers 40 on both sides of the dummy gate 34 with the spacer insulating films 39 interposed between the side wall insulating layers 40 and the dummy gate 34. The insulating film is for example a silicon oxide ($SiO_2$) film formed by a thermal CVD method using TEOS as a material gas. The film thickness of the insulating film is selected to be between 10 nm and 60 nm, for example, in consideration of gate side wall capacitance.

Next, as shown in FIG. 7Q, silicide layers 18 and 19 are formed on the source impurity region 23 (semiconductor layer 16) and the drain impurity region 24 (semiconductor layer 14).

Next, as shown in FIG. 7R, after a thick interlayer insulating film 41 is deposited on the semiconductor substrate 13 in such a manner as to cover the dummy gate 34, the surface of the interlayer insulating film 41 is subjected to planarization etching by chemical mechanical polishing (CMP) so that the hard mask layer 33 of the dummy gate 34 is exposed. The interlayer insulating film 41 is a silicon oxide ($SiO_2$) film formed by a plasma CVD method, for example.

Next, as shown in FIG. 7S, the gate sacrificial layer 32, the dummy gate insulating film 31, and the spacer insulating films 39 (see FIGS. 7E, 7K and the like) are removed by etching, whereby a gate opening part 42 is formed, and the surface of the semiconductor substrate 13 is exposed inside the gate opening part 42. The etching of the gate sacrificial layer 32 is performed using an etchant including a hydrofluoric acid. The etching of the spacer insulating film 39 is performed with an alkaline solution of TMAH (tetramethylammonium hydroxide) and the like. The etching of the oxide film 31 is performed by wet etching or a combination of chemical dry etching with a fluorocarbon ($CF_4$) and oxygen ($O_2$) and wet etching.

Next, as shown in FIG. 7T, the surface of the semiconductor substrate 13 exposed by removing the dummy gate insulating film is etched to form a recess shape (concave part) 15. The depth of the concave part 15 is 1 to 3 nm, for example. This etching is performed by immersing the semiconductor substrate 13 in an etchant including a hydrofluoric acid for a predetermined time, or performed by subjecting the surface of the semiconductor substrate 13 to plasma oxidation or very shallow oxidation with ozone water and thereafter removing an oxide film in the surface with an etchant including a hydrofluoric acid.

Next, as shown in FIG. 7U, a gate insulating film 21 is formed on the exposed surface of the semiconductor substrate 13 in the gate opening part 42. As the gate insulating film 21, a silicon oxide ($SiO_2$) film formed by thermal oxidation, a silicon oxynitride (SiON) film formed by further subjecting the silicon oxide ($SiO_2$) film to plasma nitridation, a hafnium oxide ($HfO_2$) film formed by an atomic layer deposition (ALD) method, or the like can be used.

Next, as shown in FIG. 7V, a gate formation film 43 is formed on the surface of the interlayer insulating film 41 in such a manner as to fill the inside of the gate opening part 42. The gate formation film 43 is for example formed by making a copper (Cu) seed layer by a PVD method and performing subsequent copper (Cu) electroless plating.

Figure 7W:
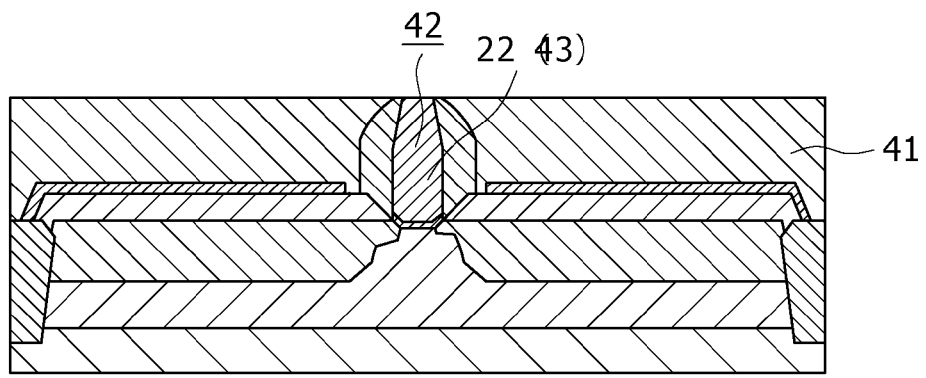

Next, as shown in FIG. 7W, the excess gate formation film 43 on the surface of the interlayer insulating film 41 is removed by the CMP method, for example, and the gate formation film 43 inside the gate opening part 42 is left to form a gate electrode 22.

Figure 7X:
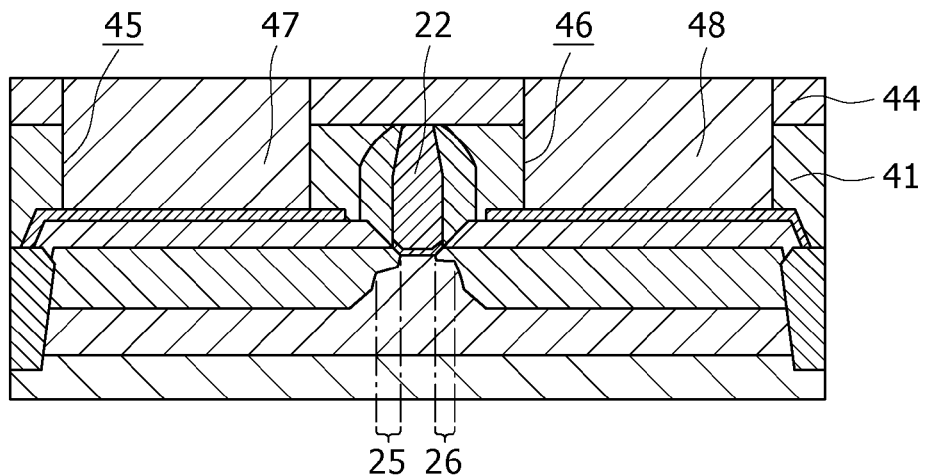

Next, as shown in FIG. 7X, after an interlayer insulating film 44 is further formed on the interlayer insulating film 41, connection holes 45 and 46 are formed in the interlayer insulating films 41 and 44 by lithography technology for forming an ordinary resist mask for forming the connection holes and etching technology (for example reactive ion etching), and thereafter the resist mask is removed. Then, a conductive material is filled into the connection holes 45 and 46 to form electric connection parts 47 and 48 for electric connection with upper layer wiring (not shown).

Incidentally, in the embodiment of the present invention, the extension regions 25 and 26 of the source impurity region 23 and the drain impurity region 24 are impurity regions formed below the gate electrode 22. The extension region 25 on the source side includes the overlap region 27.

Thus, principal parts of the MOSFET according to one embodiment of the present invention are completed. FIG. 8 shows an example of an impurity distribution after completion of the process described with reference to FIG. 7X. FIG. 9 shows an electron concentration distribution in the impurity concentration distribution.

As shown in FIG. 8, thick lines indicate a metallurgical junction position, and a part on a left side in the figure is the overlap region 27 provided on only the source side. Because of this overlap region 27, the impurity concentration of a corner part on the left side in the figure of the gate electrode 22 is higher than that of a corner part on the right side in the figure of the gate electrode 22. As shown in FIG. 9, thick lines indicate a metallurgical junction position, and with gate-to-source voltage $V_{GS}$=drain-to-source voltage $V_{DS}$=0 V, that is, in a zero bias state, a corner part on the left side in the figure of the gate electrode 22 is surrounded by highly concentrated electrons, and a corner part on the right side in the figure of the gate electrode 22 is depleted.

In the above-described manufacturing method, the principal surface of the semiconductor substrate 13 is used as the first semiconductor face 11. However, an SOI (Silicon On Insulator) substrate, for example, may be used. In this case, the first semiconductor face 11 is the surface of a semiconductor layer formed on an insulating layer on the substrate, and the first semiconductor face 11 is formed by a plane substantially parallel with the principal surface of the substrate. In addition, the second semiconductor face 12 may be a surface formed by performing a removing process, for example an etching process on the springing part of the semiconductor substrate 13 or the semiconductor layers 14 and 16. Further, the first semiconductor face 11 and the second semiconductor face 12 may be a surface formed by performing a removing process, for example an etching process on the semiconductor substrate 13.

An example of modification of the above-described manufacturing method will next be described below with reference to manufacturing process sectional views of FIGS. 10A to 10M.

Figure 10A:
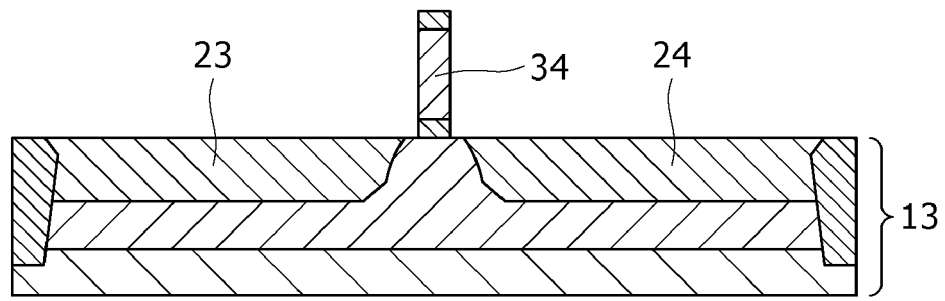
FIGS. 10A to 10M are manufacturing process sectional views representing an embodiment of a method of manufacturing a semiconductor device according to an embodiment of the present invention (example of modification)

In the present example of modification, the processes described with reference to FIGS. 7A to 7J are performed, so that a source impurity region 23, a drain impurity region 24, a dummy gate 34 and the like are formed in and on a semiconductor substrate 13, as shown in FIG. 10A.

Figure 10B:
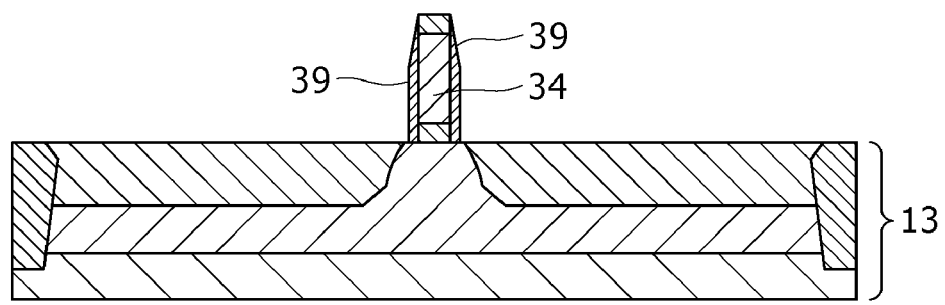

Next, by performing the process described with reference to FIG. 7K, as shown in FIG. 10B, deposition of an insulating film on the semiconductor substrate 13 and the etching back of the insulating film is performed to form a spacer insulating film 39 on both sides of the dummy gate 34. This spacer insulating film 39 is formed by a silicon nitride (SiN) film, for example.

Figure 10C:
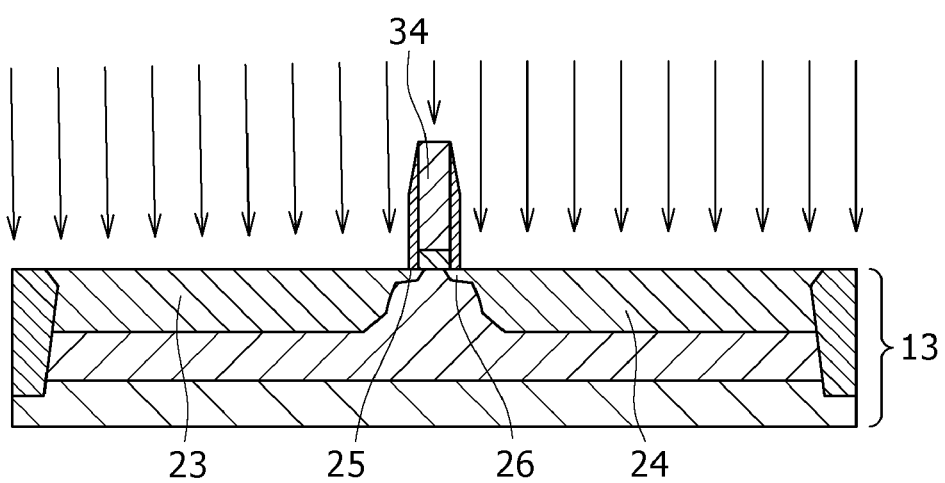

Next, by performing the process described with reference to FIG. 7L, as shown in FIG. 10C, an impurity is introduced into the semiconductor substrate 13 under lower side parts of the gate electrode 34 and the spacer insulating films 39 to form extension regions 25 and 26 continued from the source impurity region 23 and the drain impurity region 24. An ion implantation, for example, can be used for the introduction of the impurity. As an example of conditions for the ion implantation, in the case of the NMOSFET, arsenic (As), for example, is used as the impurity, energy is for example set at 1 keV or lower, and a dose is set at $1 \times 10^{13}$ cm$^{-2}$ or less.

Figure 10D:
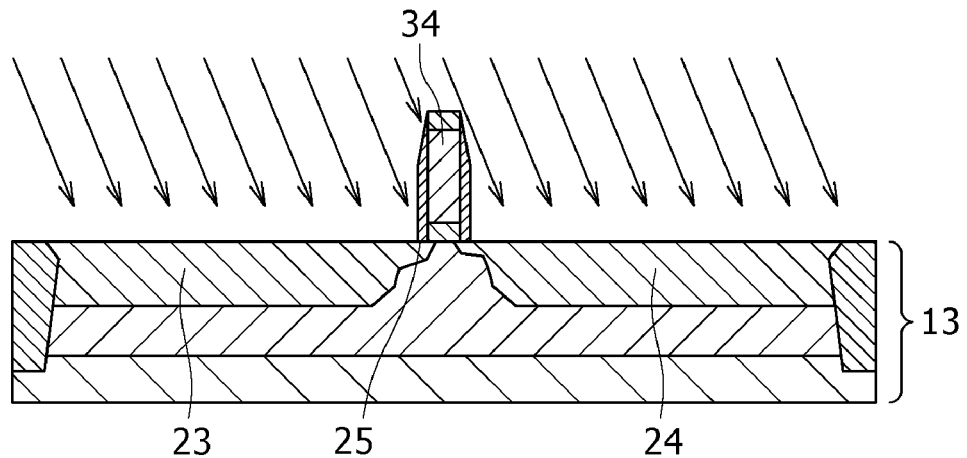

Next, by performing the process described with reference to FIG. 7M, as shown in FIG. 10D, an impurity for forming an overlap region 27 on the side of the source impurity region 23 is introduced into the semiconductor substrate 13. The introduction of the impurity is performed by oblique ion implantation. At this time, the impurity is arsenic (As) in the case of the NMOSFET, and is boron difluoride ($BF_2$) in the case of the PMOSFET. In the case of arsenic (As), as an example, implantation energy is 1 keV or lower, a dose is selected according to the gate length in a range of $1\times10^{13}$ cm$^{-2}$ and less, and an ion incidence angle (tilt angle) is for example 4°.

Figure 10E:
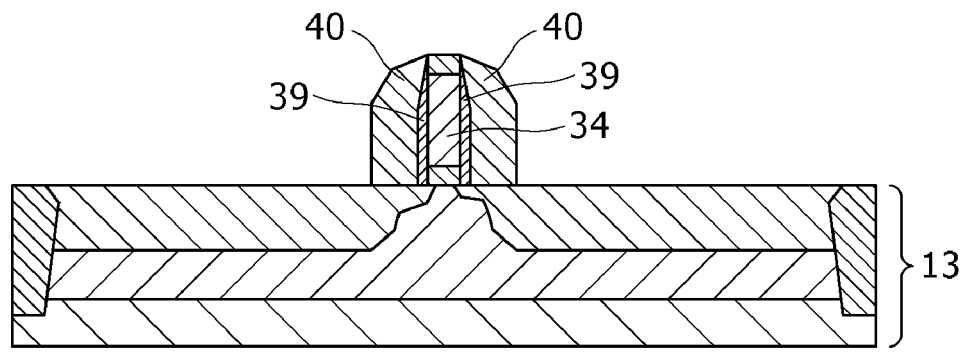

Next, as in the process described with reference to FIG. 7P, as shown in FIG. 10E, after an insulating film (not shown) is deposited on the semiconductor substrate 13, the insulating film is etched back by reactive ion etching to form side wall insulating layers 40 on both sides of the dummy gate 34 with the spacer insulating films 39 interposed between the side wall insulating layers 40 and the dummy gate 34. The insulating film is for example a silicon oxide ($SiO_2$) film formed by a thermal CVD method using TEOS as a material gas. The film thickness of the insulating film is selected to be between 10 nm and 60 nm, for example, in consideration of gate side wall capacitance.

Figure 10F:
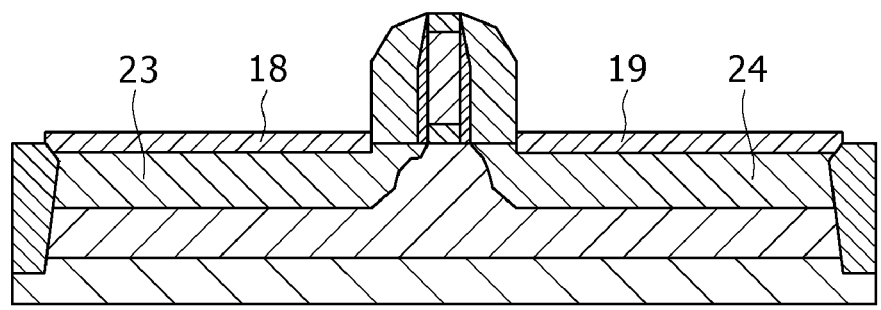

Next, as in the process described with reference to FIG. 7Q, as shown in FIG. 10F, silicide layers 18 and 19 are formed on the source impurity region 23 and the drain impurity region 24.

Figure 10G:
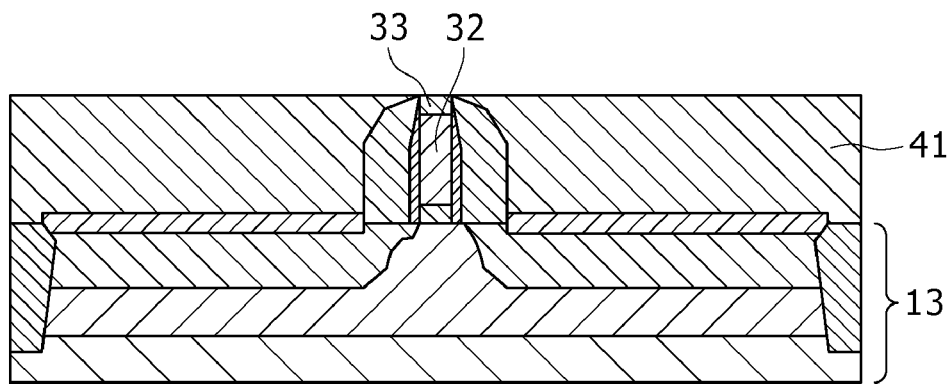

Next, as in the process described with reference to FIG. 7R, as shown in FIG. 10G, after a thick interlayer insulating film 41 is deposited on the semiconductor substrate 13 in such a manner as to cover the dummy gate 34 and the like, the surface of the interlayer insulating film 41 is subjected to planarization etching by chemical mechanical polishing (CMP) so that the hard mask layer 33 of the dummy gate 34 is exposed. The interlayer insulating film 41 is a silicon oxide ($SiO_2$) film formed by a plasma CVD method, for example.

Figure 10H:
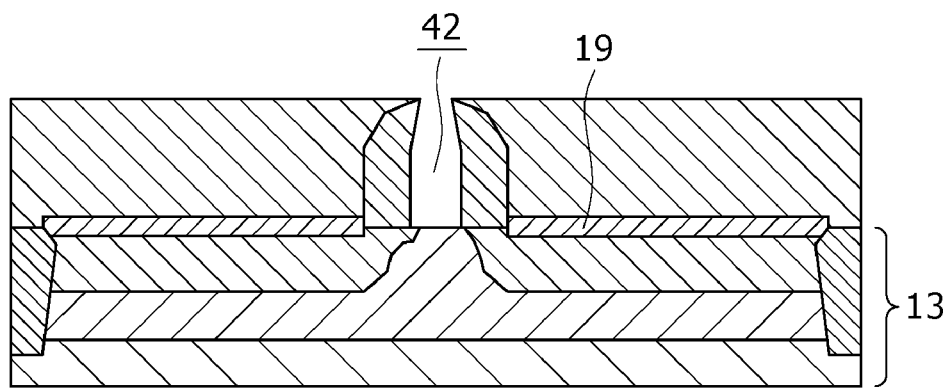

Next, as in the process described with reference to FIG. 7S, as shown in FIG. 10H, a gate sacrificial layer 32, a dummy gate insulating film 31, and the spacer insulating films 39 (see FIGS. 7E, 7K and the like) are removed by etching, whereby a gate opening part 42 is formed, and the surface of the semiconductor substrate 13 is exposed inside the gate opening part 42. The etching of the gate sacrificial layer 32 is performed using an etchant including a hydrofluoric acid. The etching of the spacer insulating film 39 is performed with an alkaline solution of TMAH (tetramethylammonium hydroxide) and the like. The etching of the oxide film 31 is performed by wet etching or a combination of chemical dry etching with a fluorocarbon ($CF_4$) and oxygen ($O_2$) and wet etching.

Figure 10I:
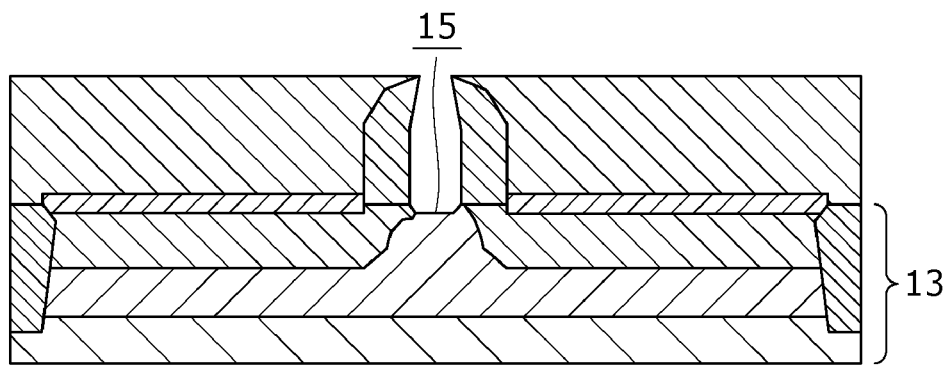

Next, as in the process described with reference to FIG. 7T, as shown in FIG. 10I, the surface of the semiconductor substrate 13 exposed by removing the dummy gate insulating film is etched to form a recess shape (concave part) 15. The depth of the concave part 15 is 1 to 3 nm, for example. This etching is performed by immersing the semiconductor substrate 13 in an etchant including a hydrofluoric acid for a predetermined time, or performed by subjecting the surface of the semiconductor substrate 13 to plasma oxidation or very shallow oxidation with ozone water and thereafter removing an oxide film in the surface with an etchant including a hydrofluoric acid.

Figure 10J:
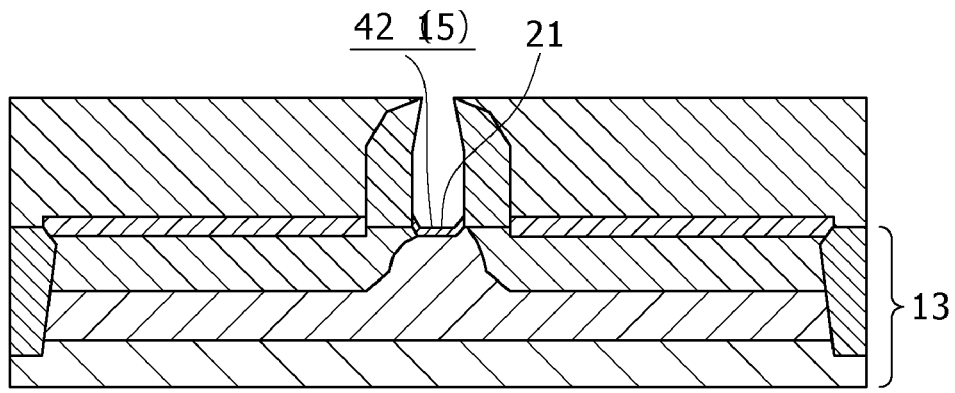

Next, as in the process described with reference to FIG. 7U, as shown in FIG. 10J, a gate insulating film 21 is formed on the exposed surface of the semiconductor substrate 13 in the gate opening part 42 (recess shape (concave part) 15). As the gate insulating film 21, a silicon oxide ($SiO_2$) film formed by thermal oxidation, a silicon oxynitride (SiON) film formed by further subjecting the silicon oxide ($SiO_2$) film to plasma nitridation, a hafnium oxide ($HfO_2$) film formed by an atomic layer deposition (ALD) method, or the like can be used.

Figure 10K:
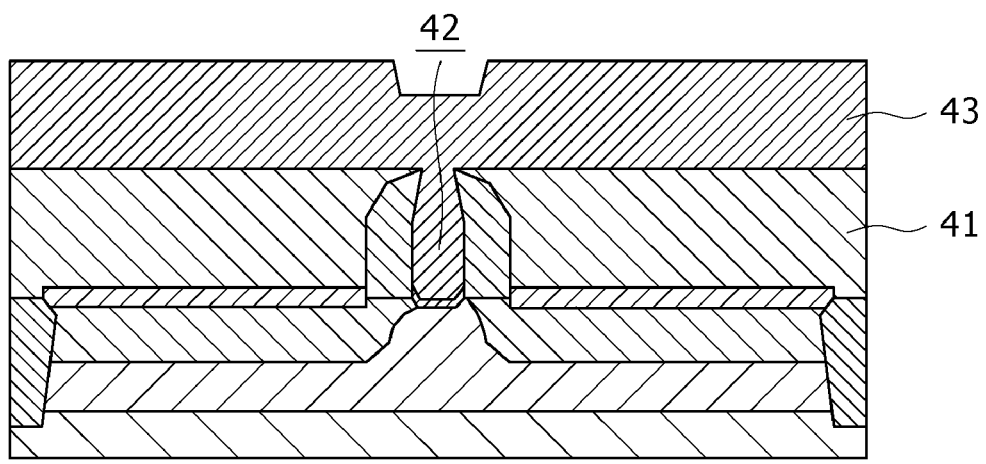

Next, as in the process described with reference to FIG. 7V, as shown in FIG. 10K, a gate formation film 43 is formed on the surface of the interlayer insulating film 41 in such a manner as to fill the inside of the gate opening part 42. The gate formation film 43 is for example formed by making a copper (Cu) seed layer by a PVD method and performing subsequent copper (Cu) electroless plating.

Figure 10L:
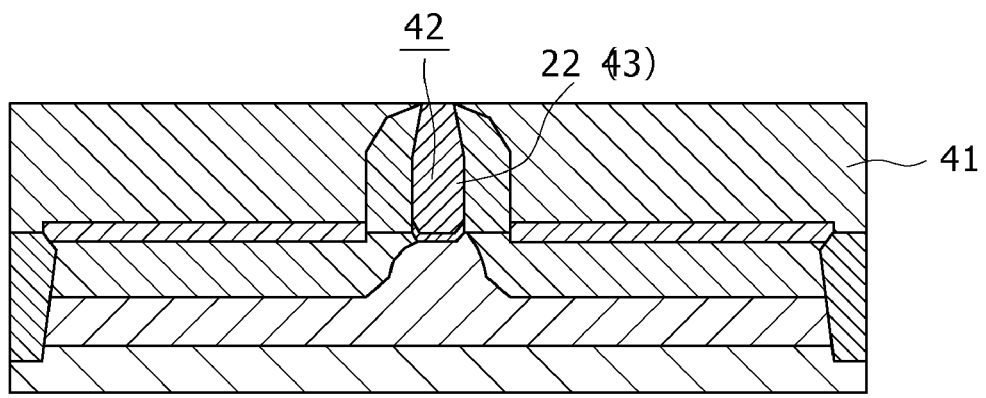

Next, as in the process described with reference to FIG. 7W, as shown in FIG. 10L, the excess gate formation film 43 on the surface of the interlayer insulating film 41 is removed by the CMP method, for example, and the gate formation film 43 inside the gate opening part 42 is left to form a gate electrode 22.

Figure 10M:
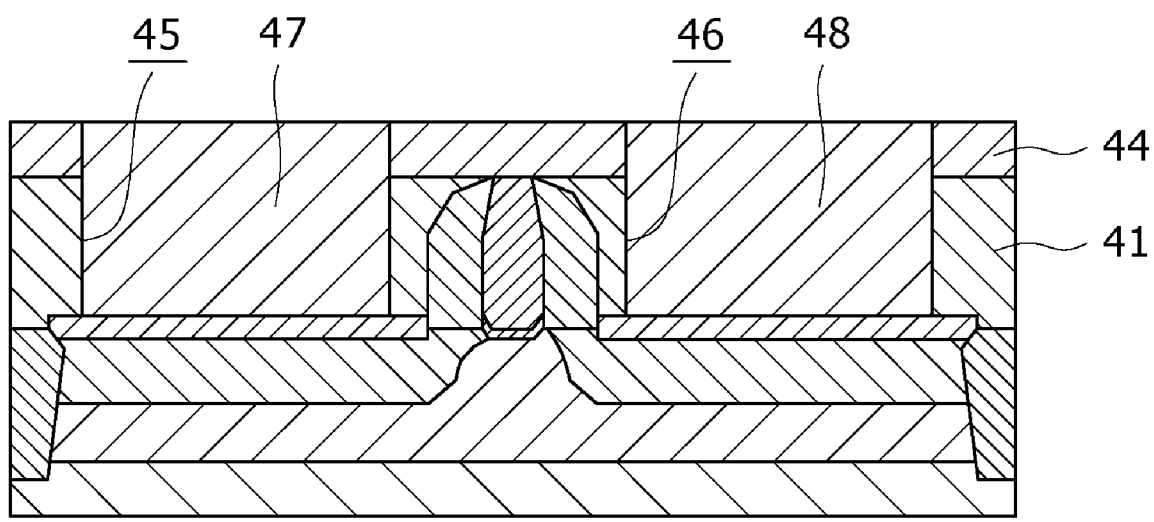

Next, as in the process described with reference to FIG. 7X, as shown in FIG. 10M, after an interlayer insulating film 44 is further formed on the interlayer insulating film 41, connection holes 45 and 46 are formed in the interlayer insulating films 41 and 44 by lithography technology for forming an ordinary resist mask for forming the connection holes and etching technology (for example reactive ion etching), and thereafter the resist mask is removed. Then, a conductive material is filled into the connection holes 45 and 46 to form electric connection parts 47 and 48 for electric connection with upper layer wiring (not shown).

In the above-described example of modification, the semiconductor layers 14 and 16 made of an epitaxial growth layer are not formed, and thus conductive layers directly under the side wall insulating layers 40 formed by the manufacturing method described with reference to FIGS. 7A to 7X are correspondingly reduced in thickness. The extension region 25 on the source side is formed by the impurities introduced in the processes represented in FIGS. 10C and 10D, and the extension region on the drain side is formed by the impurity introduced in the process represented in FIG. 10C. Therefore, the series resistance of the extension regions 25 and 26 on both the source side and the drain side is slightly increased. However, the number of processes is reduced, and thus effects of the present invention are obtained at correspondingly lower manufacturing cost.

Effects of the present invention in the thus fabricated MOSFET will next be described using simulation results shown in FIGS. 11 to 24.

Figure 11A:
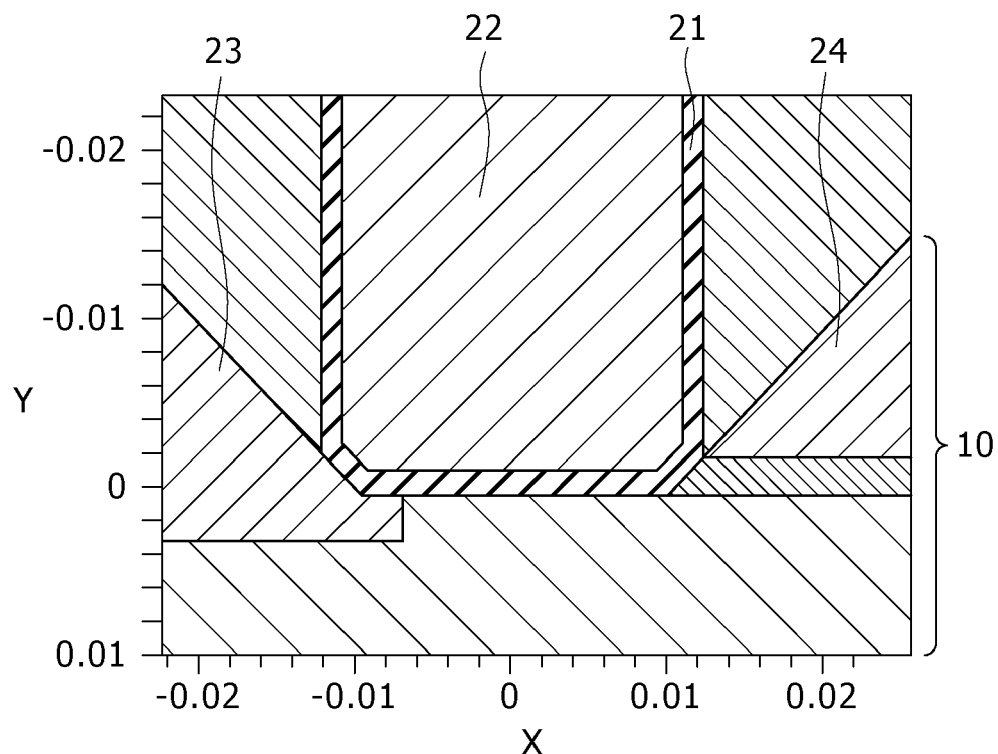
FIGS. 11A and 11B are schematic constitution sectional views of simulation structures of MOSFETs of an asymmetric structure according to an embodiment of the present invention and an existing symmetric structure.

A MOS structure shown in FIG. 11A is a simulation structure of a MOSFET of an asymmetric structure according to an embodiment of the present invention which MOSFET is used to confirm effects of the present invention. Specifically, a source impurity region 23 is formed in a semiconductor region 10 in such a manner as to overlap a gate electrode 22 within a first semiconductor face 11 with a gate insulating film 21 interposed between the source impurity region 23 and the gate electrode 22. Further, a drain impurity region 24 is formed in the semiconductor region 10 directly under a second semiconductor face 12. Thus, the source impurity region 23 and the drain impurity region 24 are formed asymmetrically with respect to the gate electrode 22. This structure will hereinafter be referred to as a present invention structure.

Figure 11B:
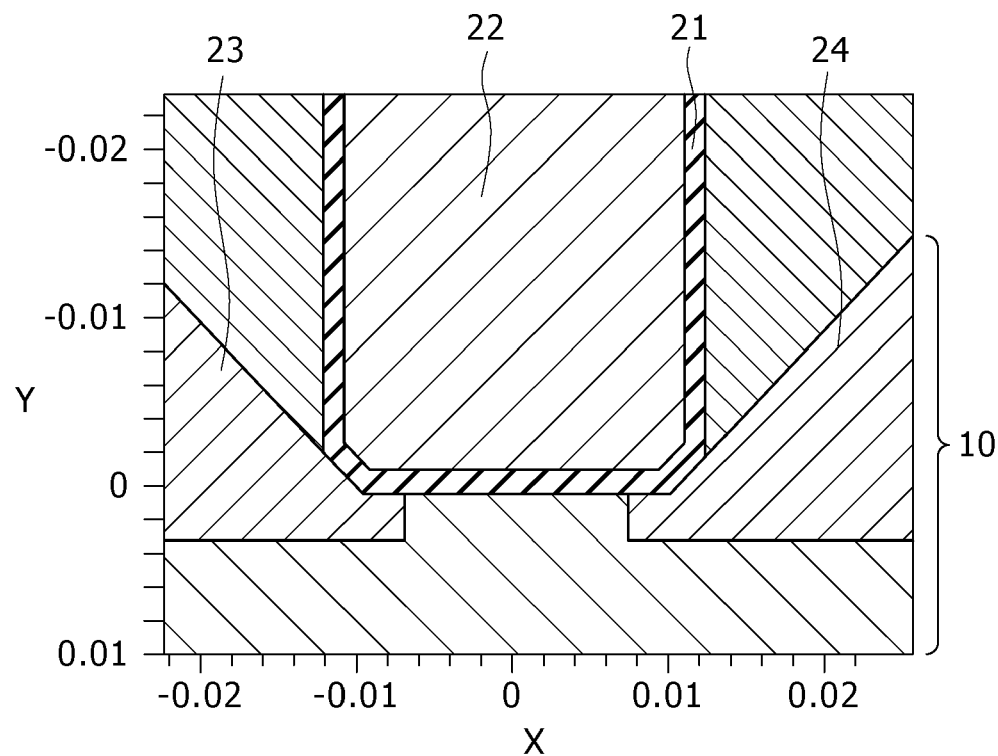

A MOS structure shown in FIG. 11B is a simulation structure of a MOSFET of an existing symmetric structure. Specifically, a source impurity region 23 and a drain impurity region 24 formed in a semiconductor region 10 are formed symmetrically with respect to a gate electrode 22. This structure will hereinafter be referred to as an existing structure.

Figure 23:
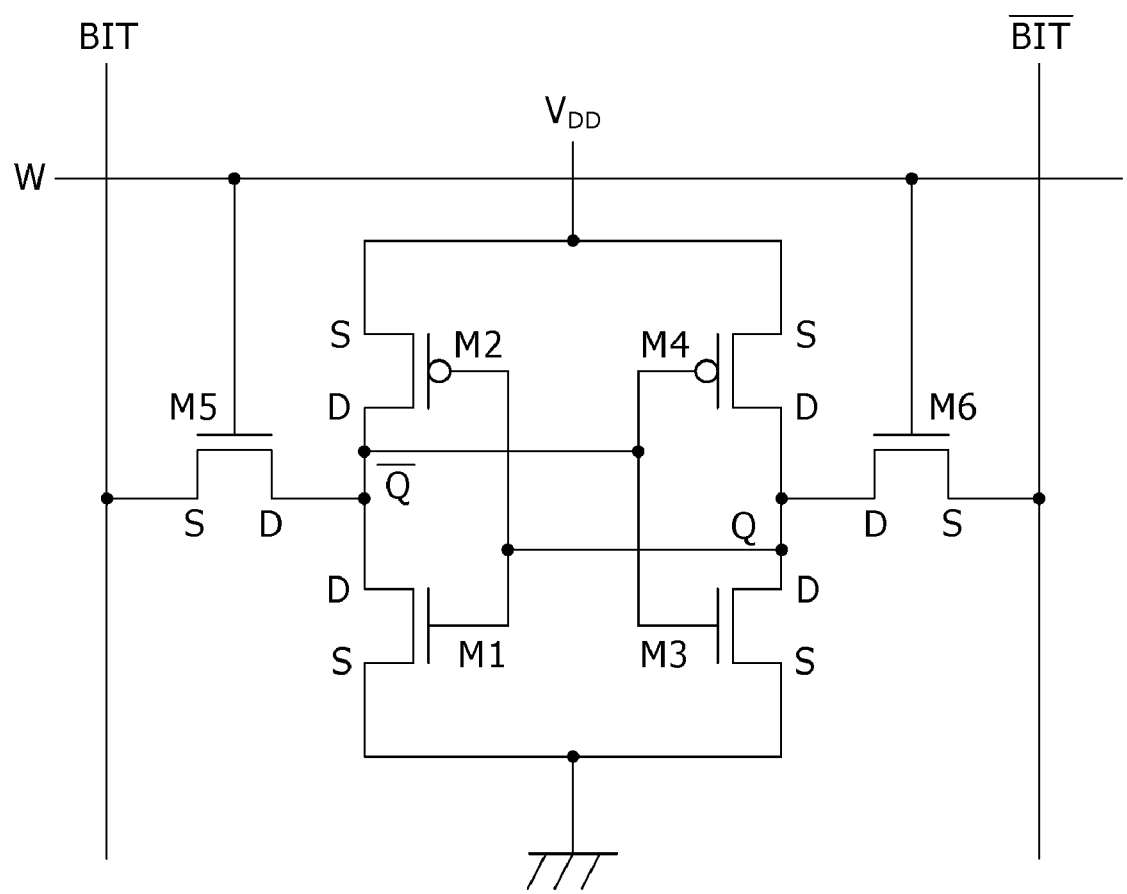
FIG. 23 is a circuit diagram showing an embodiment (sixth embodiment) of a semiconductor device according to an embodiment of the present invention.

FIG. 23 shows only sections of principal parts of the MOSFETs with the gate thereof at a center. Other structure parameters not shown in FIG. 23 are listed in Table 1. The parameters listed in Table 1 are a result of optimization of each structure with on current and roll-off characteristics of threshold voltage.

TABLE 1

| | SUBSTRATE | |
|---|---|---|
| $2 \times 10^{18}/cm^3$ | DENSITY | $2 \times 10^{18}/cm^3$ |
| | GATE INSULATING FILM | |
| 1 nm | PHYSICAL FILM THICKNESS | 1 nm |
| 3.9 | PERMISSIBLE VALUE | 3.9 |
| | GATE ELECTRODE | |
| 20 nm | GATE LENGTH | 20 nm |
| 3 nm | AMOUNT OF EXTENSION OVERLAP | 3 nm |
| | EXTENSION | |
| $8 \times 10^{19}/cm^3$ | DENSITY | $4 \times 10^{19}/cm^3$ |
| 3 nm | SOURCE SIDE JUNCTION DEPTH | 3 nm |
| −2 nm | DRAIN SIDE JUNCTION DEPTH | 3 nm |
| 40 nm | EPITAXIAL LAYER THICKNESS | 40 nm |
| | GATE SIDE WALLS | |
| SiN($\epsilon_r$ = 7.5) | MATERIAL | SiN($\epsilon_r$ = 7.5) |
| 40 nm | THICKNESS | 40 nm |
| | SOURCE AND DRAIN DEPTH | |
| 0 nm | EPITAXIAL LAYER THICKNESS | 0 nm |
| NONE | PN JUNCTION DEPTH | NONE |
| | ELECTRICAL CHARACTERISTICS | |
| MAXIMUM | ON CURRENT ION | MAXIMUM |
| 89 mV/decade | SUBTHRESHOLD S | 91 mV/decade |

Figure 24:
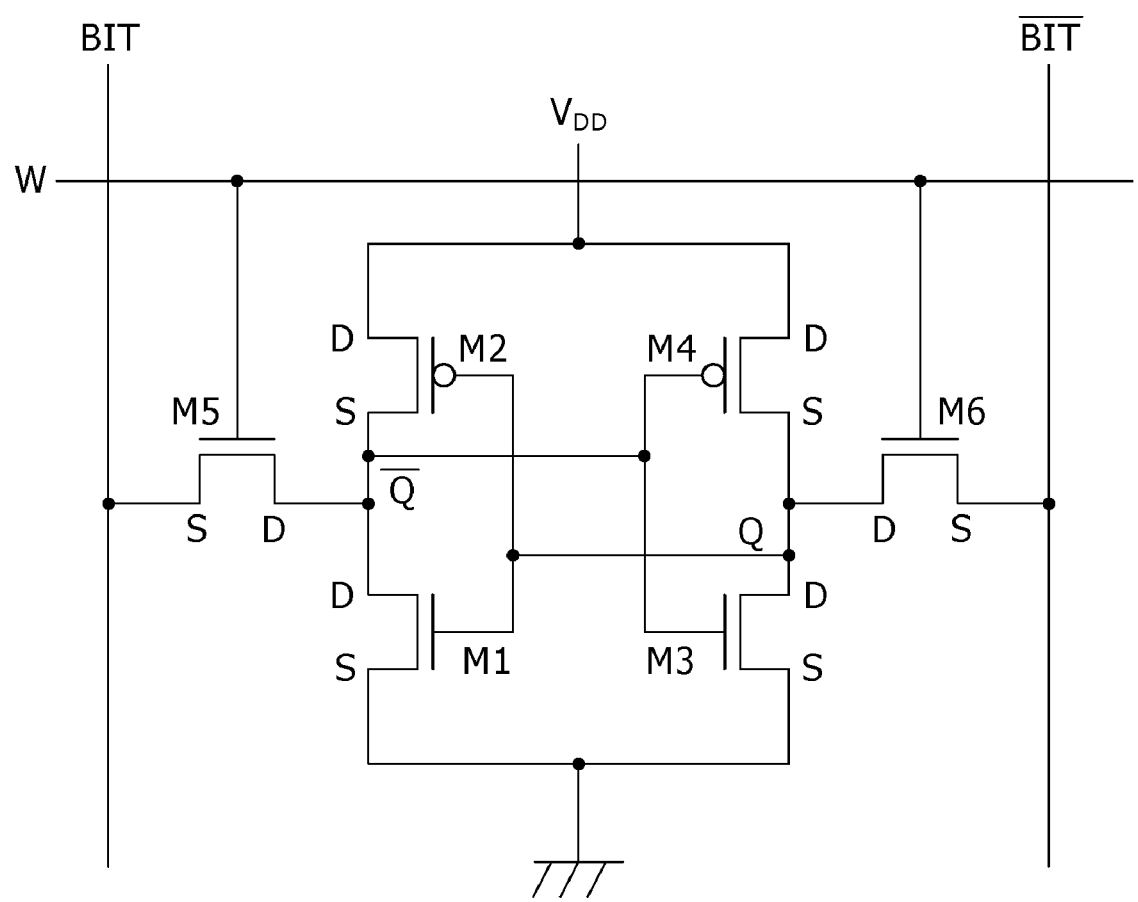
FIG. 24 is a circuit diagram showing an embodiment (seventh embodiment) of a semiconductor device according to an embodiment of the present invention.
Figure 25:
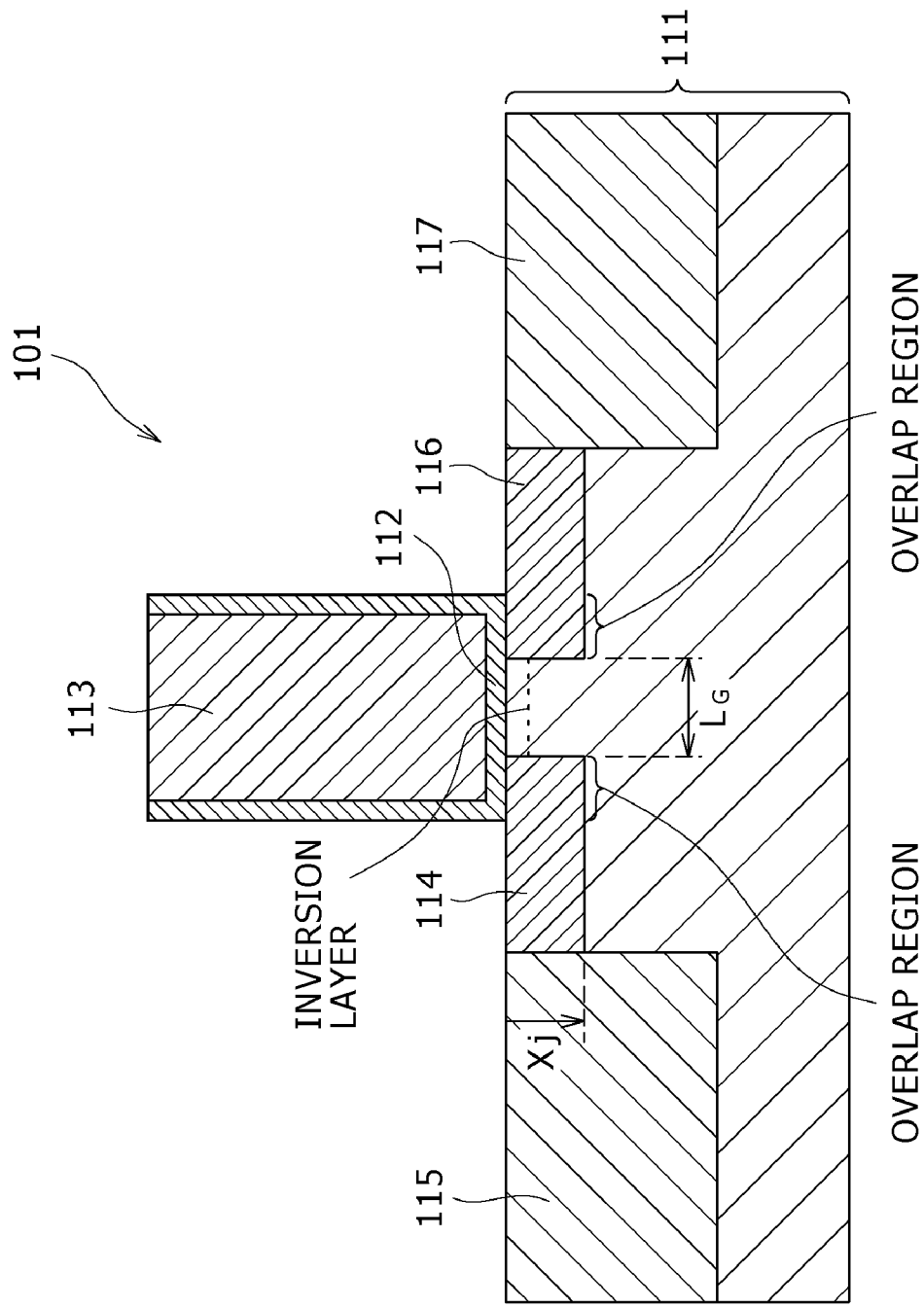
FIG. 25 is a schematic constitution sectional view of a sectional structure of an existing planar type MOSFET.
Figure 26:
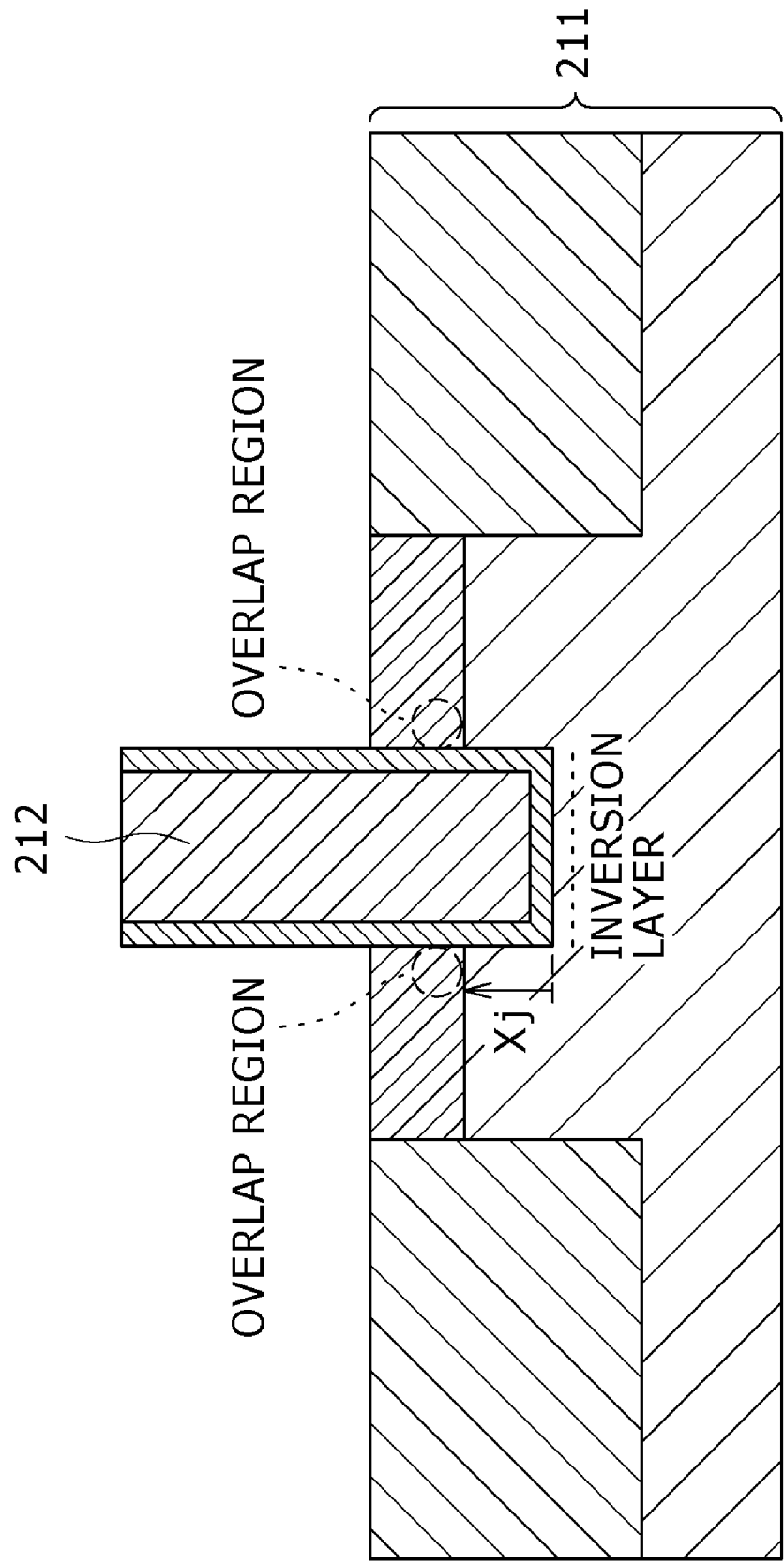
FIG. 26 is a schematic constitution sectional view of a sectional structure of an existing recess gate type MOSFET.
Figure 27:
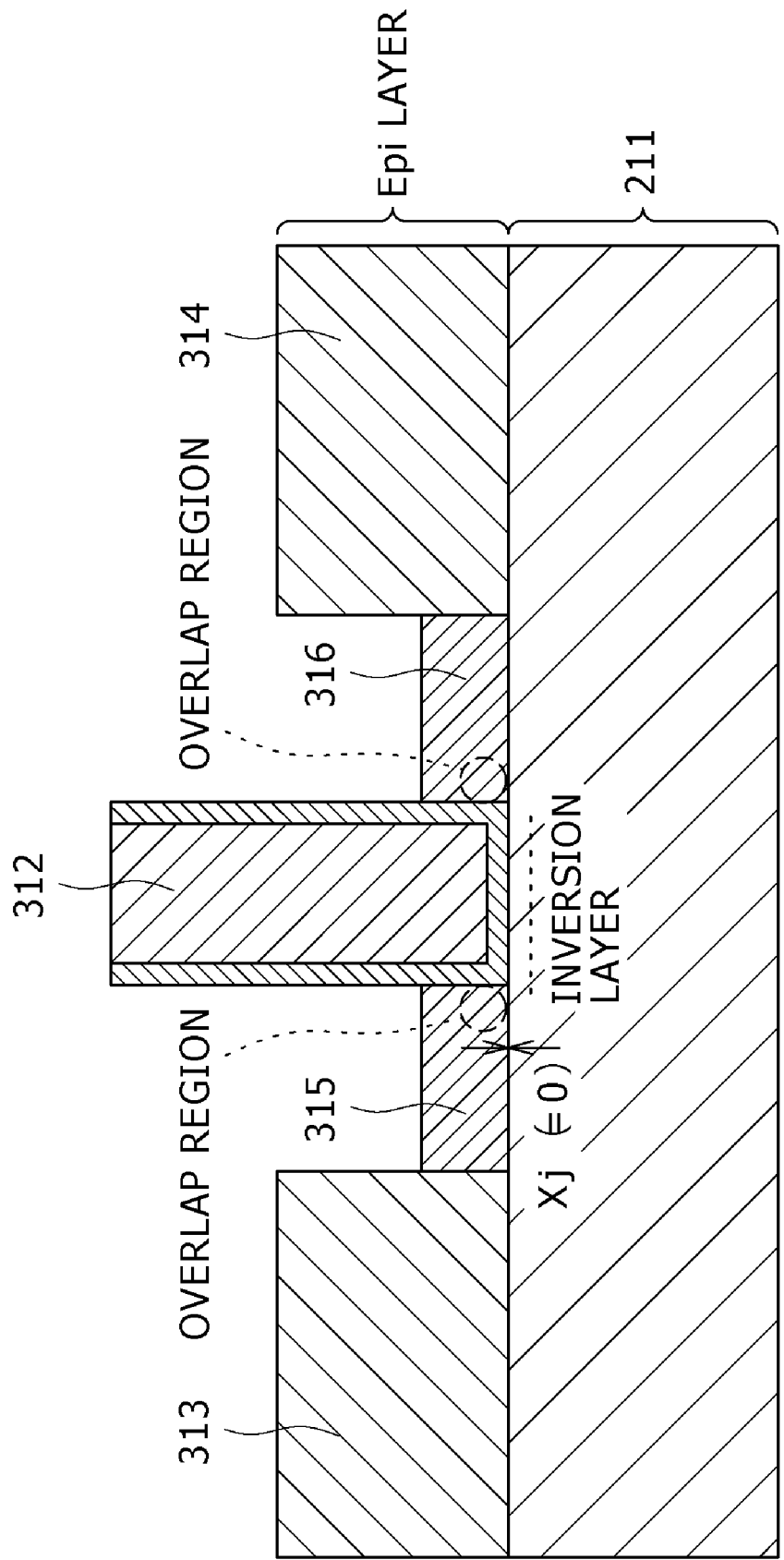
FIG. 27 is a schematic constitution sectional view of a sectional structure of an existing elevated source/drain extension type MOSFET.

FIG. 24 shows a carrier density distribution of the present invention structure at a time of a zero bias, and FIG. 25 shows a carrier density distribution of the existing structure at a time of a zero bias.

Figure 12:
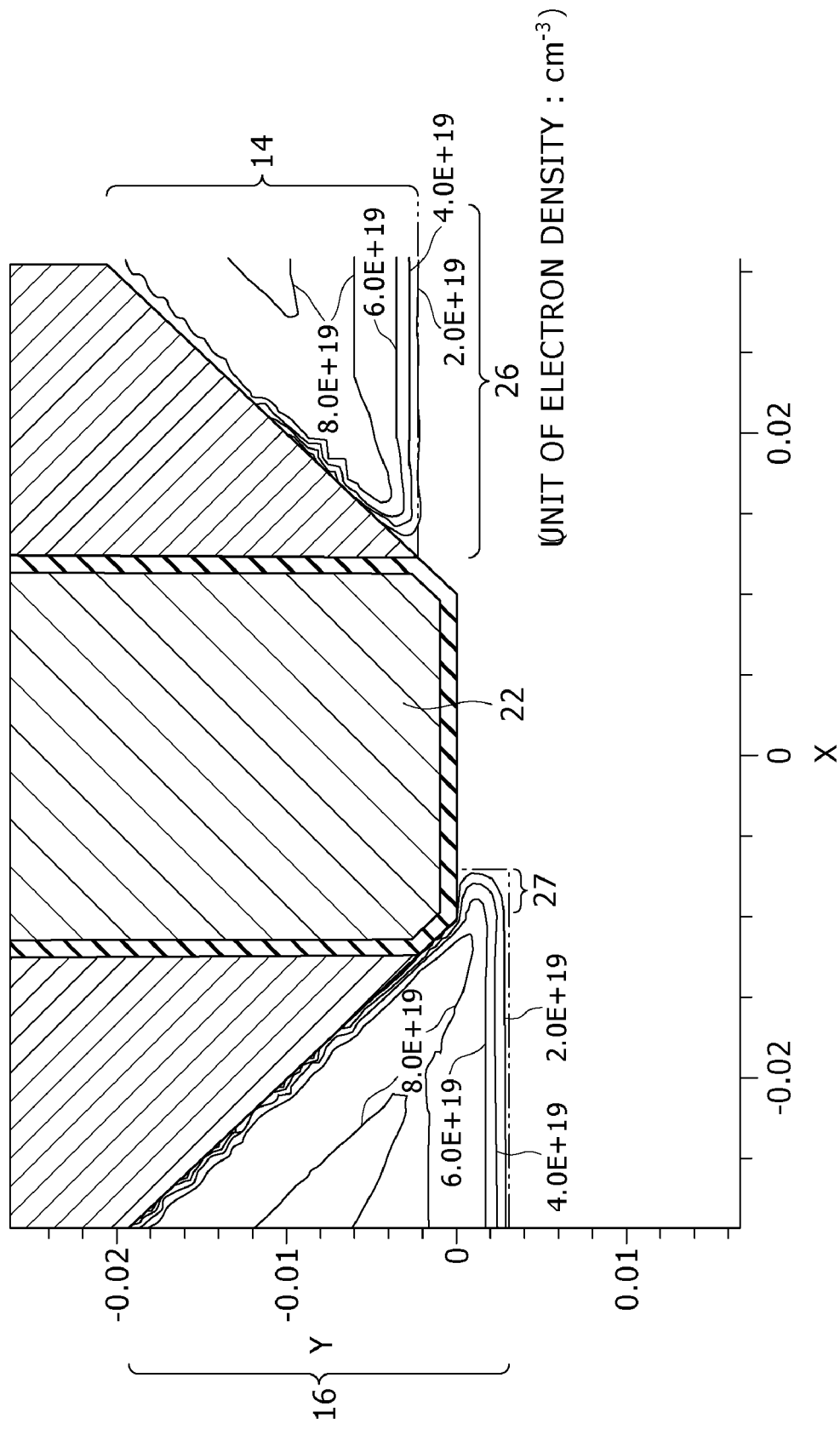
FIG. 12 is a diagram of a carrier density distribution of a present invention structure at a time of a zero bias.
Figure 13:
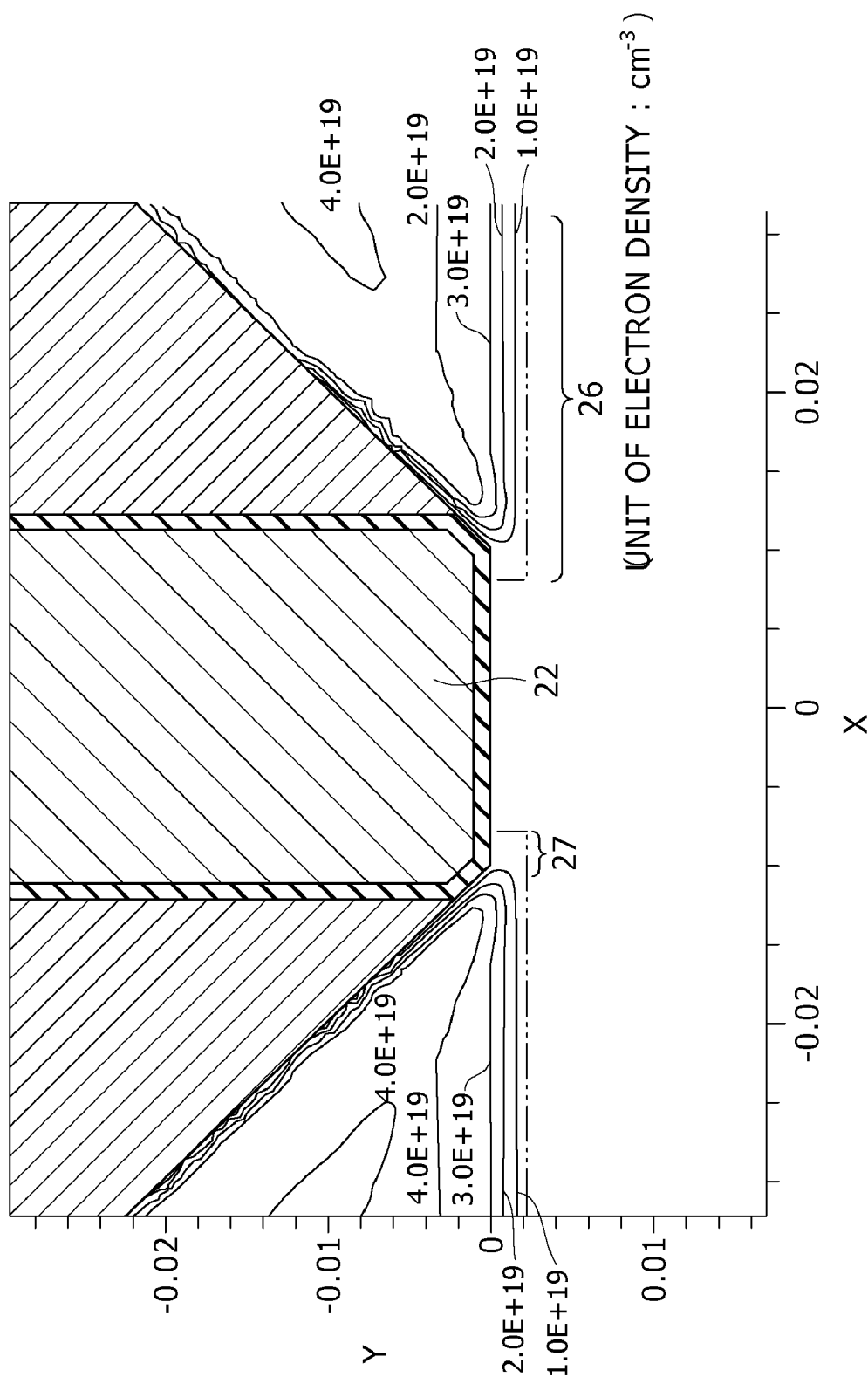
FIG. 13 is a diagram of a carrier density distribution of an existing structure at a time of a zero bias.

As shown in FIG. 12 and FIG. 13, in each of the structures, at a source end of a gate flat part, a neutral region of the extension region 25 extends so as to reach a part under the gate electrode 22 and an appropriate overlap region 27 is formed. On the other hand, at a drain end in the existing structure, a neutral region of the extension region 26 identical to the extension region at the source end is formed directly under the gate electrode 22, whereas in the present invention structure, a neutral region ends at a position higher than a drain end, and the drain end is situated in a depletion layer.

Figure 14:
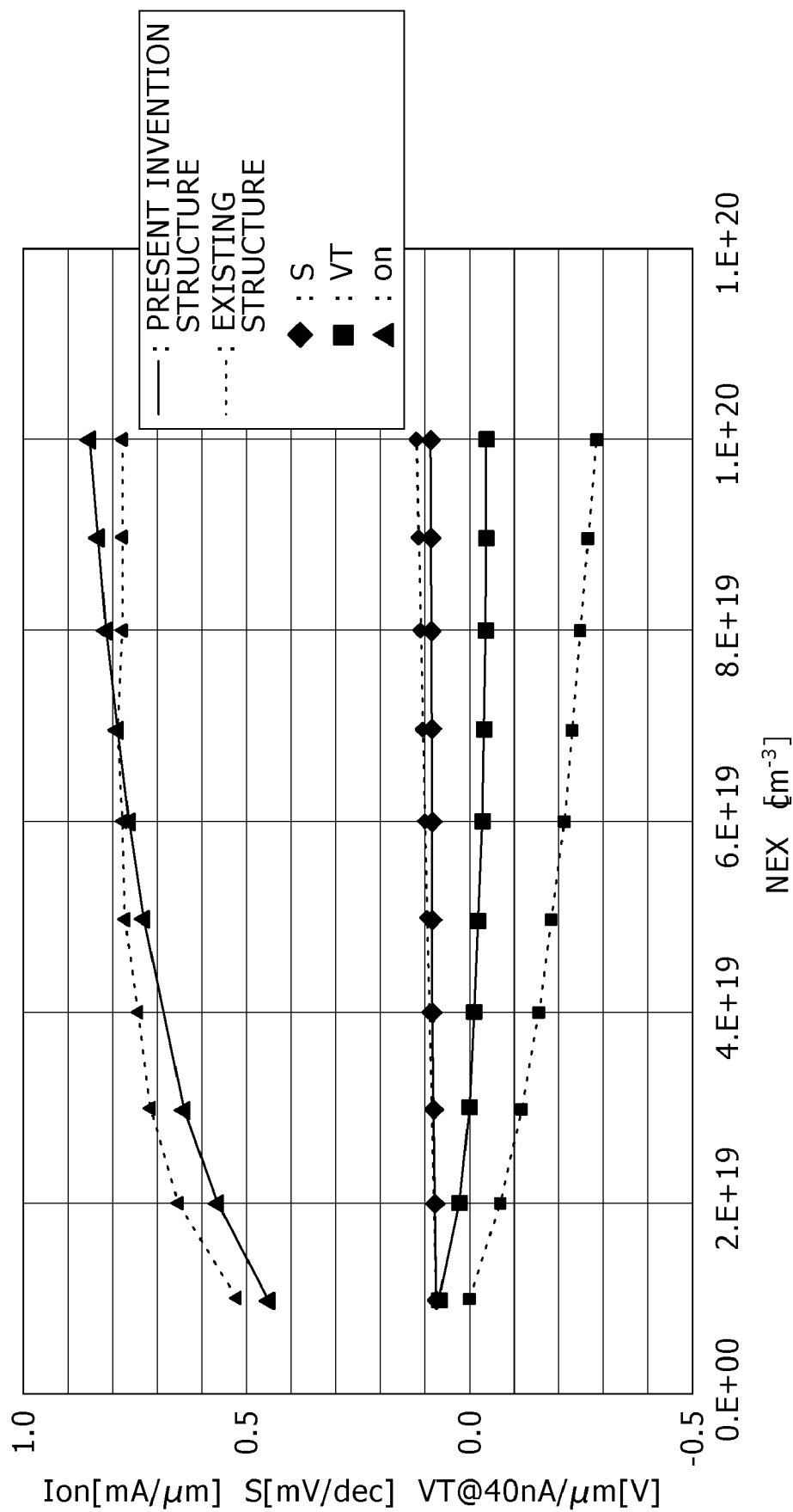
FIG. 14 is a diagram of changes in threshold voltage and on current, showing the dependence of the I-V characteristics of the present invention structure and the existing structure on extension density.
Figure 15:
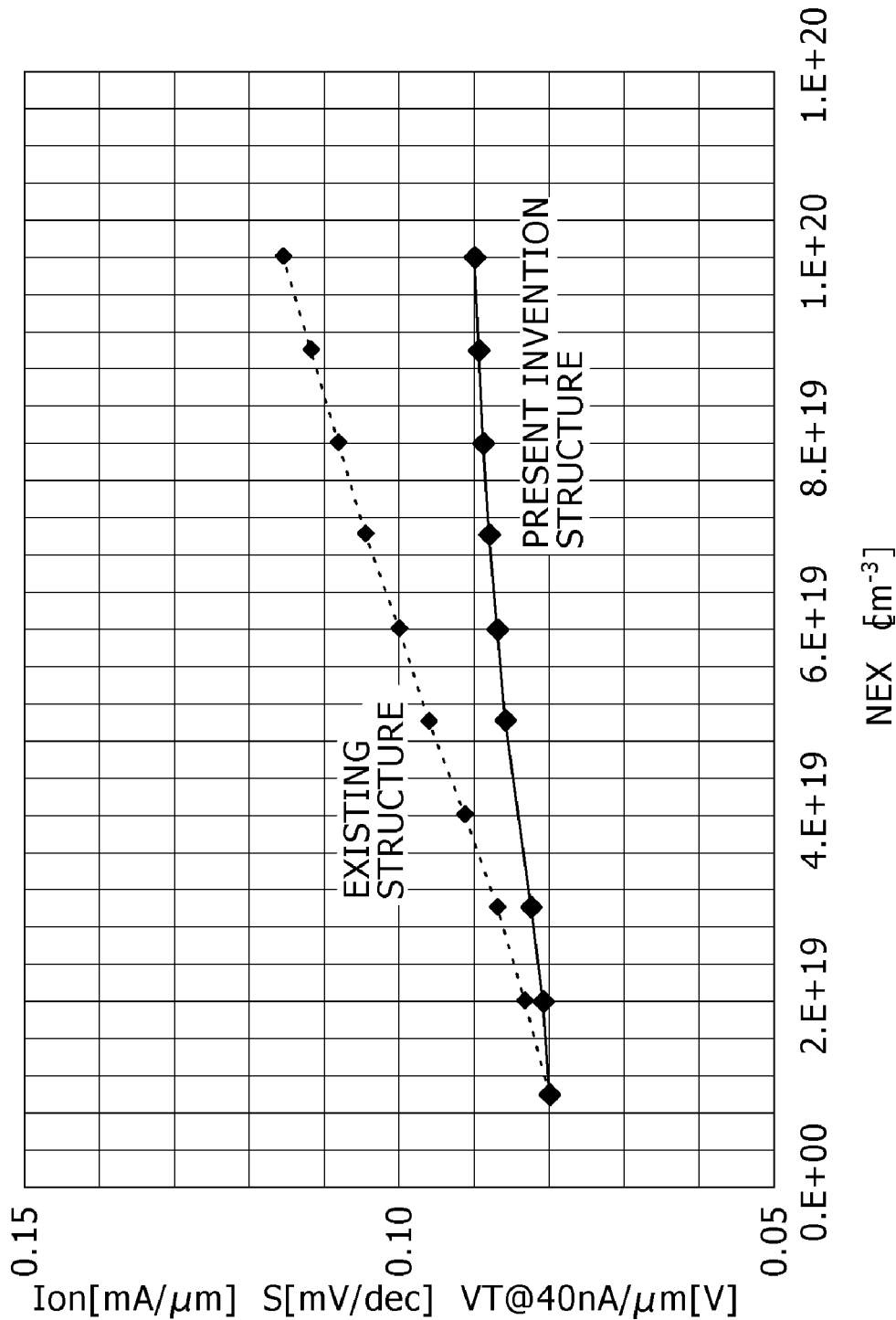
FIG. 15 is an enlarged diagram of changes in subthreshold slope, showing the dependence of the I-V characteristics of the present invention structure and the existing structure on extension density.

FIG. 14 and FIG. 15 show the dependence of the I-V characteristic of the present invention structure on extension density and the dependence of the I-V characteristic of the existing structure on extension density. FIG. 14 shows changes in threshold voltage and on current. FIG. 15 is an enlarged diagram of changes in subthreshold slope. In FIGS. 14 to 21, VT on an axis of ordinates denotes the threshold voltage, S denotes the subthreshold, and Ion denotes the on current. In FIG. 14 and FIG. 15, NEX on an axis of abscissas denotes the impurity density of the extension region. In FIGS. 14 to 21, a solid line represents the present invention structure, and a dotted line represents the existing structure.

As shown in FIG. 14, in both the structures, an increase in on current, a decrease in threshold voltage, and a degradation in subthreshold slope occur with an increase in extension impurity density. It is shown, however, that the present invention structure has a higher current driving power than the existing structure in a density range of $6 \times 10^{19}$ cm$^{-3}$ and higher. It is also shown that because of a small decrease in threshold voltage and a small degradation in slope, a process margin in this range is large, and a low leak is achieved.

Figure 16:
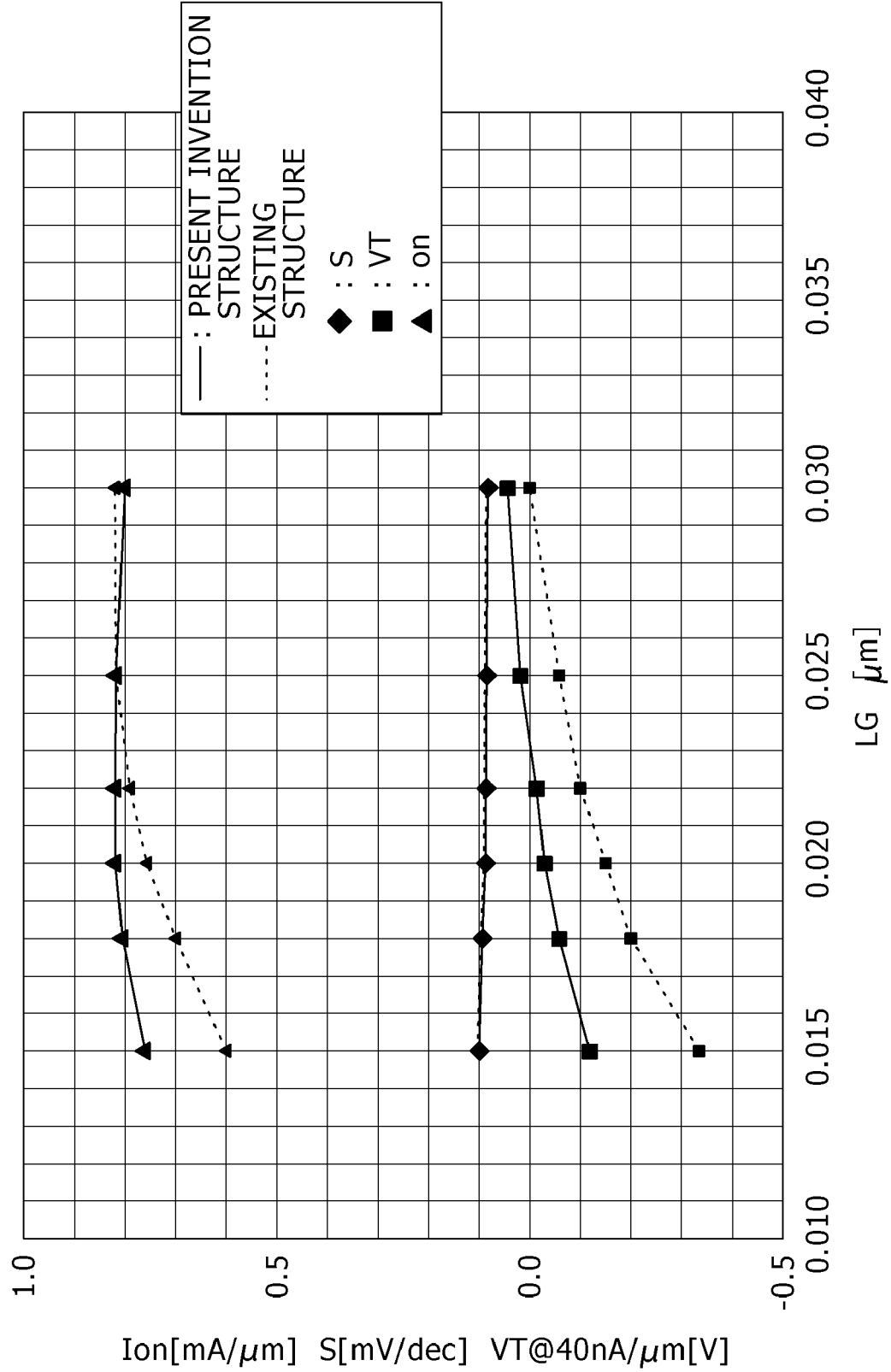
FIG. 16 is a diagram of changes in threshold voltage and on current, showing the dependence of the I-V characteristics of the present invention structure and the existing structure on gate length.
Figure 17:
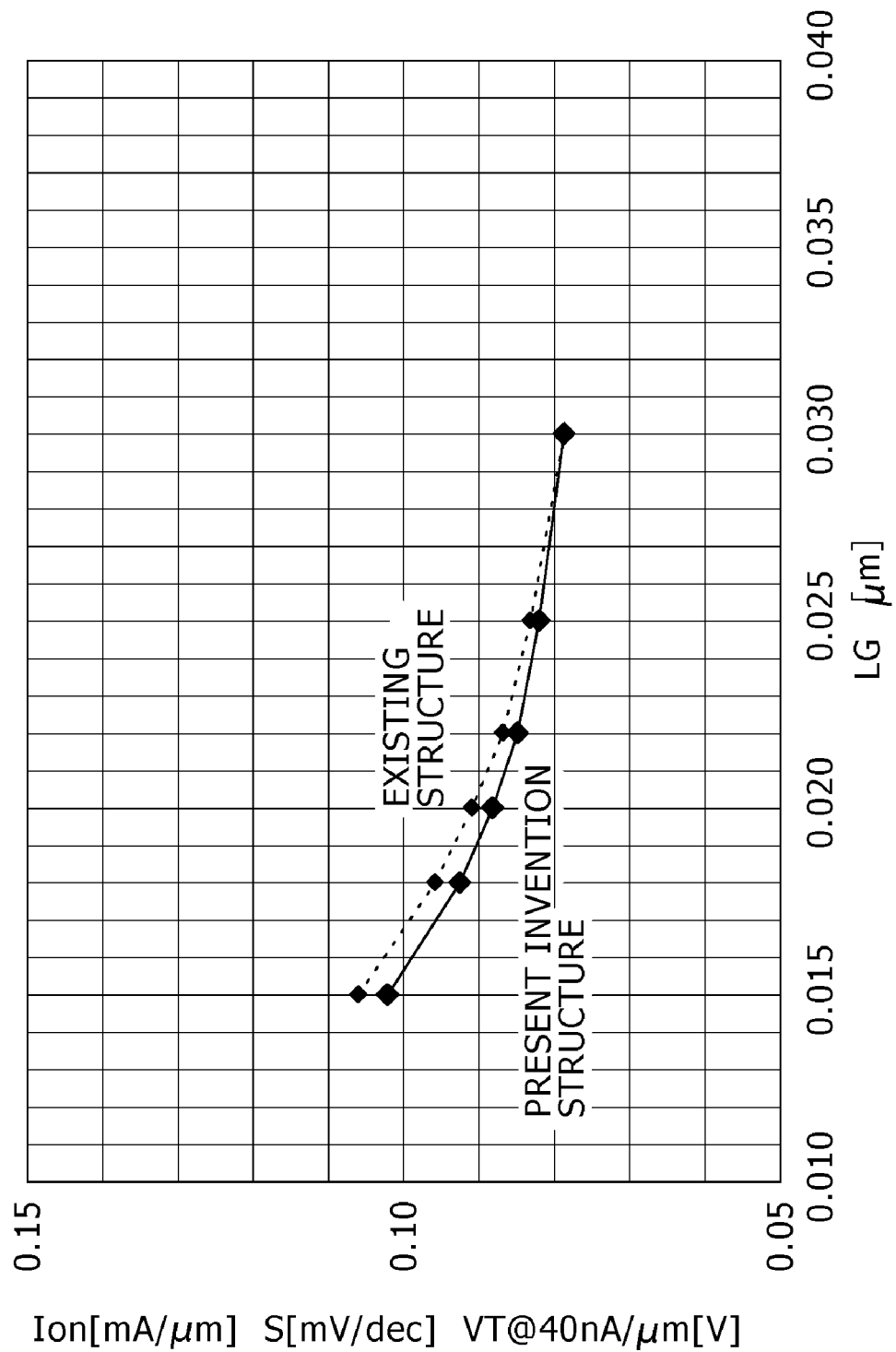
FIG. 17 is an enlarged diagram of changes in subthreshold slope, showing the dependence of the I-V characteristics of the present invention structure and the existing structure on gate length.

FIG. 16 and FIG. 17 show the dependence of the I-V characteristic of the present invention structure on gate length and the dependence of the I-V characteristic of the existing structure on gate length. FIG. 16 shows changes in threshold voltage and on current. FIG. 17 is an enlarged diagram of changes in subthreshold slope. In FIG. 16 and FIG. 17, an axis of abscissas denotes gate length.

As shown in FIG. 16 and FIG. 17, there is not a great difference in subthreshold slope between the present invention structure and the existing structure. However, it is shown that the present invention structure has a smaller change in threshold voltage with respect to gate length, a larger process variation margin with respect to gate length, and a smaller degradation in current driving power than the existing structure.

Figure 18:
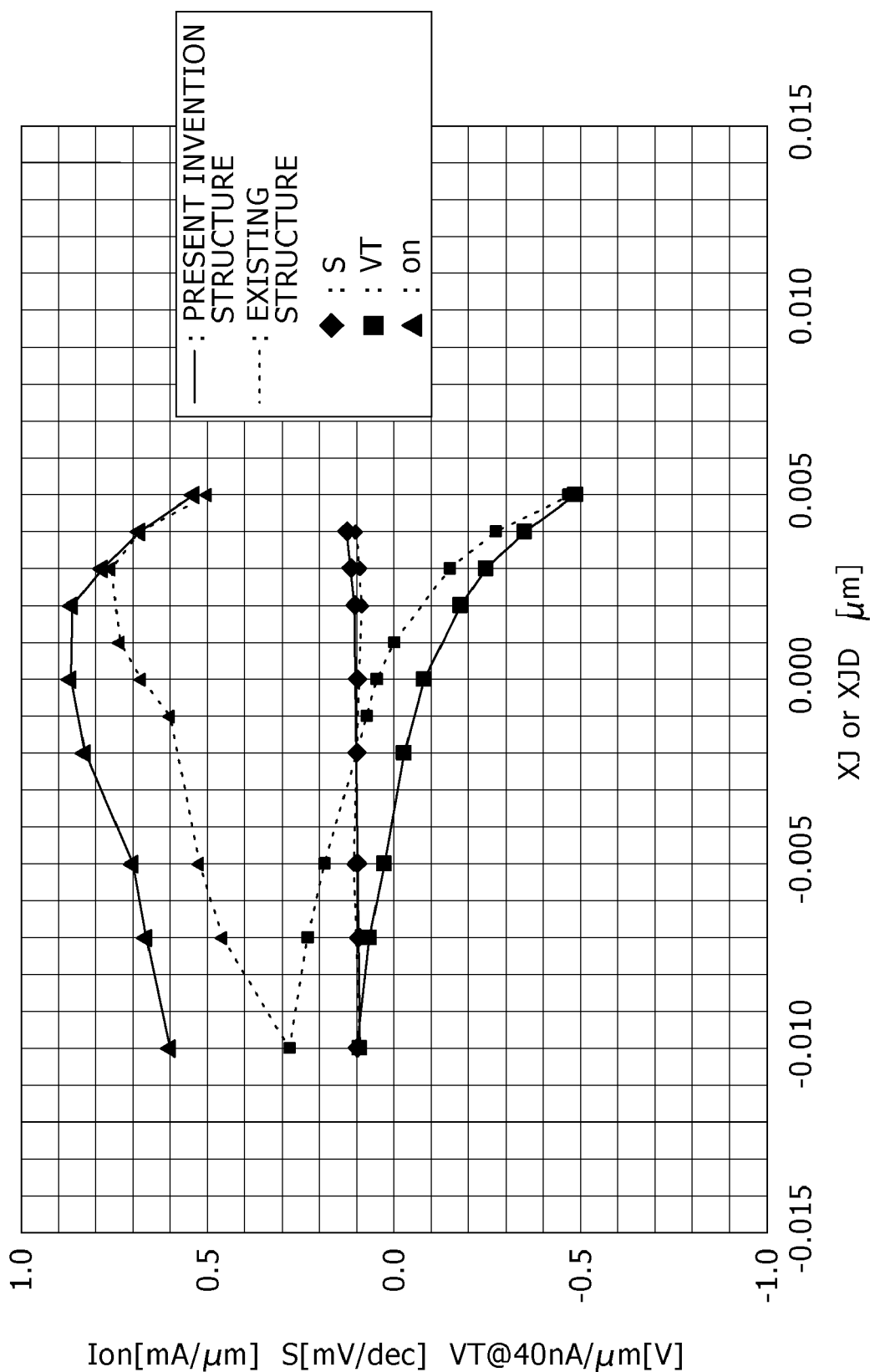
FIG. 18 is a diagram of changes in threshold voltage and on current, showing the dependence of the I-V characteristics of the present invention structure and the existing structure on the junction depth of a drain side extension.
Figure 19:
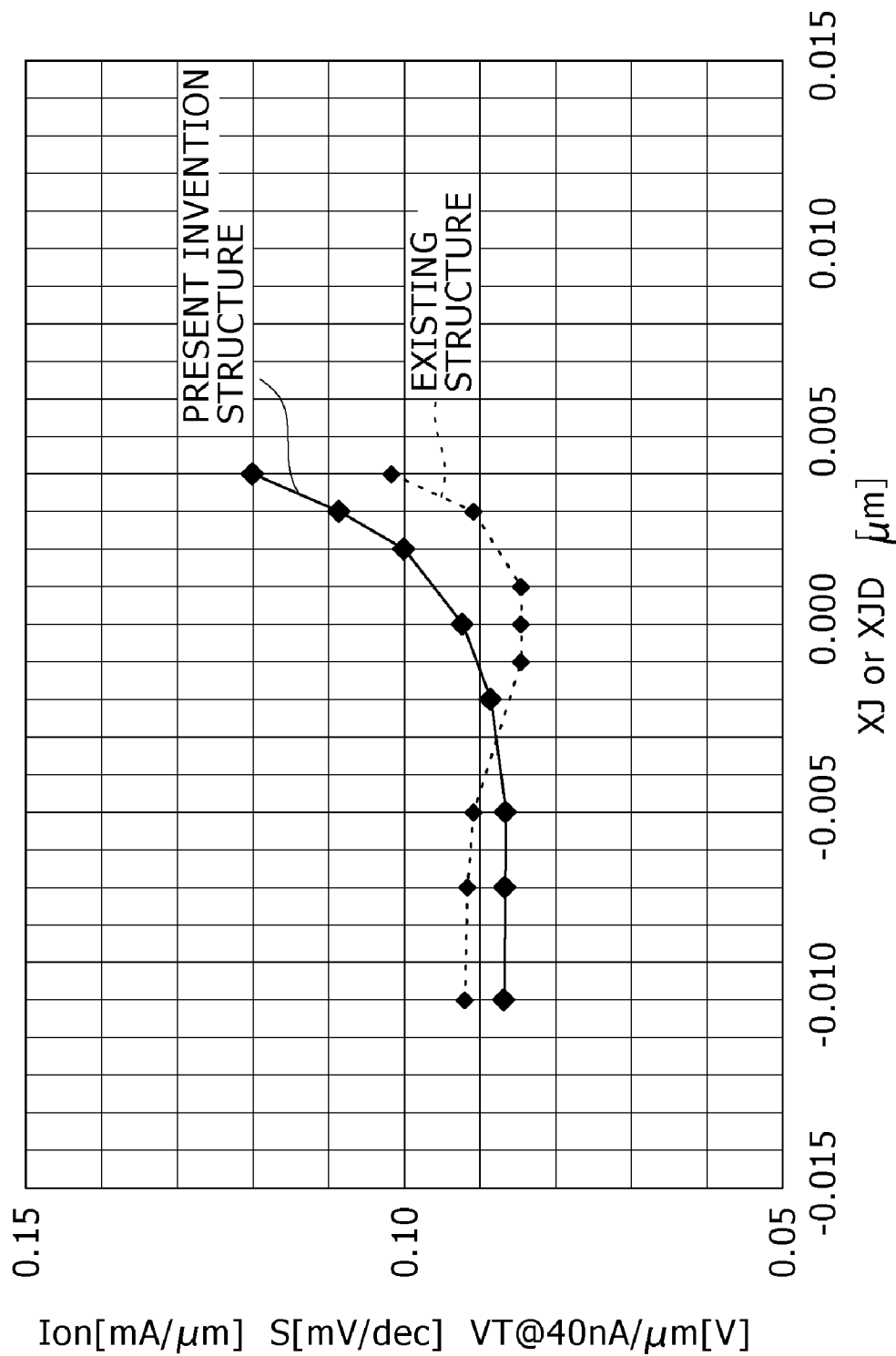
FIG. 19 is an enlarged diagram of changes in subthreshold slope, showing the dependence of the I-V characteristics of the present invention structure and the existing structure on the junction depth of the drain side extension.

FIG. 18 and FIG. 19 show the dependence of the I-V characteristic of the present invention structure on the junction depth of the drain side extension and the dependence of the I-V characteristic of the existing structure on the junction depth of the drain side extension. FIG. 18 shows changes in threshold voltage and on current. FIG. 19 is an enlarged diagram of changes in subthreshold slope. In FIG. 18 and FIG. 19 an axis of abscissas denotes the junction depth of the drain side extension.

As shown in FIG. 18 and FIG. 19, in a wider range as compared with the existing structure in which range the junction depth Xj of the drain side extension <0 nm, the present invention structure has a higher current driving power than the existing structure, has threshold voltage less sensitive to the junction depth, and has an excellent subthreshold slope equal to that of the existing structure.

Figure 20:
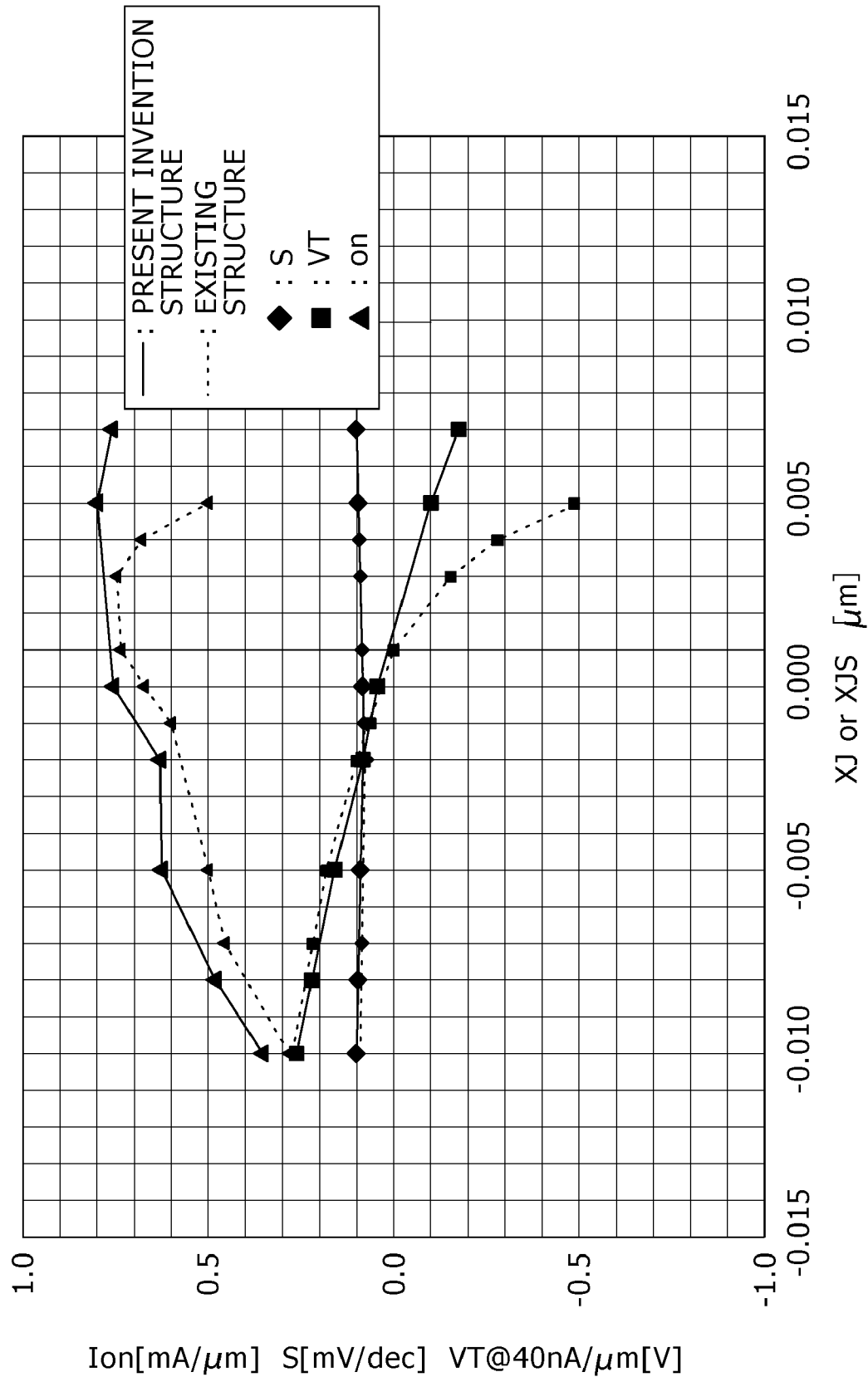
FIG. 20 is a diagram of changes in threshold voltage and on current, showing the dependence of the I-V characteristics of the present invention structure and the existing structure on the junction depth of a source side extension.
Figure 21:
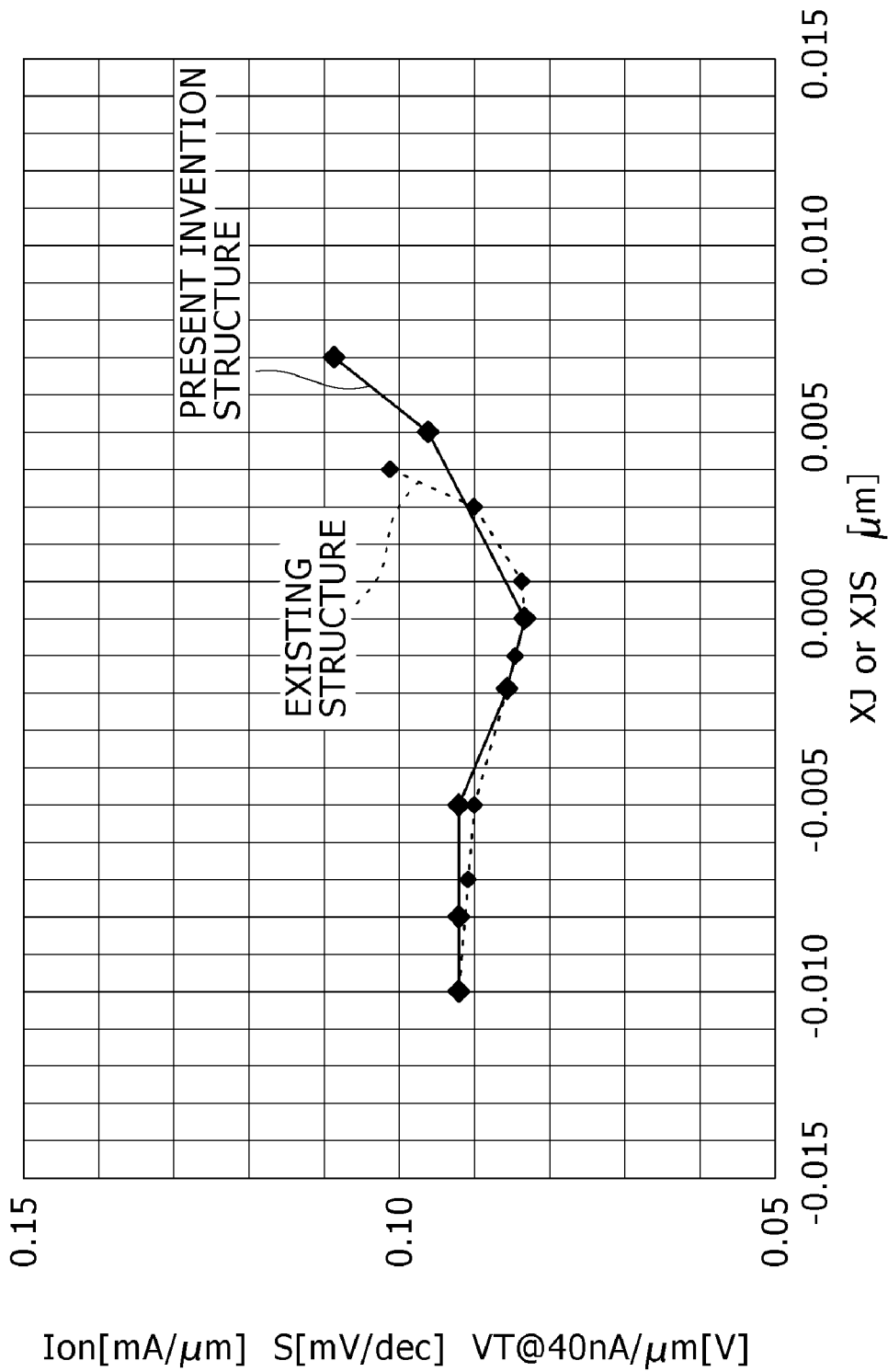
FIG. 21 is an enlarged diagram of changes in subthreshold slope, showing the dependence of the I-V characteristics of the present invention structure and the existing structure on the junction depth of the source side extension.

FIG. 20 and FIG. 21 show the dependence of the I-V characteristic of the present invention structure on the junction depth of the source side extension and the dependence of the I-V characteristic of the existing structure on the junction depth of the source side extension. FIG. 20 shows changes in threshold voltage and on current. FIG. 21 is an enlarged diagram of changes in subthreshold slope. In FIG. 20 and FIG. 21, an axis of abscissas denotes the junction depth of the source side extension.

As shown in FIG. 20 and FIG. 21, in a wide range, the present invention structure has a higher current driving power, a gentler subthreshold slope, and a smaller degradation in threshold voltage than the existing structure.

Figure 22:
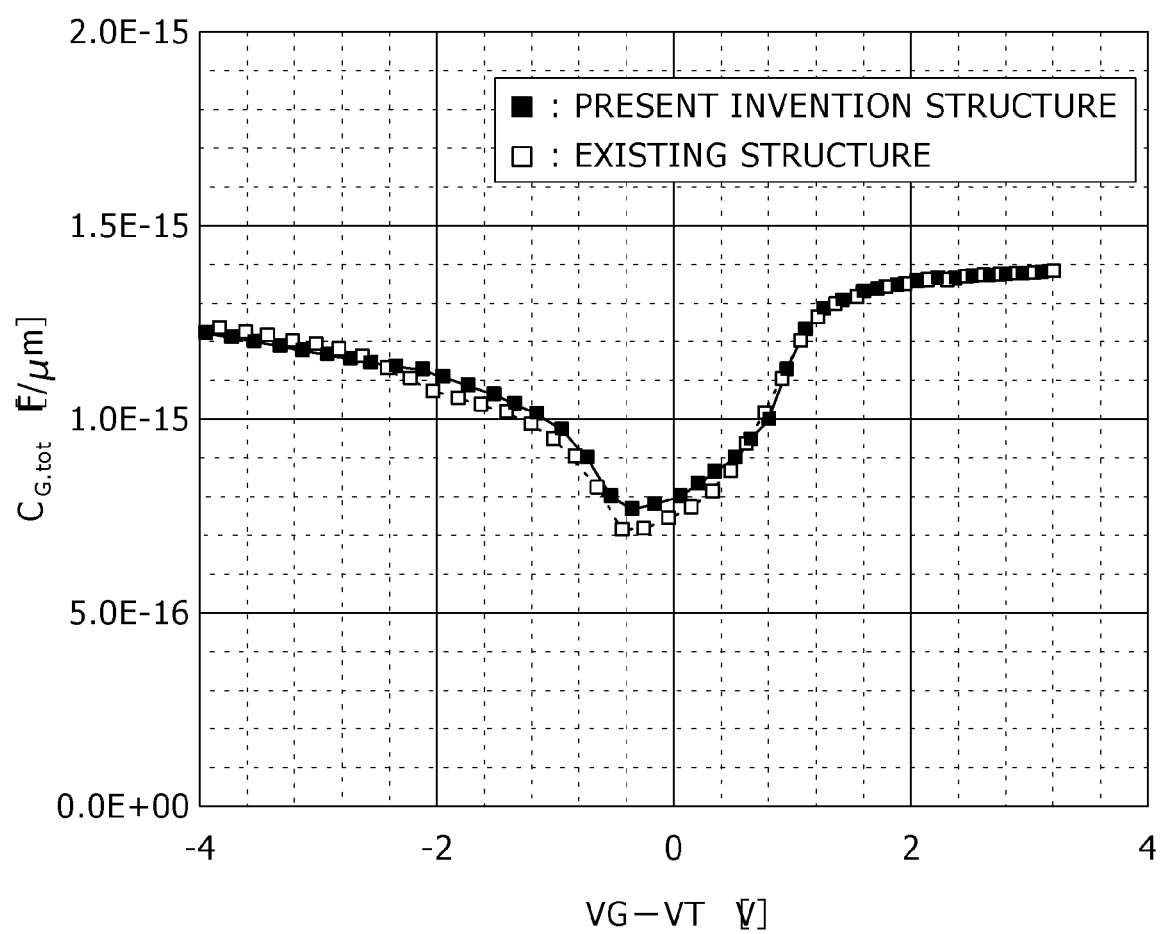
FIG. 22 is a diagram of C-V characteristics of the present invention structure and the existing structure.

FIG. 22 shows the C-V characteristic of the present invention structure and the C-V characteristic of the existing structure. FIG. 22 shows the dependence of gate capacitance on gate voltage when gate width is 1 μm. In FIG. 22, an axis of ordinates indicates gate capacitance, and an axis of abscissas indicates gate voltage.

As shown in FIG. 22, the gate capacitance of the present invention structure and the gate capacitance of the existing structure are substantially equal to each other. Thus, in consideration of the above results, it is shown that the present invention structure has higher operating speed as measured by CV/I in a wider process variation range than the existing structure.

The above results of comparison are summarized in Table 2.

TABLE 2

| EVALUATION ITEM | | | PRESENT INVENTION | EXISTING TECHNIQUE | RATE OF IMPROVEMENT |
|---|---|---|---|---|---|
| CURRENT DRIVING POWER | CENTRAL VALUE | Ion(max) | 751 µA/µm | 815 µA/µm | 8.5% |
| GATE CAPACITANCE | CENTRAL VALUE | CG, tot@0 V (fF/µm) | 0.757 | 0.801 | 5.8% |
| | | CG, tot@0.8 V (fF/µm) | 1.09 | 1.03 | −5.5% |
| PROCESS MARGIN | THRESHOLD VOLTAGE | Lpoly VARIATION MARGIN | 20 ± 3 nm | 20 ± 6 nm | ×2 |
| | | Xj VARIATION MARGIN | 1 nm | (DRAIN) 3 nm (SOURCE) 3 nm | ×3 ×3 |

As shown in Table 2, the present invention structure excels the existing structure in current driving power and process margin, and the present invention structure and the existing structure are substantially equal to each other in gate capacitance. It is thus shown that the present invention structure is suitable for high-speed operation and can be manufactured with a high yield by less expensive manufacturing equipment.

In addition, the present invention structure has a high affinity for mobility improving techniques using stress and surface orientation selection, provides a wide manufacturing margin for gate length and the junction depth of the source and the drain, and can be manufactured inexpensively with a high yield.

An embodiment (sixth embodiment) of the present invention will next be described with reference to circuit diagrams of FIG. 23 and FIG. 24.

The circuit diagram of FIG. 23 shows a static random-access memory (SRAM) cell using the MOSFETs of the semiconductor devices 1 to 5 according to the respective embodiments of the present invention. The source side (a side having an overlap region) of each MOSFET is represented by a symbol S, and the drain side (a side of a shallow extension junction) of each MOSFET is represented by a symbol D.

By arranging sources and drains as shown in FIG. 23, a trade-off between operation performance, static power consumption, and cell size can be improved. This will be described in the following.

Generally, in a six-transistor SRAM cell (6T-SRAM), data is read by the following procedure. In this case, suppose that Q=1. Bit lines in FIG. 23 are denoted as BIT and BIT$^-$, and contacts are denoted as Q and Q$^-$. Incidentally, BIT$^-$ and Q$^-$ are equivalent to symbols shown in the following equations (1) and (2).

$$\overline{BIT}=B^- \qquad \text{[Equation 1]}$$

$$\overline{Q}=Q^- \qquad \text{[Equation 2]}$$

(1) The bit lines BIT and BIT$^-$ are both precharged to a high level. (2) A word line W is set to a high level, so that a transistor M5 and a transistor M6 are turned on. (3) The potential of the contact Q$^-$ propagates to the bit line BIT$^-$ through the transistor M5, and the potential of the contact Q propagates to the bit line BIT through the transistor M6. The potential of the bit line BIT is not changed because the contact Q is at a high level. On the other hand, the potential of the bit line BIT$^-$ is lowered because the contact Q$^-$ is at a low level and thus a charge on the bit line BIT$^-$ is discharged through the transistor M5 and a transistor M1. (4) A resulting potential difference between the bit line BIT and the bit line BIT$^-$ is detected by a sense amplifier, and thus the state of the cell is read out.

When the driving power of the transistor M5 is stronger than that of the transistor M1, the bit line BIT$^-$ raises the potential of the contact Q$^-$ to a potential that causes a change in state of a transistor M3 and a transistor M4, and thus "1" is written. In order to prevent this, the W/L ratio of the transistor M1 is set high so that the driving power of the transistor M1 becomes greater than that of the transistor M5. Specifically, when CR=(W1/L1)/(W5/L5), CR needs to be 1.2 or more, for example. When the transistor M5 is designed in a minimum size, the transistor M1 is set to a greater gate length than that of the transistor M5.

However, in a case of using transistors according to embodiments of the present invention in an arrangement as shown in FIG. 23, the threshold voltage of the transistor M5 when the bit line is on a high potential side is higher than the threshold voltage of the transistor M1 because of the above-described corner effect. Because of this threshold voltage difference, the driving power of the transistor M5 when the discharge occurs from the bit line BIT$^-$ through the transistor M5 and the transistor M1 is lower than that of the transistor M1. Therefore the W/L ratio of the transistor Ml does not need to be set higher than that of the transistor M5. Hence, the transistor Ml (and the transistor M3) can be formed by a smaller transistor than the existing one.

Data writing is performed as follows. Description in the following will be made of a case of writing "0" to Q.

(1) The bit line BIT is set at a low level, and the bit line BIT$^-$ is set at a high level. (2) The word line W is set at a high level, so that the transistor M5 and the transistor M6 are turned on. (3) The potential of the contact Q$^-$ is raised by charging from the bit line BIT. However, the potential of the contact Q$^-$ does not cause a change in state of the transistor M3 and the transistor M4 because the driving power of the transistor M5 is made lower than that of the transistor M1 to prevent erroneous writing at a time of reading, as described above. (4) Thus, the state change has to be caused by a change in state of the transistor M1 and a transistor M2 as a result of a decrease in the potential of the contact Q due to a discharge from the contact Q through the transistor M4 and the transistor M6 to the bit line BIT. Thus, the driving power of the transistor M4 needs to be at a certain level or lower with respect to the transistor M6. When a 6T-SRAM is formed with only existing symmetric transistors, the transistor M4 needs to be designed in a certain size or smaller with respect to the transistor M6 because of the above-described (4).

Supposing that PR=(W4/L4)/(W6/L6), PR needs to be 1.8 or less, for example. Reconsidering this with the transistor M6 as a reference, the driving power of the transistor M6 needs to be higher than a certain level with respect to the driving power of the transistor M4.

Considering the configuration shown in FIG. 23, the transistor M6 has a low potential on a source side in a discharge from the contact Q to the bit line BIT. Thus, for a current in this direction, the transistor M6 has a low threshold voltage and a high driving power, thus enabling high-speed writing.

Thus, when a 6T-SRAM as shown in FIG. 23 is formed using transistors according to embodiments of the present invention, the asymmetry of the driving power and threshold voltage of the transfer gates M5 and M6 acts to prevent erroneous writing at a time of reading, and acts to shorten the time constant of discharge from the contact Q to the bit line BIT at a time of writing. As a result, the transistors M1, M3, M2, and M4 can be designed in a smaller size than the existing transistors with respect to the transistors M5 and M6.

Further, by selecting the transistor orientation of transistors M2 and M4 as shown in FIG. 24, the threshold voltage of the transistors M2 and M4 in a retaining state is raised, and a leakage current is reduced. Therefore static power consumption can be reduced.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
 a semiconductor region having a first semiconductor face and a second semiconductor face connected to said first semiconductor face and having an inclination with respect to said first semiconductor face;
 a gate insulating film formed on said first semiconductor face and on said second semiconductor face;
 a gate electrode formed on said gate insulating film including a part on a boundary between said first semiconductor face and said second semiconductor face;
 a source impurity region formed in said semiconductor region so as to overlap said gate electrode within said first semiconductor face with said gate insulating film interposed between said source impurity region and said gate electrode; and
 a drain impurity region formed in said semiconductor region directly under said second semiconductor face at least;
 wherein a junction interface between said drain impurity region and said semiconductor region is formed in a state of being closer to the boundary between said first semiconductor face and said second semiconductor face than a junction interface between said source impurity region and said semiconductor region.

2. The semiconductor device according to claim 1, wherein said drain impurity region has a semiconductor layer springing upward from said first semiconductor face.

3. The semiconductor device according to claim 2, wherein said semiconductor layer is an epitaxial growth layer formed on said first semiconductor face.

4. The semiconductor device according to claim 1, wherein said drain impurity region overlaps said gate electrode within said second semiconductor face with said gate insulating film interposed between said drain impurity region and said gate electrode.

5. A method of manufacturing a semiconductor device, said method comprising the steps of:
 forming a dummy gate on a semiconductor substrate with a dummy gate insulating film interposed between said dummy gate and said semiconductor substrate;
 forming a source impurity region and a drain impurity region in said semiconductor substrate on both sides of said dummy gate;
 forming an extension region on said semiconductor substrate on both sides of said dummy gate;
 forming an overlap region of the source impurity region on a source side directly below said dummy gate;
 removing said dummy gate and removing said dummy gate insulating film exposed in a removal region from which said dummy gate is removed;
 forming a recess shape in said semiconductor substrate exposed in said removal region; and
 sequentially forming a gate insulating film and a gate electrode on said semiconductor substrate in which said recess shape is formed.

6. A method of manufacturing a semiconductor device according to claim 5,
 wherein the step of forming said overlap region is performed after said extension region is formed.

7. A method of manufacturing a semiconductor device according to claim 5,
 wherein the step of forming said overlap region is performed immediately after said dummy gate is formed.

8. A method of manufacturing a semiconductor device according to claim 5,
 wherein the step of forming said overlap region is performed after a spacer insulating film is formed on a side wall of said dummy gate.

9. A method of manufacturing a semiconductor device according to claim 5,
 wherein said extension region is formed by an epitaxial growth layer having a different lattice constant from a lattice constant of said semiconductor substrate, and
 one of a compressive stress and a tensile stress is caused in said semiconductor substrate directly below said gate electrode by said epitaxial growth layer.

10. A semiconductor device formed by a static random-access memory using an insulated gate field effect transistor as a selection transistor of a cell,
 said insulated gate field effect transistor including
 a semiconductor region having a first semiconductor face and a second semiconductor face connected to said first semiconductor face and having an inclination with respect to said first semiconductor face,
 a gate insulating film formed on said first semiconductor face and on said second semiconductor face,
 a gate electrode formed on said gate insulating film including a part on a boundary between said first semiconductor face and said second semiconductor face,
 a source impurity region formed in said semiconductor region so as to overlap said gate electrode within said first semiconductor face with said gate insulating film interposed between said source impurity region and said gate electrode, and
 a drain impurity region formed in said semiconductor region directly under said second semiconductor face at least,
 wherein a junction interface between said drain impurity region and said semiconductor region is formed in a state of being closer to the boundary between said first semiconductor face and said second semiconductor face than a junction interface between said source impurity region and said semiconductor region,
 a side of said source impurity region is connected to a bit line, and a side of said drain impurity region is connected to a gate electrode of a cell transistor.

11. The semiconductor device according to claim 10, wherein a side of a drain impurity region of a pull-up transistor of said static random-access memory is connected to a power supply line.

12. The semiconductor device according to claim 10, wherein a side of a source impurity region of a pull-up transistor of said static random-access memory is connected to a power supply line.

* * * * *